(12) United States Patent
Grandidge et al.

(10) Patent No.: US 9,879,800 B2
(45) Date of Patent: Jan. 30, 2018

(54) BRACKET ASSEMBLY FOR MEDIA PATCHING SYSTEM

(71) Applicant: Ortronics, Inc., New London, CT (US)

(72) Inventors: Ryan J. Grandidge, Westerly, RI (US); Rudolph A. Montgelas, West Hartford, CT (US); Chester H. Rynaski, Franklin, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 15/429,384

(22) Filed: Feb. 10, 2017

(65) Prior Publication Data

US 2017/0152969 A1    Jun. 1, 2017

Related U.S. Application Data

(62) Division of application No. 14/683,433, filed on Apr. 10, 2015, now Pat. No. 9,606,317.

(60) Provisional application No. 62/013,079, filed on Jun. 17, 2014.

(51) Int. Cl.
| | |
|---|---|
| *F16L 3/22* | (2006.01) |
| *F16L 3/01* | (2006.01) |
| *F16L 3/223* | (2006.01) |
| *G02B 6/44* | (2006.01) |
| *H05K 7/14* | (2006.01) |

(52) U.S. Cl.
CPC .............. *F16L 3/01* (2013.01); *F16L 3/2235* (2013.01); *G02B 6/4454* (2013.01); *G02B 6/4471* (2013.01); *H05K 7/1491* (2013.01)

(58) Field of Classification Search
CPC .. G02B 6/4452; G02B 6/4455; G02B 6/4457; G02B 6/4471; G02B 6/3897; H04Q 1/06; H04Q 1/064; H04Q 1/062; H04Q 1/066; H04Q 1/068; H04Q 1/08; H04Q 1/09; H04Q 1/04; H05K 7/14; H05K 7/18; H05K 7/183; H05K 7/186; H05K 7/1491; F16L 3/01
USPC ................. 248/68.1, 220.21, 220.22, 220.43
See application file for complete search history.

(56) References Cited

U.S. PATENT DOCUMENTS

| | | | |
|---|---|---|---|
| 6,818,834 B1 * | 11/2004 | Lin ...................... | G02B 6/3897 174/135 |
| 6,968,647 B2 | 11/2005 | Levesque et al. | |
| 7,225,586 B2 | 6/2007 | Levesque et al. | |
| 7,697,811 B2 | 4/2010 | Murano et al. | |
| 7,983,038 B2 | 7/2011 | Levesque et al. | |

(Continued)

OTHER PUBLICATIONS

U.S. Appl. No. 14/304,079, filed Jun. 13, 2014.

(Continued)

*Primary Examiner* — Christopher E Garft
(74) *Attorney, Agent, or Firm* — McCarter & English, LLP

(57) ABSTRACT

The present disclosure provides advantageous systems/methods for the design and use of patching systems having one or more bracket members (e.g., Z-shaped bracket members) configured to facilitate cable management. In exemplary embodiments, the bracket members allow a panel assembly to move relative to the bracket members for cable management purposes. The improved systems/assemblies of the present disclosure provide users with the ability to install multiple media connections (e.g., copper-based and/or fiber optic connections) in the same patching system/enclosure.

20 Claims, 55 Drawing Sheets

(56) References Cited

U.S. PATENT DOCUMENTS

| | | | |
|---|---|---|---|
| 8,106,311 B2 | 1/2012 | Larsen et al. | |
| 8,130,494 B2 | 3/2012 | Larsen et al. | |
| 8,184,938 B2 | 5/2012 | Cooke et al. | |
| 8,398,039 B2 | 3/2013 | Murano et al. | |
| 8,439,702 B2 | 5/2013 | Dietz et al. | |
| 8,526,181 B2 | 9/2013 | Levesque et al. | |
| 8,672,709 B2 | 3/2014 | Dietz et al. | |
| 8,731,364 B2 | 5/2014 | Murano et al. | |
| 8,758,047 B2 | 6/2014 | Dietz et al. | |
| 2008/0237408 A1* | 10/2008 | McClellan | H04Q 1/06 248/68.1 |
| 2009/0038845 A1* | 2/2009 | Fransen | H01R 9/2416 174/72 R |
| 2009/0129014 A1 | 5/2009 | Larsen et al. | |
| 2009/0245746 A1* | 10/2009 | Krampotich | G02B 6/4455 385/135 |
| 2009/0266607 A1* | 10/2009 | Hoffer | H02G 3/0456 174/72 A |
| 2010/0054682 A1* | 3/2010 | Cooke | G02B 6/4455 385/135 |
| 2010/0158467 A1* | 6/2010 | Hou | H04Q 1/08 385/135 |
| 2012/0064760 A1 | 3/2012 | Dietz et al. | |
| 2014/0049144 A1* | 2/2014 | Han | H05K 5/0247 312/223.6 |
| 2014/0206273 A1 | 7/2014 | Larsen et al. | |

OTHER PUBLICATIONS

U.S. Appl. No. 14/683,433, filed Apr. 10, 2015.
U.S. Appl. No. 18/683,503, filed Apr. 10, 2015.
U.S. Appl. No. 14/683,569, filed Apr. 10, 2015.
U.S. Appl. No. 14/683,723, filed Apr. 10, 2015.
U.S. Appl. No. 18/683,786, filed Apr. 10, 2015.

* cited by examiner

BRACKET ASSEMBLY FOR MEDIA PATCHING SYSTEM

CROSS-REFERENCE TO RELATED APPLICATIONS

This application is a divisional patent application that claims priority benefit to a non-provisional patent application entitled "Media Patching System," which was filed on Apr. 10, 2015, and assigned Ser. No. 14/683,433. The foregoing non-provisional application in turn claims the benefit of U.S. Provisional Application No. 62/013,079, filed Jun. 17, 2014. Each of foregoing patent applications is herein incorporated by reference in its entirety.

FIELD OF THE DISCLOSURE

The present disclosure relates to patching systems configured to support multiple media connections (e.g., high density, mixed media connections) and, more particularly, to media patching systems having one or more bracket members (e.g., Z-shaped bracket members) configured to facilitate cable management.

BACKGROUND OF THE DISCLOSURE

In general, devices for interfacing with high frequency data transfer media are known. See, e.g., U.S. Pat. Nos. 8,439,702; 8,672,709 and 8,731,364, the entire contents of each being hereby incorporated by reference in their entireties.

For example, connectors or jack assemblies having a plurality of contacts (e.g., modular communication jacks) have been developed that facilitate communication with contacts in connecting assemblies (e.g., plug connectors), that in turn interact with various media (e.g., copper-based media such as unshielded twisted pair (UTP) media, fiber optic cables, etc.). The jack assembly contacts are typically positioned for communication with data signal transmission media plug elements/contacts introduced to a receiving space of the jack assembly.

In general, many data transfer media includes multiple pairs of lines bundled together. Communications systems typically incorporate such media (e.g., UTP media, fiber optic cables, etc.) and connectors (e.g., jack/plug combinations) for data transfer. For example, a plurality of jack assemblies/housings may be positioned adjacent one another in a multi-gang jack panel or the like, with each jack assembly/housing releasably secured and/or attached to the jack panel or the like.

In general, commercial buildings require an effective and efficient telecommunications infrastructure to support the wide variety of services that rely on the transport of information. Typically, wiring systems within buildings are terminated at a location where they may be interconnected with one another, and/or to other cabling systems or telecommunications equipment. Cables are often terminated on wire panels or patch panels or the like, which can be mounted to racks or to some other location/structure.

Patch panels are known in the field of data communication systems. See, e.g., U.S. Pat. No. 8,106,311, the entire contents of which is hereby incorporated by reference in its entirety. Some other exemplary assemblies/systems in this general field are described and disclosed in U.S. Pat. Nos. 7,697,811; 7,983,038; 8,184,938; 8,398,039; and U.S. Patent Pub. Nos. 2012/0064760 and 2013/0129296, the entire contents of each being hereby incorporated by reference in their entireties.

A patch panel generally provides a plurality of network ports incorporated into a structural element that connect incoming and outgoing lines of a communication/electrical system (e.g., a local area network (LAN) or the like). Typical patch panels are mounted hardware units that include a plurality of port locations, and utilize cables for interconnections. A patch panel can use patch cords to create the interconnections. Patch panel systems are generally intended to facilitate organization and management in implementing telecommunications wiring systems (e.g., for high speed data networks).

In general, many rows of cabinets or racks typically fill a data center or telecommunications room. Patch panels affixed to a rack and/or a telecommunications room provide convenient access to telecommunication devices (e.g., servers) within the rack or room. As the demand for the use of telecommunication devices rapidly grows, space for such devices becomes limited and/or expensive.

A constant need exists among manufacturers to develop patch panel assemblies/patching systems or the like that include improved features and structures.

Thus, an interest exists for improved patch panel assemblies/patching systems and related methods of use. These and other inefficiencies and opportunities for improvement are addressed and/or overcome by the assemblies, systems and methods of the present disclosure.

SUMMARY OF THE DISCLOSURE

The present disclosure provides advantageous media patching systems, and improved methods for using the same. The present disclosure provides advantageous patching systems configured to support multiple media connections (e.g., high density, mixed media connections), and related methods of use.

More particularly, the present disclosure provides improved systems/methods for the design and use of media patching systems having one or more bracket members (e.g., Z-shaped bracket members) configured to facilitate cable management. In exemplary embodiments, the bracket members allow a panel assembly to move relative to the bracket members (e.g., for cable management purposes).

In certain embodiments, disclosed herein is a high density patching system configured to support multiple media connections. The improved systems of the present disclosure provide users with the ability to install multiple media connections (e.g., copper-based and/or fiber optic connections) in the same patching system/enclosure. For example, high density jack patch panels can be utilized in the systems of the present disclosure to support multiple media connections (e.g., high density media connections, such as copper and/or fiber optic connections). Exemplary patch panel assemblies disclosed herein can advantageously increase the patching density of the systems of the present disclosure, and provide improved access to the media connectors and cabling elements.

The present disclosure provides for a bracket assembly including a first bracket member having a substantially Z-shaped configuration, the first bracket member including a first segment, a second segment and a third segment, with the third segment: (i) connecting the first and second segments to define the substantially Z-shaped configuration, and (ii) having at least one aperture configured to mount to a supporting structure; wherein the first segment of the first bracket member includes at least one protrusion member configured to releasably mount to a first cable management member, the first cable management member configured to manage media cables; and wherein the second segment of the first bracket member includes at least one attachment element configured to allow a panel assembly to movably mount to the second segment of the first bracket member.

The present disclosure also provides for a bracket assembly wherein the first segment of the first bracket member defines a first axial plane, and the second segment of the first bracket member defines a second axial plane that is spaced apart from the first axial plane.

The present disclosure also provides for a bracket assembly wherein the first axial plane is substantially parallel to the second axial plane. The present disclosure also provides for a bracket assembly wherein the third segment of the first bracket member defines a third axial plane, and the third axial plane is substantially perpendicular to the first and second axial planes.

The present disclosure also provides for a bracket assembly wherein the third segment of the first bracket member includes one or more apertures that are configured and dimensioned to allow the first bracket member to be mounted to a supporting structure.

The present disclosure also provides for a bracket assembly wherein the first cable management member includes a securement slot configured to mount to the protrusion member of the first segment of the first bracket member; and wherein the first cable management member includes a tab member configured to releasably secure to a slot of the first segment of the first bracket member.

The present disclosure also provides for a bracket assembly wherein the first cable management member includes a plurality of extension arms configured to manage media cables. The present disclosure also provides for a bracket assembly wherein: the plurality of extension arms of the first cable management member includes a top extension arm, a first middle extension arm located below the top extension arm, a second middle extension arm located below the first middle extension arm, and a bottom extension arm; and the top extension arm and the first middle extension arm define a first cable passageway, the first middle extension arm and the second middle extension arm define a second cable passageway, and the second middle extension arm and the bottom extension arm define a third cable passageway.

The present disclosure also provides for a bracket assembly wherein top and bottom extension arms of the plurality of extension arms each include an extending portion configured to releasably mount to a respective slot positioned on the first segment of the first bracket member. The present disclosure also provides for a bracket assembly wherein the at least one attachment element of the second segment of the first bracket member includes a slot. The present disclosure also provides for a bracket assembly wherein the at least one attachment element of the second segment of the first bracket member includes a flange member.

The present disclosure also provides for a bracket assembly wherein the at least one attachment element of the second segment of the first bracket member includes a plurality of protrusion members. The present disclosure also provides for a bracket assembly further including a second bracket member having a substantially Z-shaped configuration, the second bracket member including a first segment, a second segment and a third segment, with the third segment: (i) connecting the first and second segments to define the substantially Z-shaped configuration, and (ii) having at least one aperture configured to mount to the supporting structure; wherein the first segment of the second bracket member includes at least one protrusion member configured to releasably mount to a second cable management member, the second cable management member configured to manage media cables; and wherein the second segment of the second bracket member includes at least one attachment element configured to allow the panel assembly to movably mount to the second segment of the second bracket member.

The present disclosure also provides for a bracket assembly wherein: the first segment of the second bracket member defines a fourth axial plane, and the second segment of the second bracket member defines a fifth axial plane that is spaced apart from the fourth axial plane; the fourth axial plane is substantially parallel to the fifth axial plane; and the third segment of the second bracket member defines a sixth axial plane that is substantially perpendicular to the fourth and fifth axial planes.

The present disclosure also provides for a bracket assembly further including a door assembly and first and second top cover members mounted to the first and second bracket members; and wherein the third segment of the second bracket member includes one or more apertures that are configured and dimensioned to allow the second bracket member to be mounted to a supporting structure.

The present disclosure also provides for a media patching system including a first bracket member having a substantially Z-shaped configuration, the first bracket member including a first segment, a second segment and a third segment, with the third segment: (i) connecting the first and second segments to define the substantially Z-shaped configuration, and (ii) having at least one aperture configured to mount to a supporting structure; a second bracket member having a substantially Z-shaped configuration, the second bracket member including a first segment, a second segment and a third segment, with the third segment: (i) connecting the first and second segments to define the substantially Z-shaped configuration, and (ii) having at least one aperture configured to mount to the supporting structure; a panel assembly having a substantially U-shaped configuration, the panel assembly including a front panel segment, a first side segment and a second side segment, with the front panel segment: (i) connecting the first and second side segments to define the substantially U-shaped configuration, and (ii) having a plurality of apertures with each aperture configured to mount to a media connector assembly; and a rear cable management assembly that is releasably secured to the second segment of the first bracket member and the second segment of the second bracket member.

The present disclosure also provides for a media patching system wherein: the first segment of the first bracket member includes at least one protrusion member configured to releasably mount to a first cable management member, the first cable management member configured to manage media cables; and the first segment of the second bracket member includes at least one protrusion member configured to releasably mount to a second cable management member, the second cable management member configured to manage media cables.

The present disclosure also provides for a media patching system wherein: the first and second cable management members each include a top extension arm, a first middle extension arm located below the top extension arm, a second middle extension arm located below the first middle extension arm, and a bottom extension arm; and the top extension arm and the first middle extension arm define a first cable passageway, the first middle extension arm and the second middle extension arm define a second cable passageway, and the second middle extension arm and the bottom extension arm define a third cable passageway.

The present disclosure also provides for a media patching system wherein: the second segment of the first bracket member includes at least one attachment element configured to allow the panel assembly to movably mount to the second segment of the first bracket member; the second segment of the second bracket member includes at least one attachment element configured to allow the panel assembly to movably mount to the second segment of the second bracket member; and the front panel segment of the panel assembly moves axially forwards or backwards via: (i) the first side segment of the panel assembly moving relative to the first bracket member, and (ii) the second side segment of the panel assembly moving relative to the second bracket member.

The present disclosure also provides for a media patching system wherein the rear cable management assembly includes a fixed lower cable management plate and an upper cable management plate that can move relative to the lower cable management plate.

Any combination or permutation of embodiments is envisioned. Additional advantageous features, functions and applications of the disclosed systems, methods and assemblies of the present disclosure will be apparent from the description which follows, particularly when read in conjunction with the appended figures. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various features, steps and combinations of features/steps described below and illustrated in the figures can be arranged and organized differently to result in embodiments which are still within the scope of the present disclosure.

Figure 1:
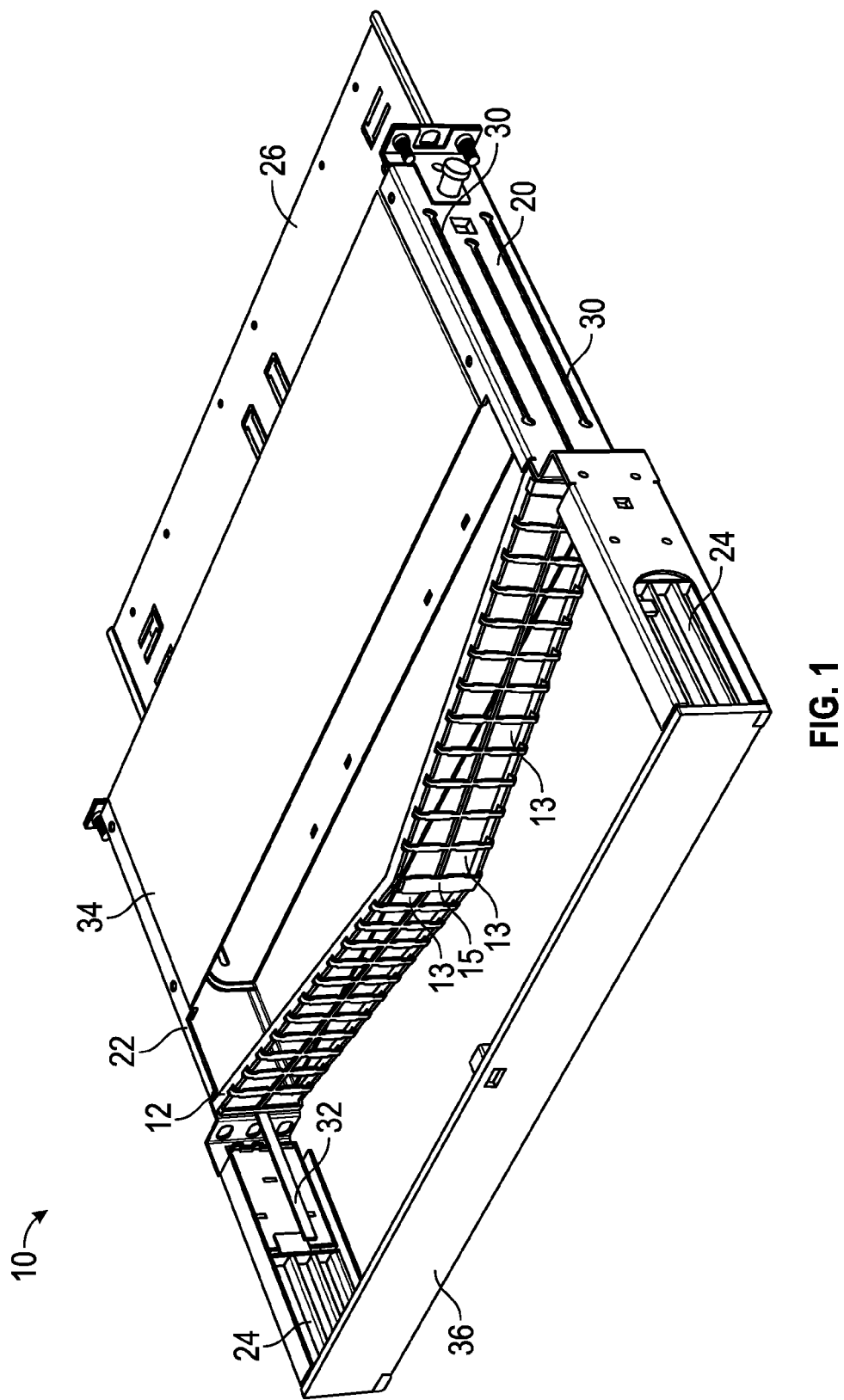
Figure 2:
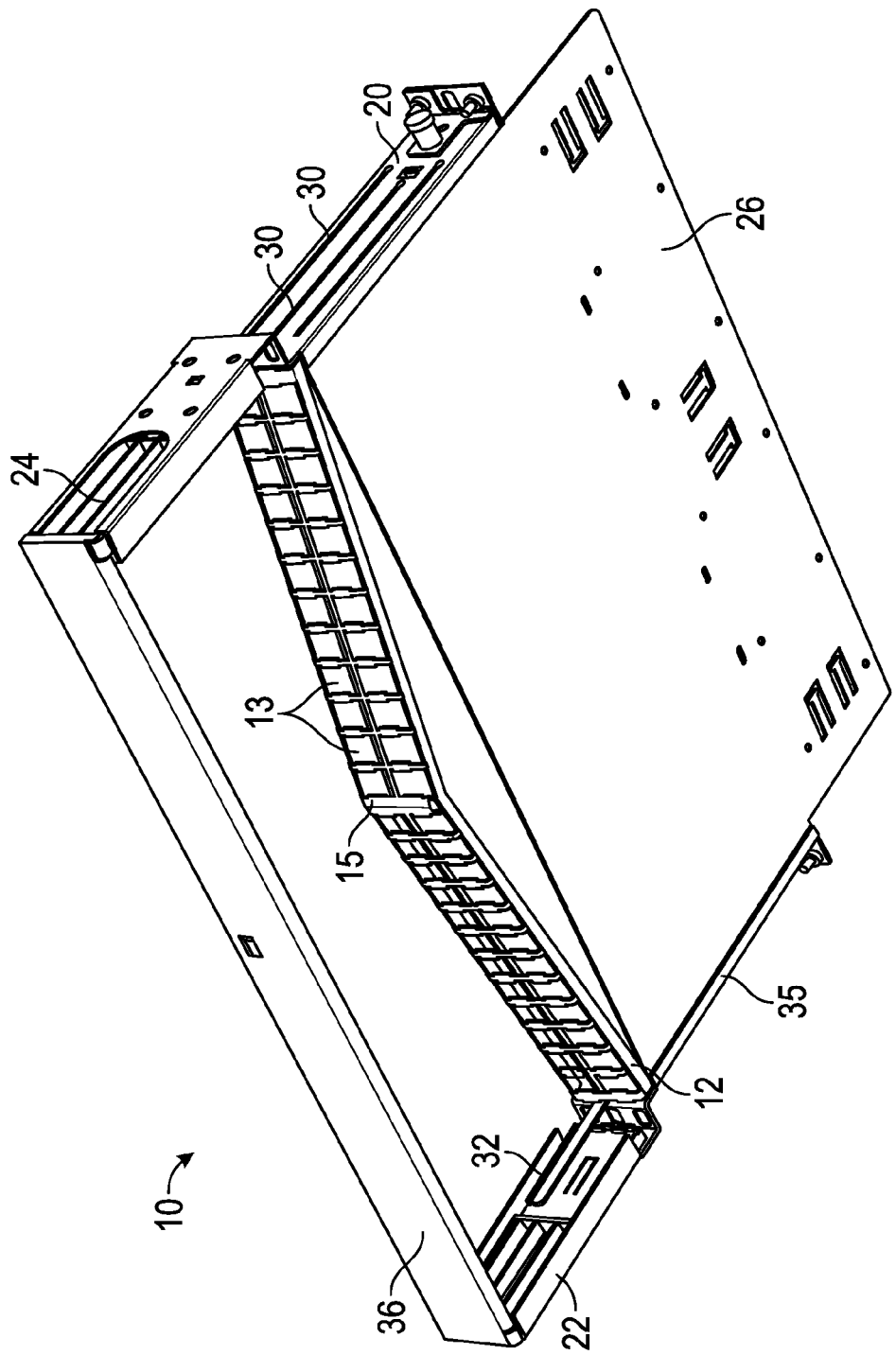
Figure 3:
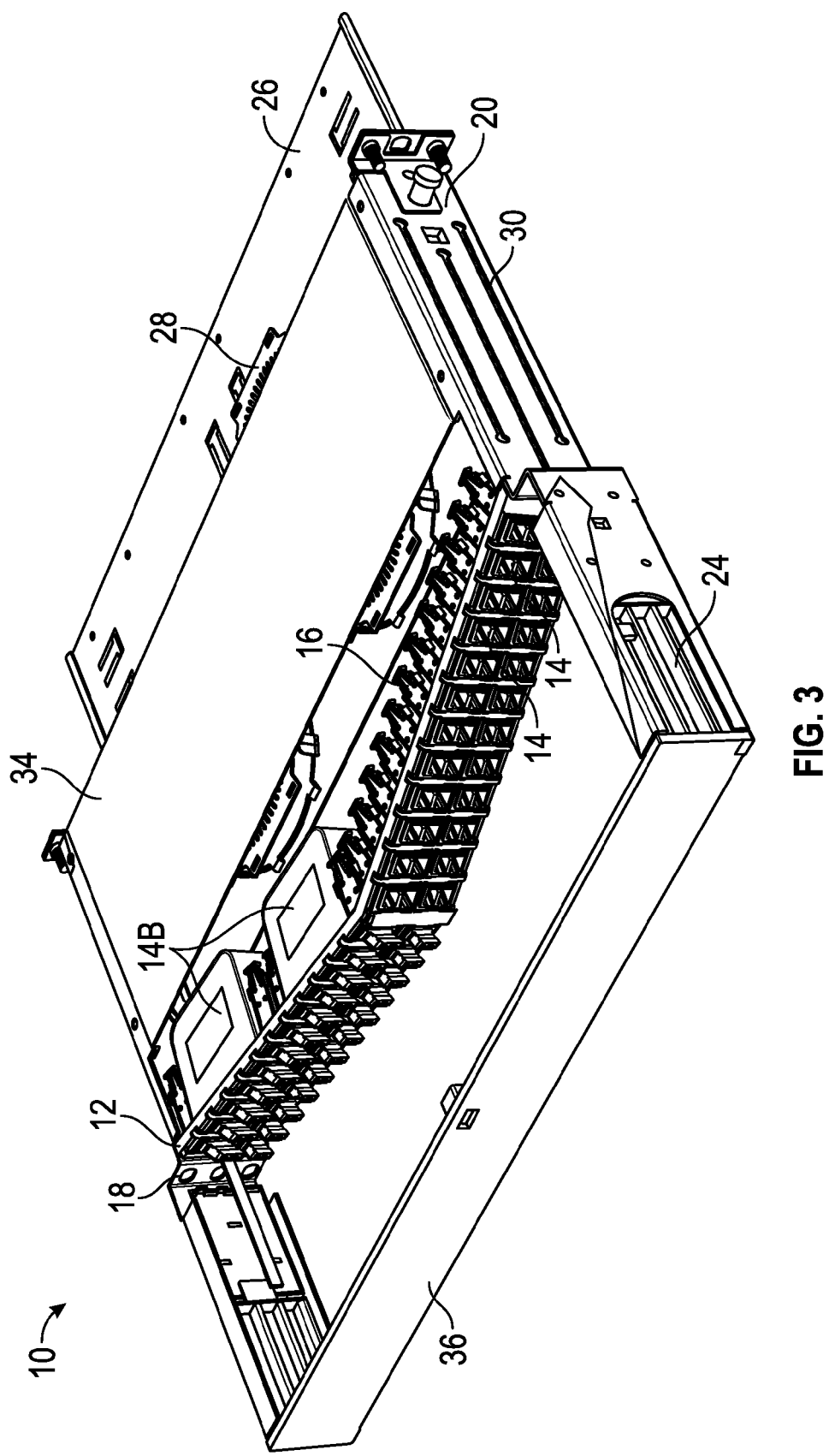
Figure 4:
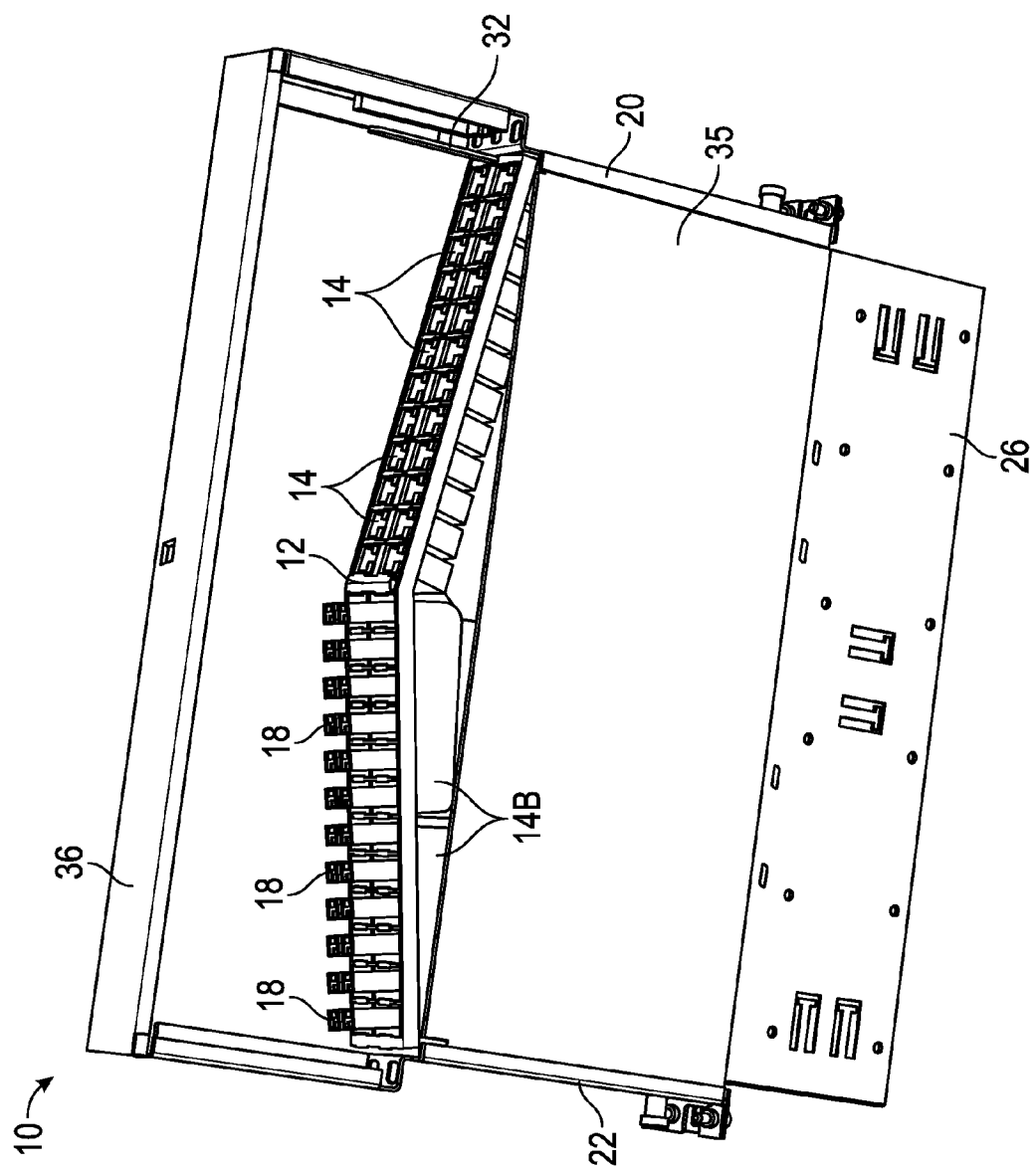
Figure 5:
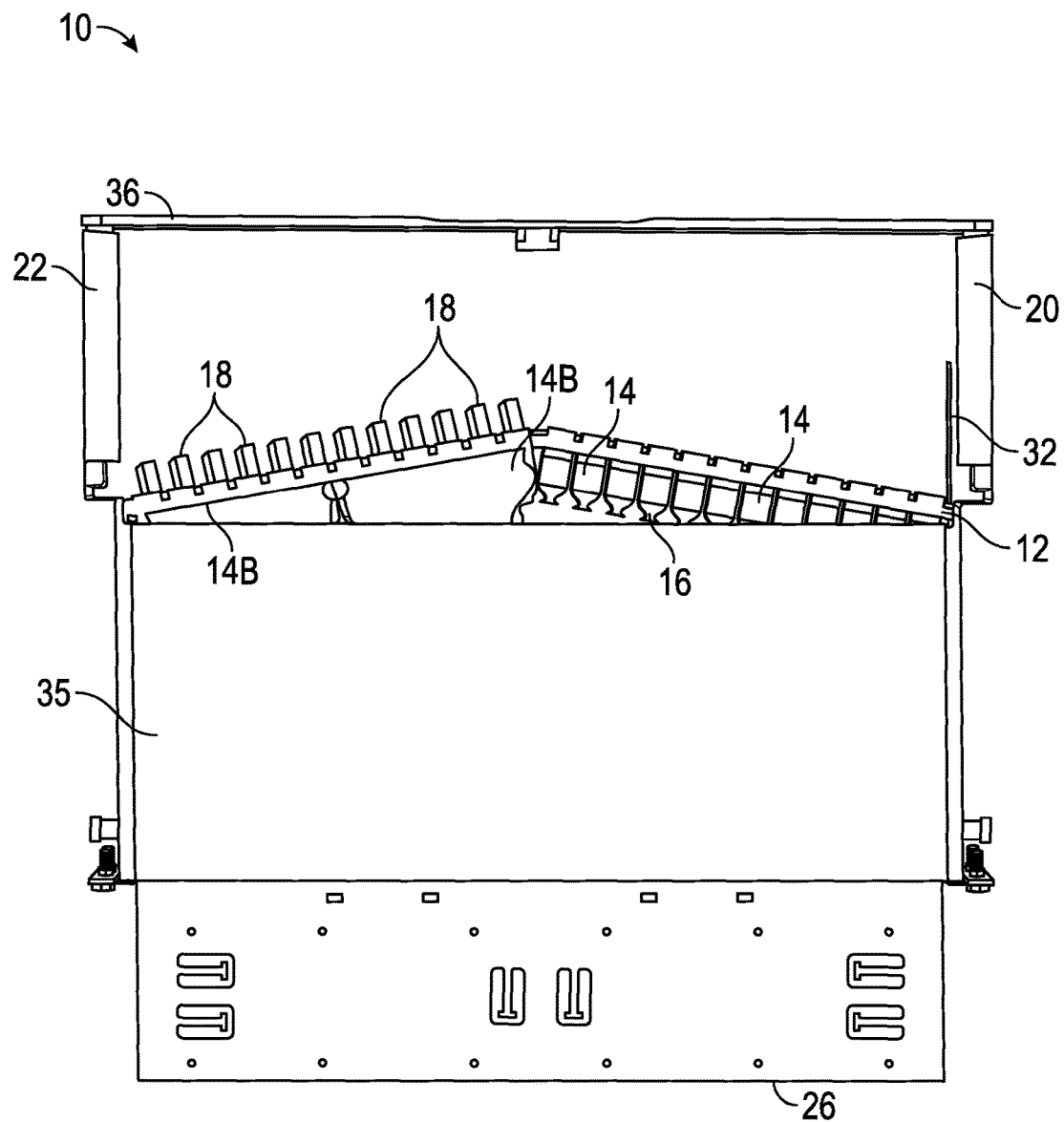
Figure 6:
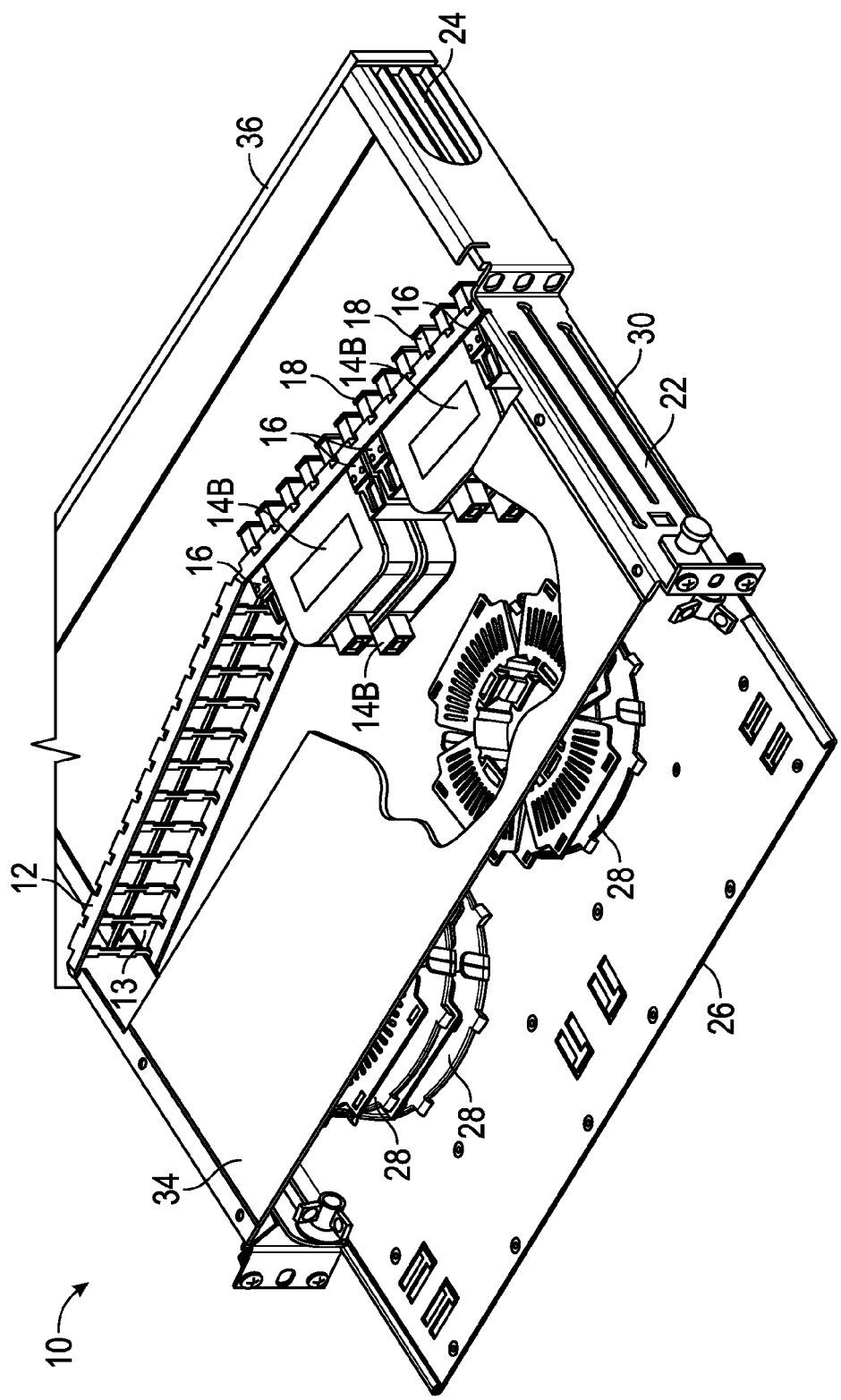
Figure 7:
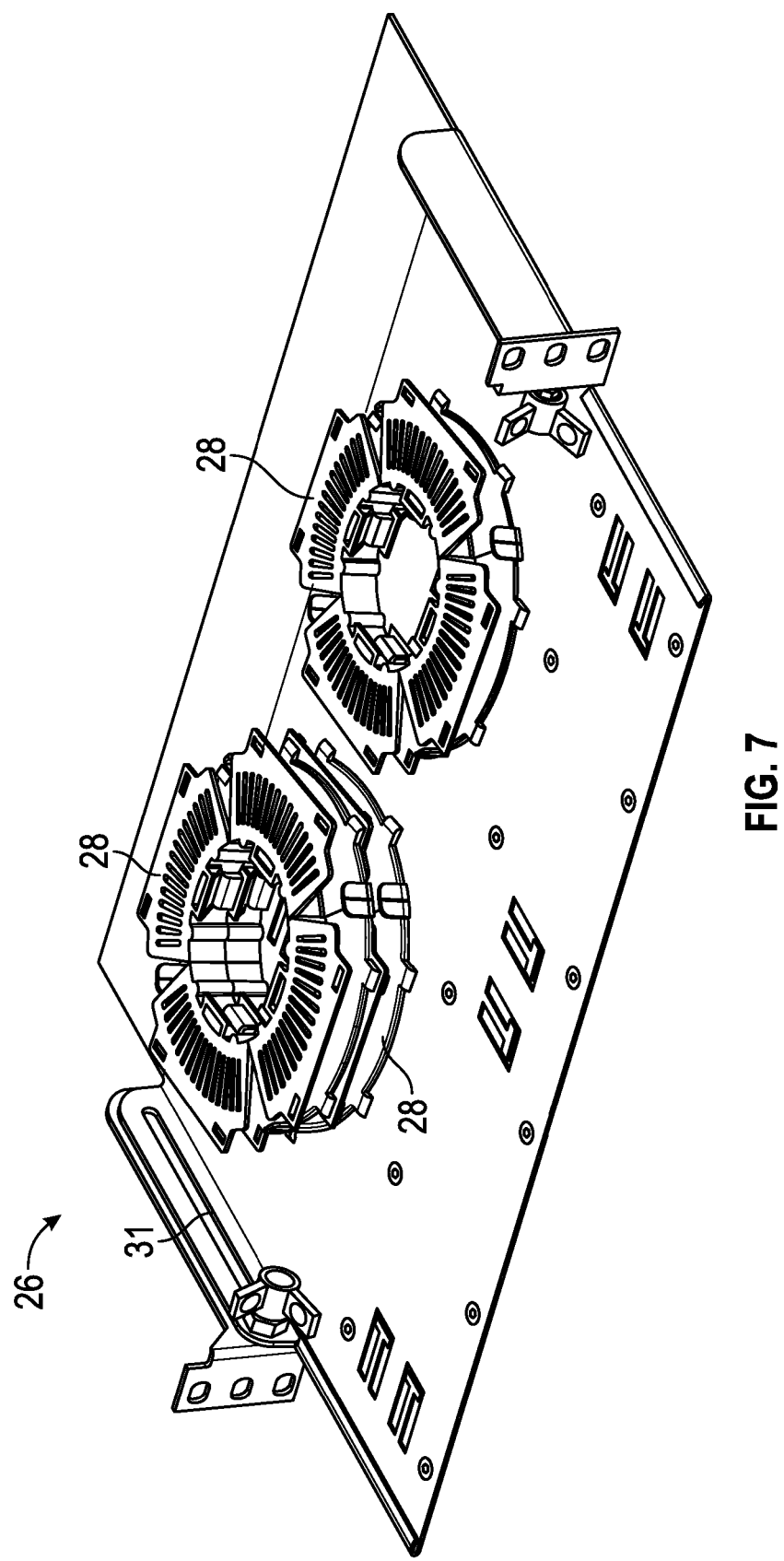
Figure 8:
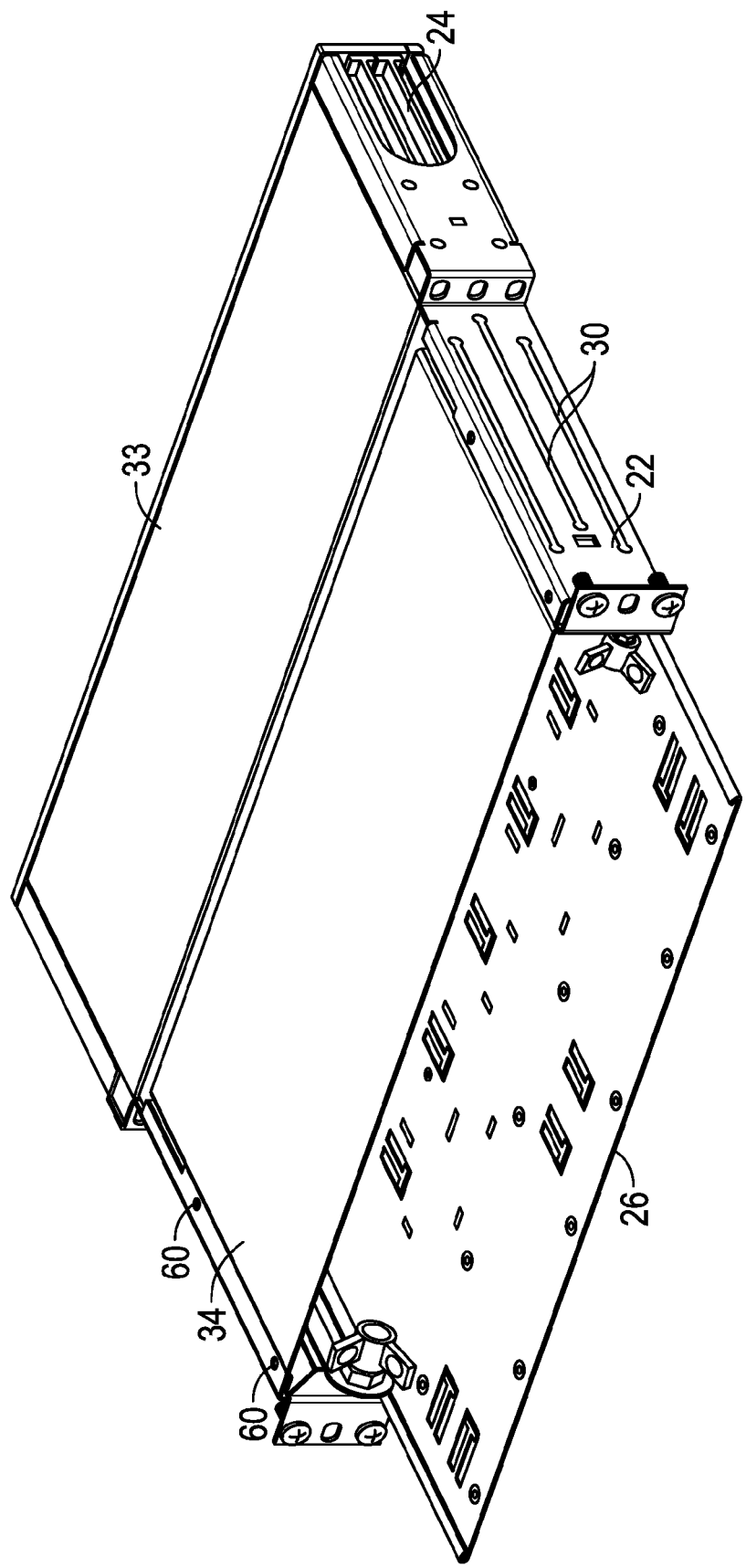
Figure 9:
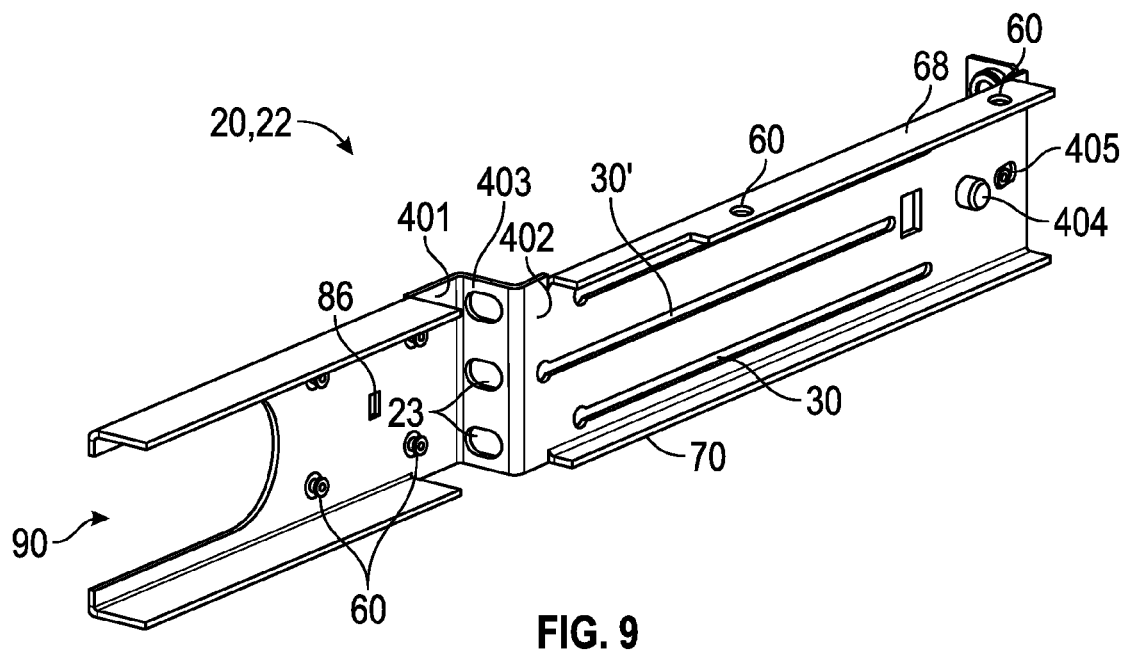
Figure 10:
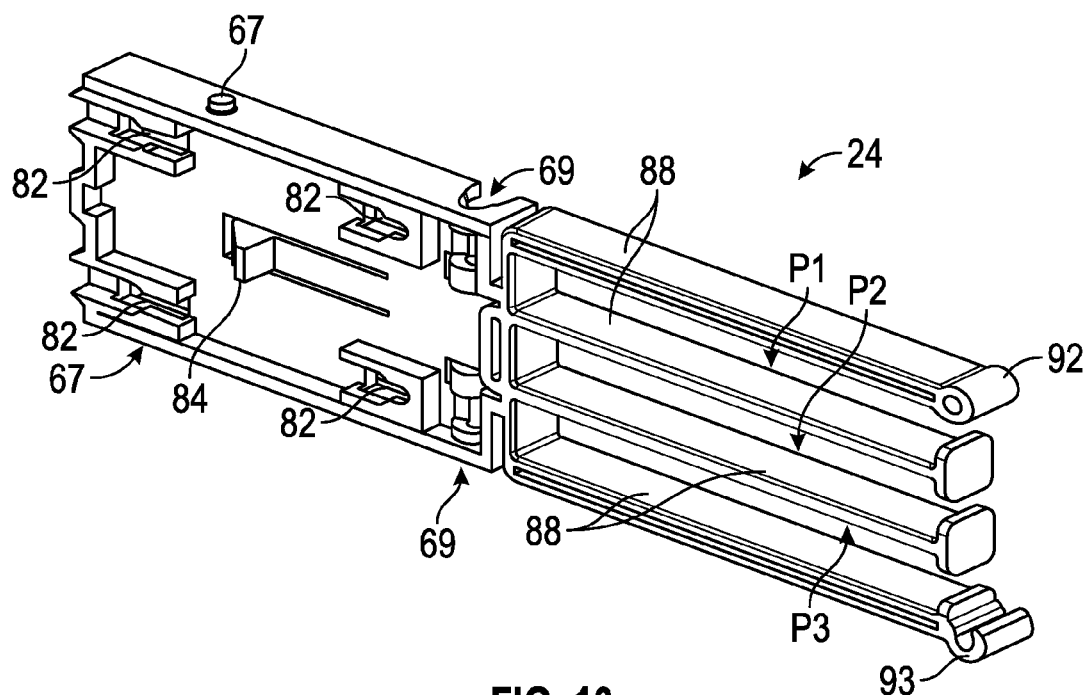
Figure 11:
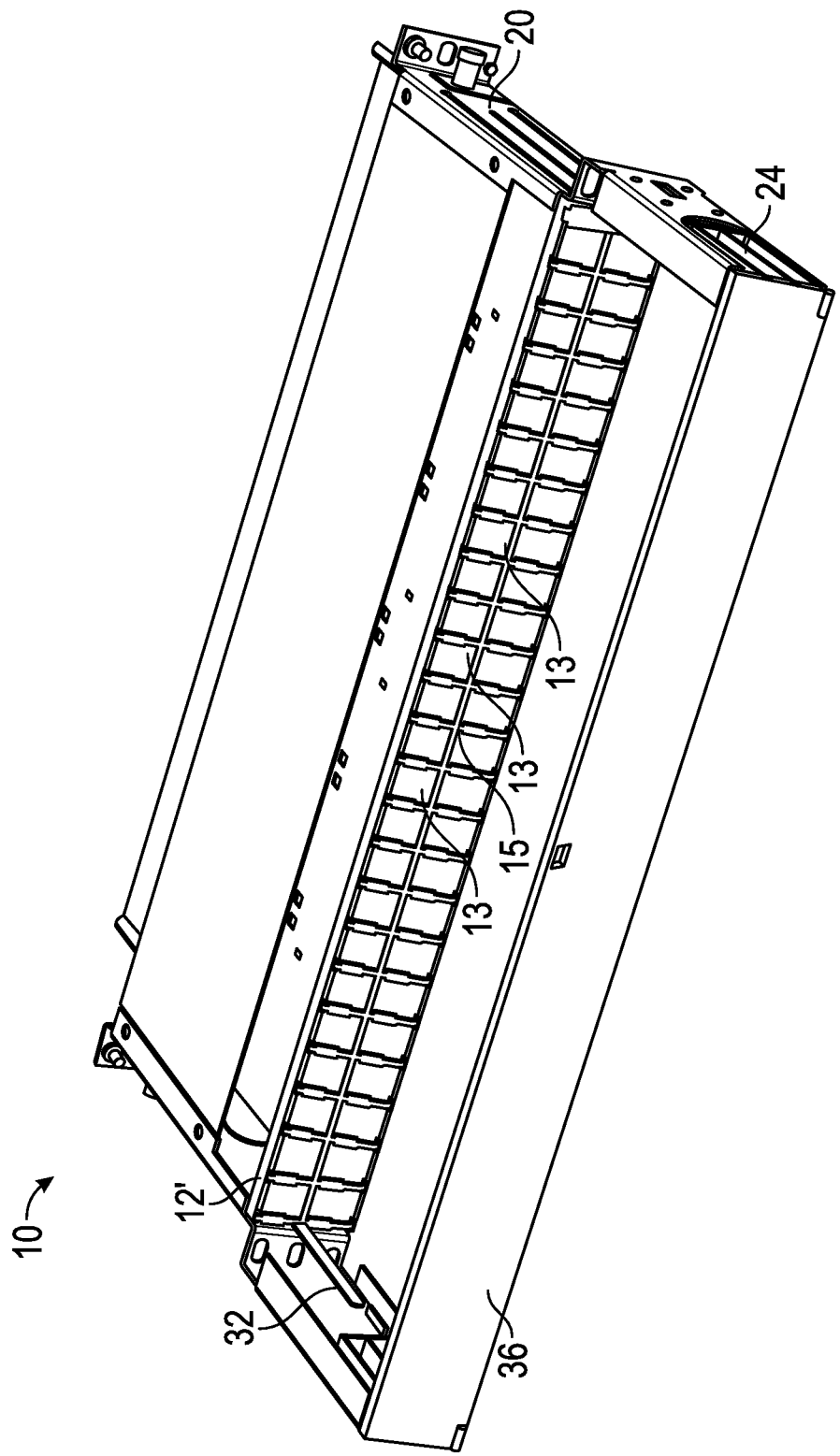
Figure 12:
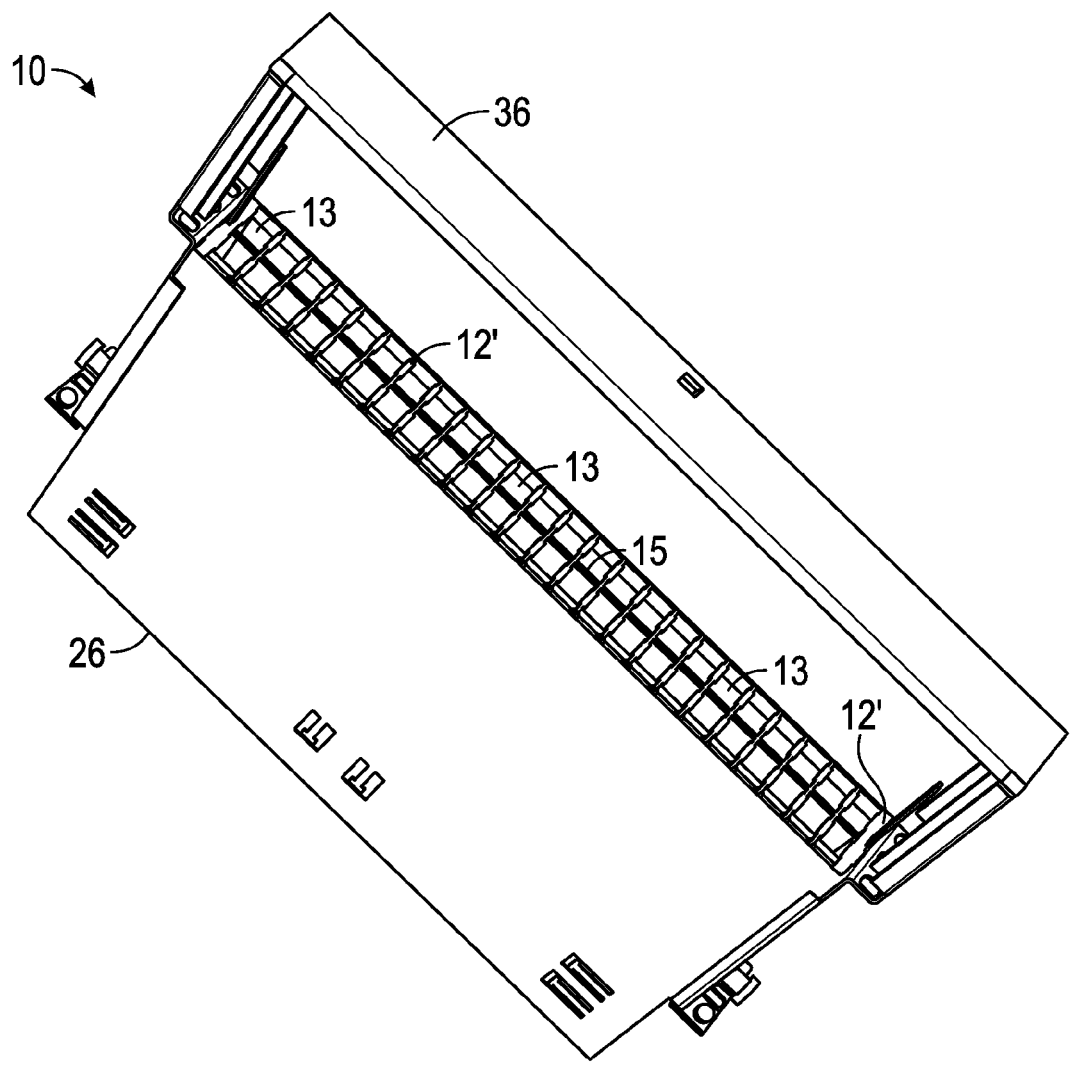
Figure 13:
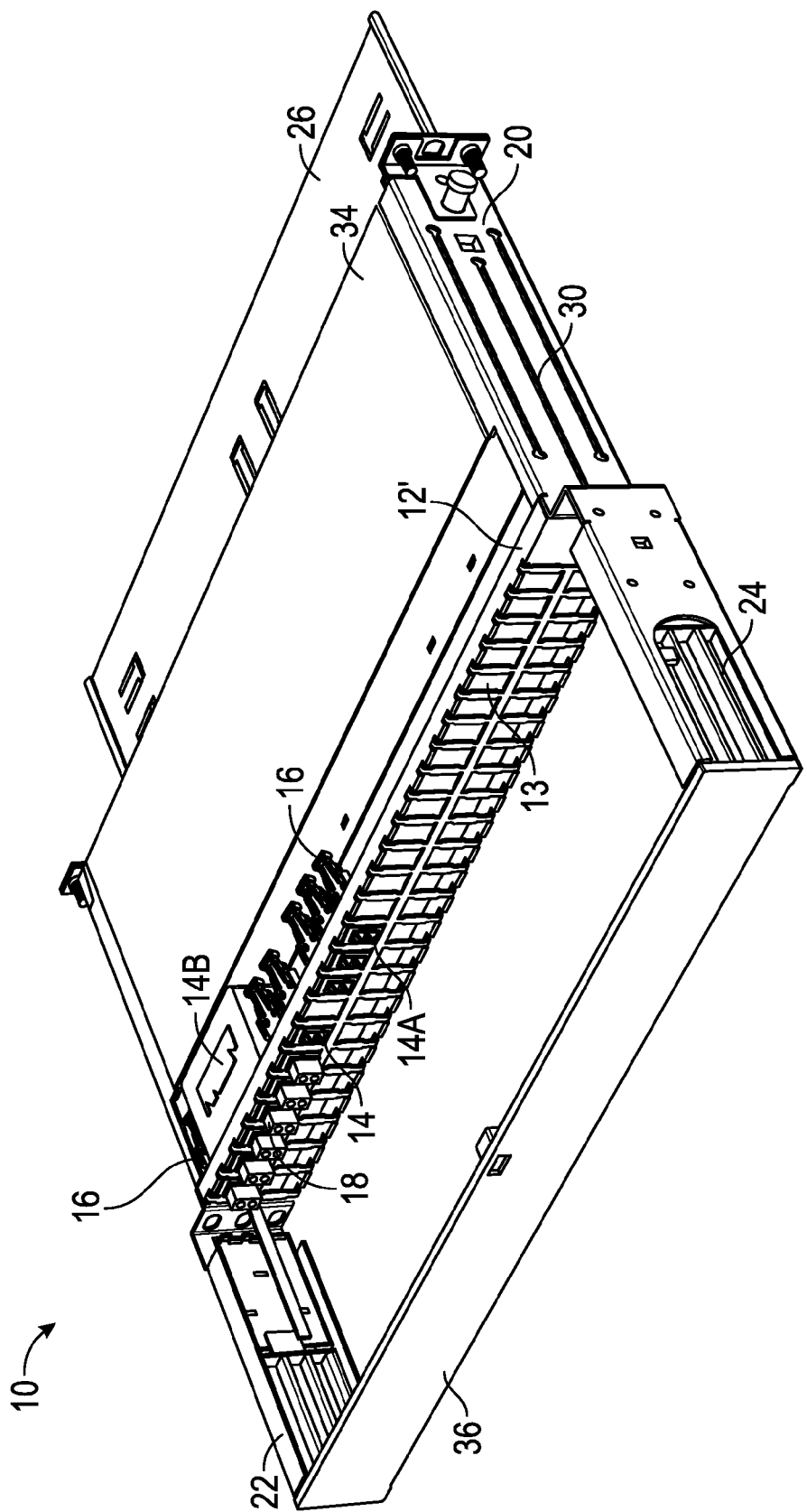
Figure 14:
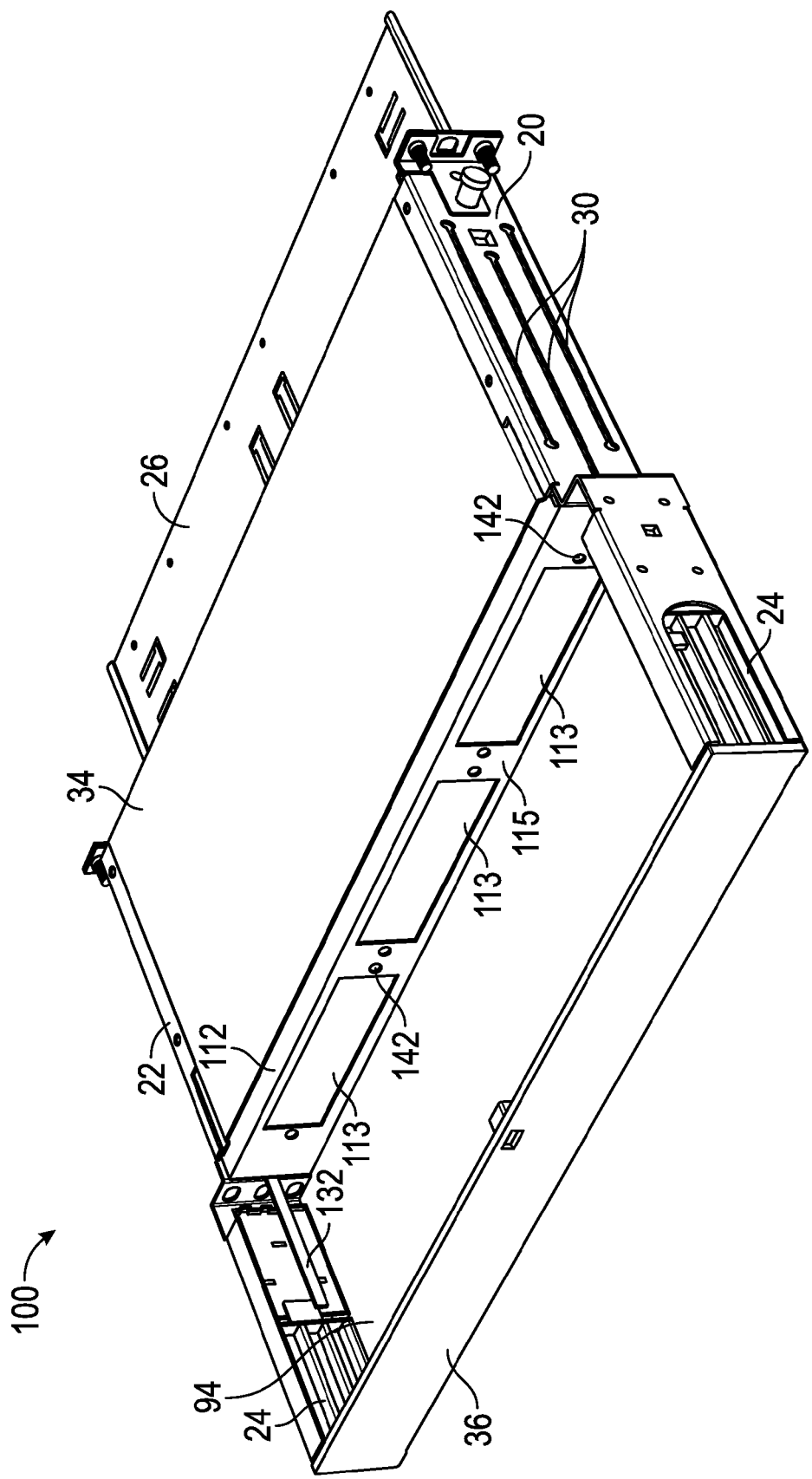
Figure 15:
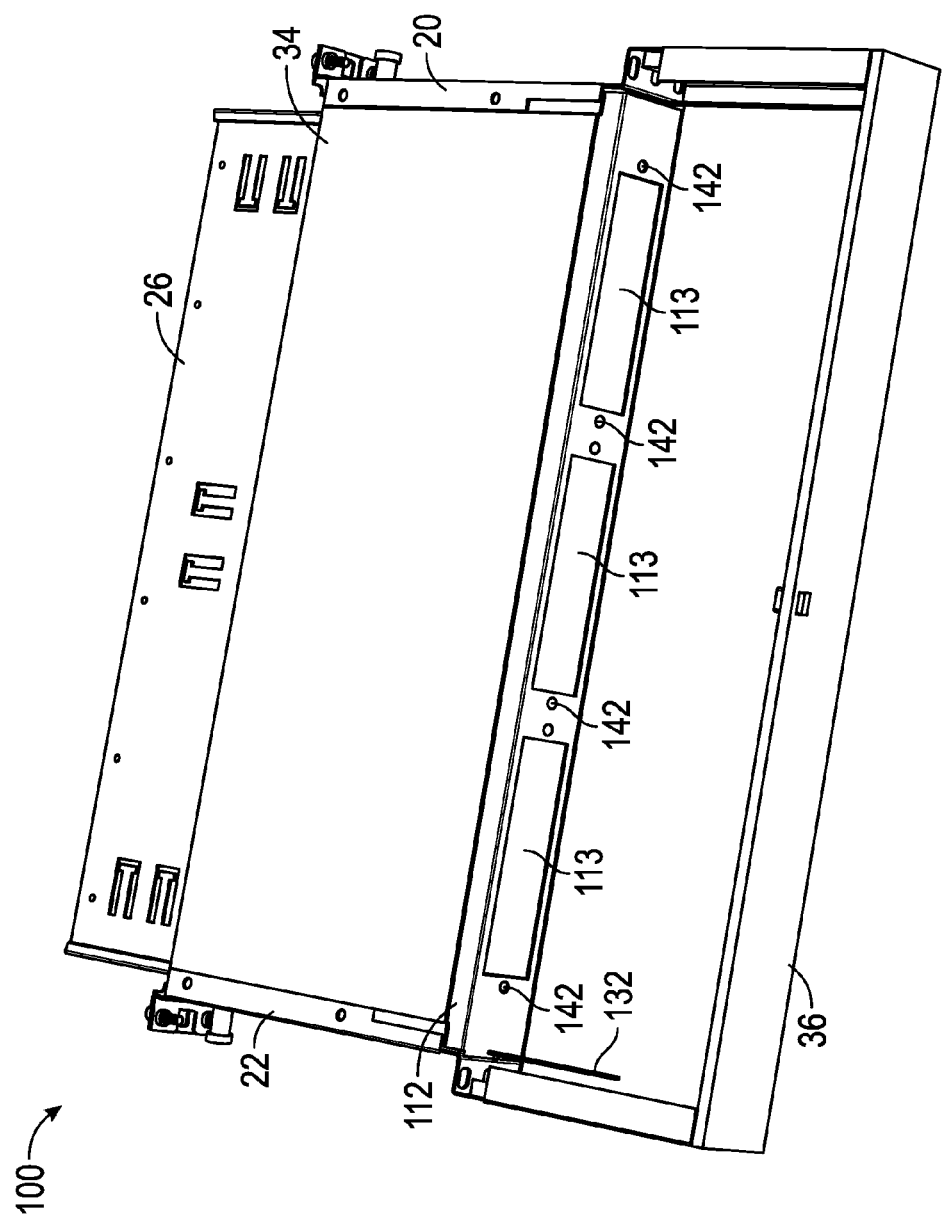
Figure 16:
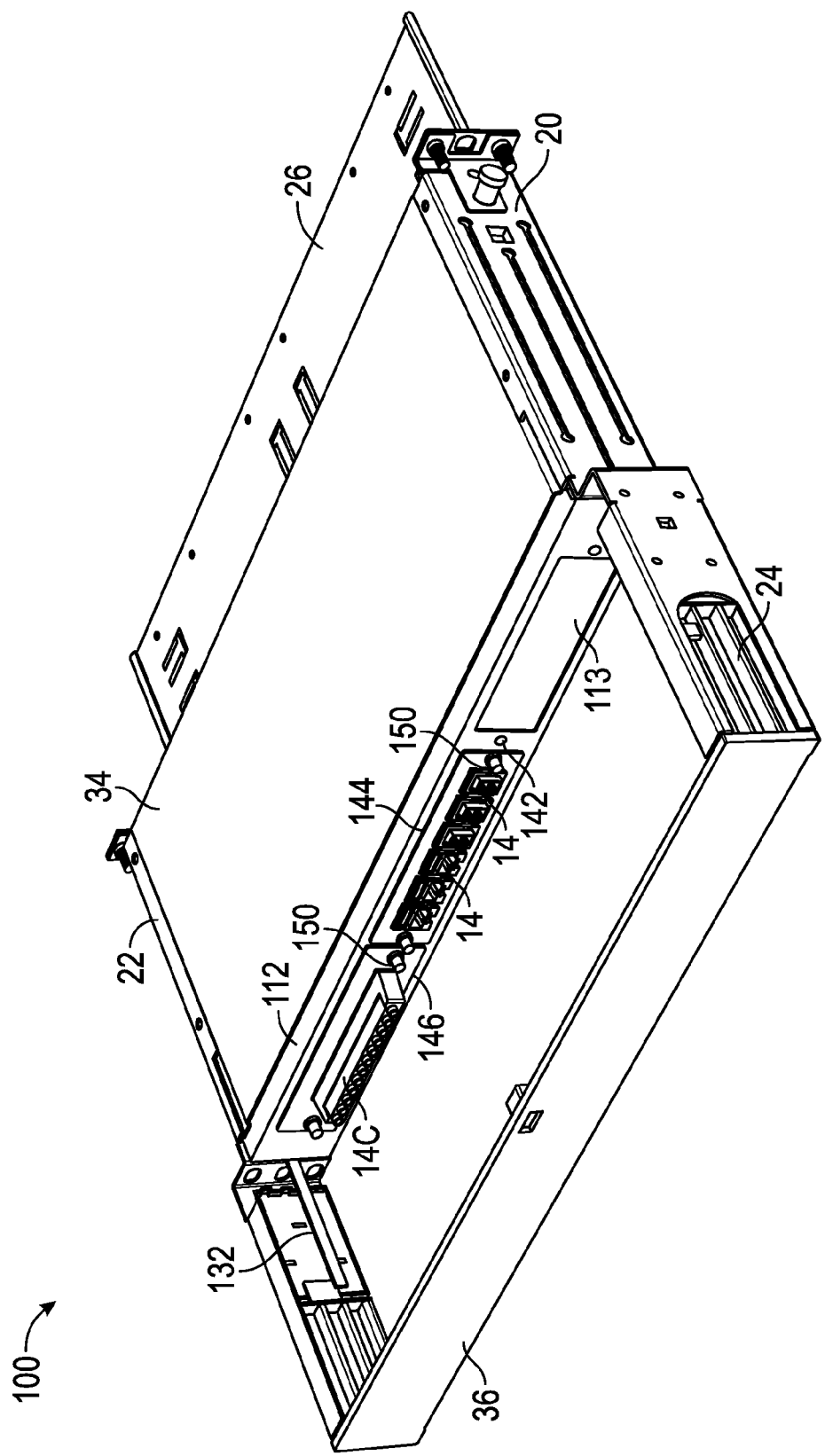
Figure 17:
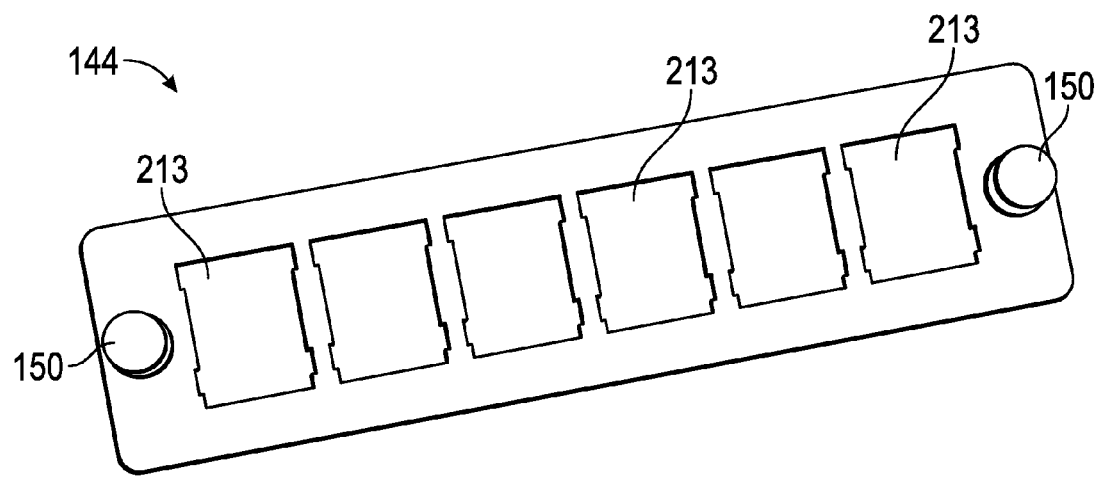
Figure 18:
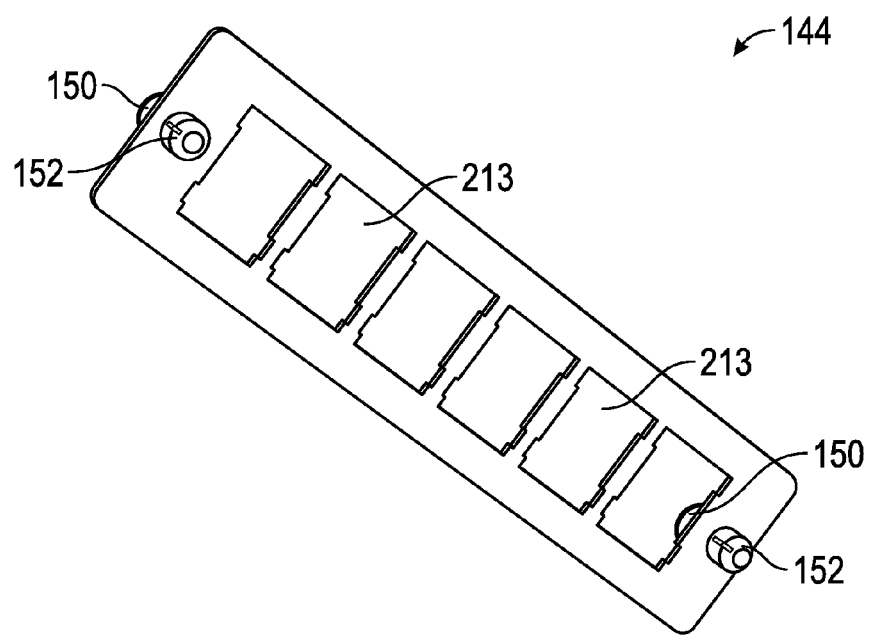
Figure 19:
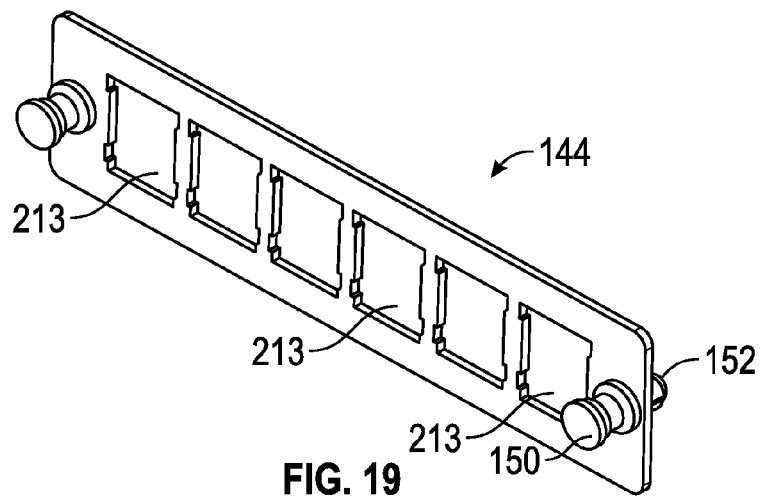
Figure 20:
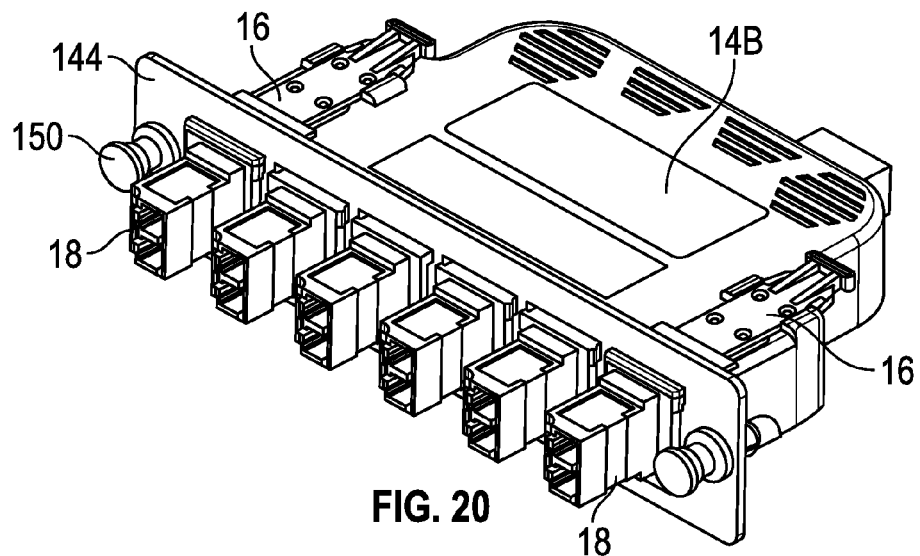
Figure 21:
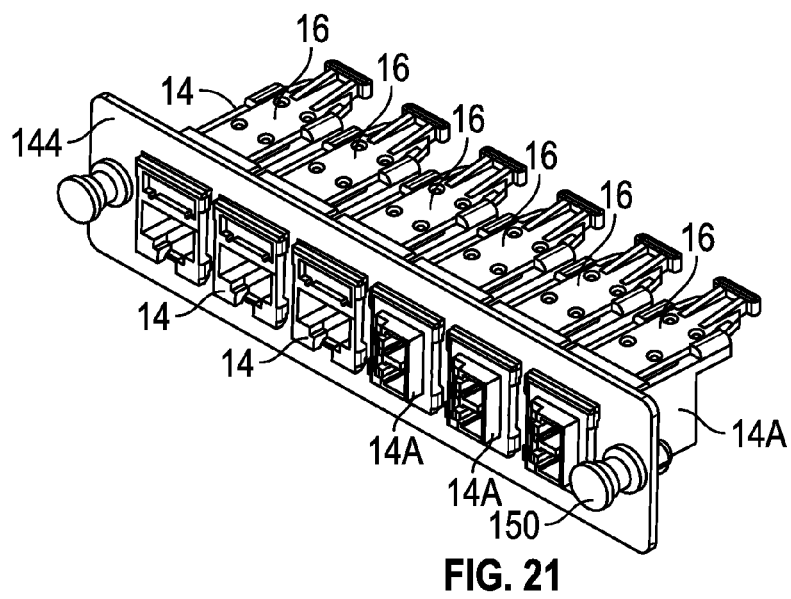
Figure 22:
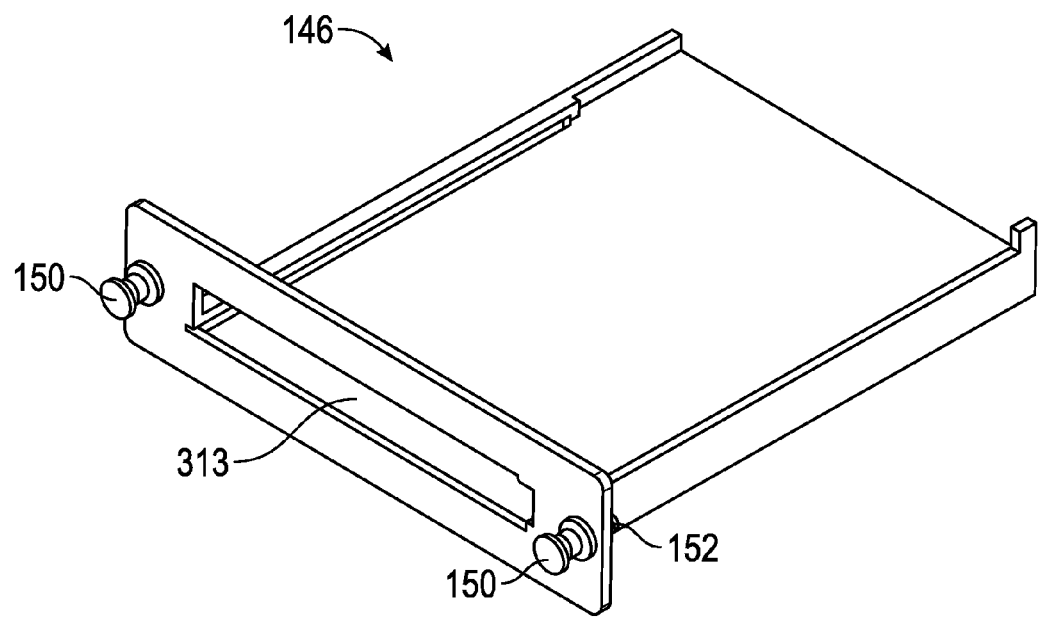
Figure 23:
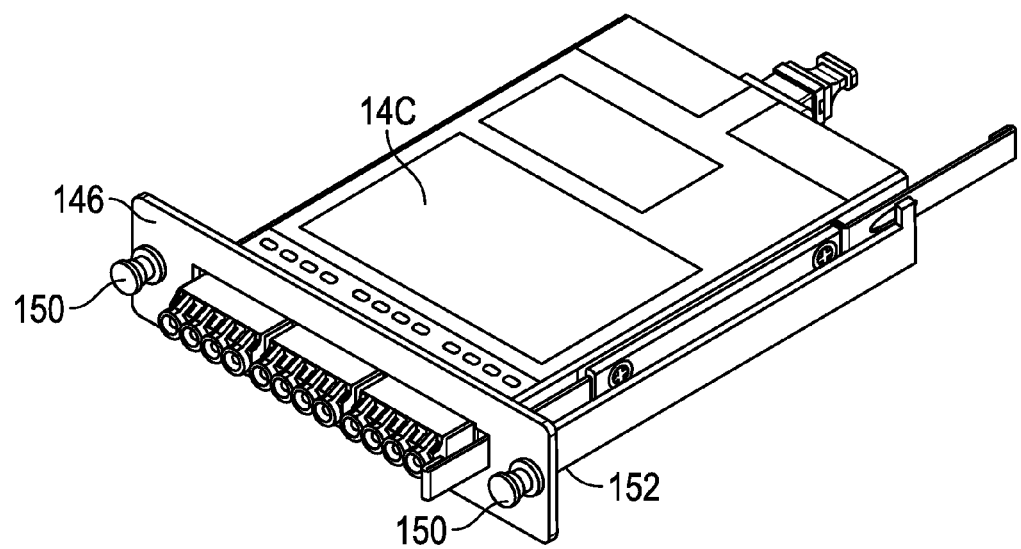
Figure 24:
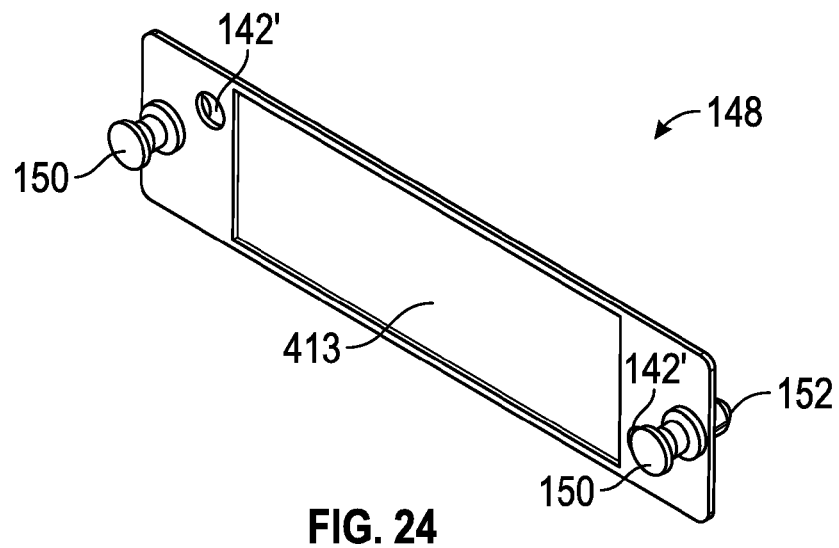
Figure 25:
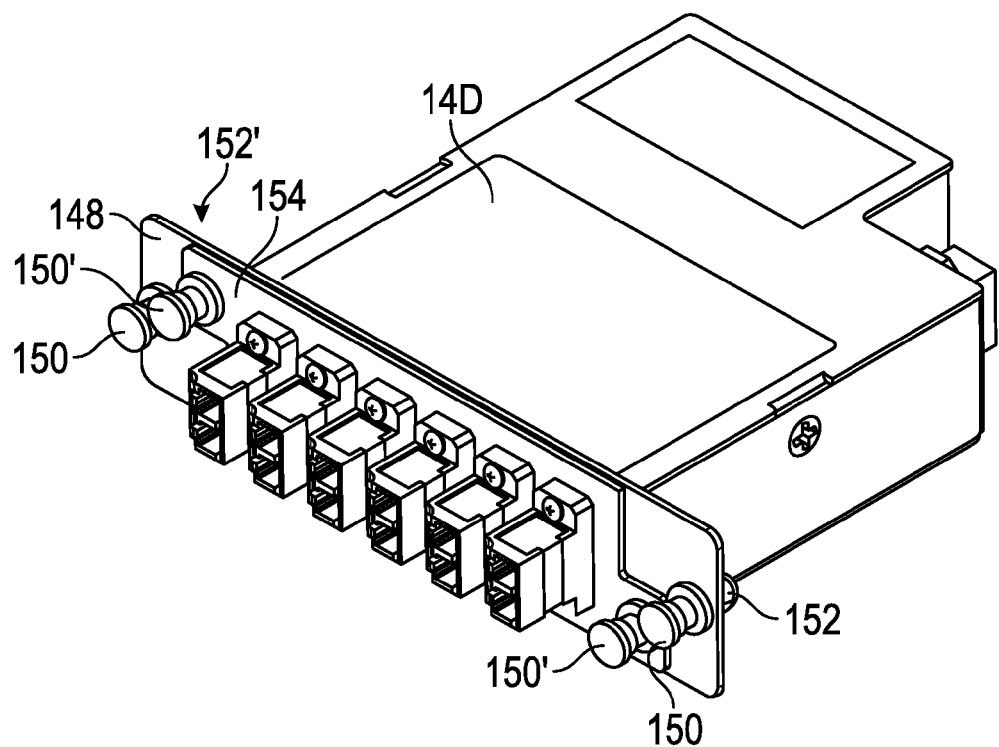
Figure 26:
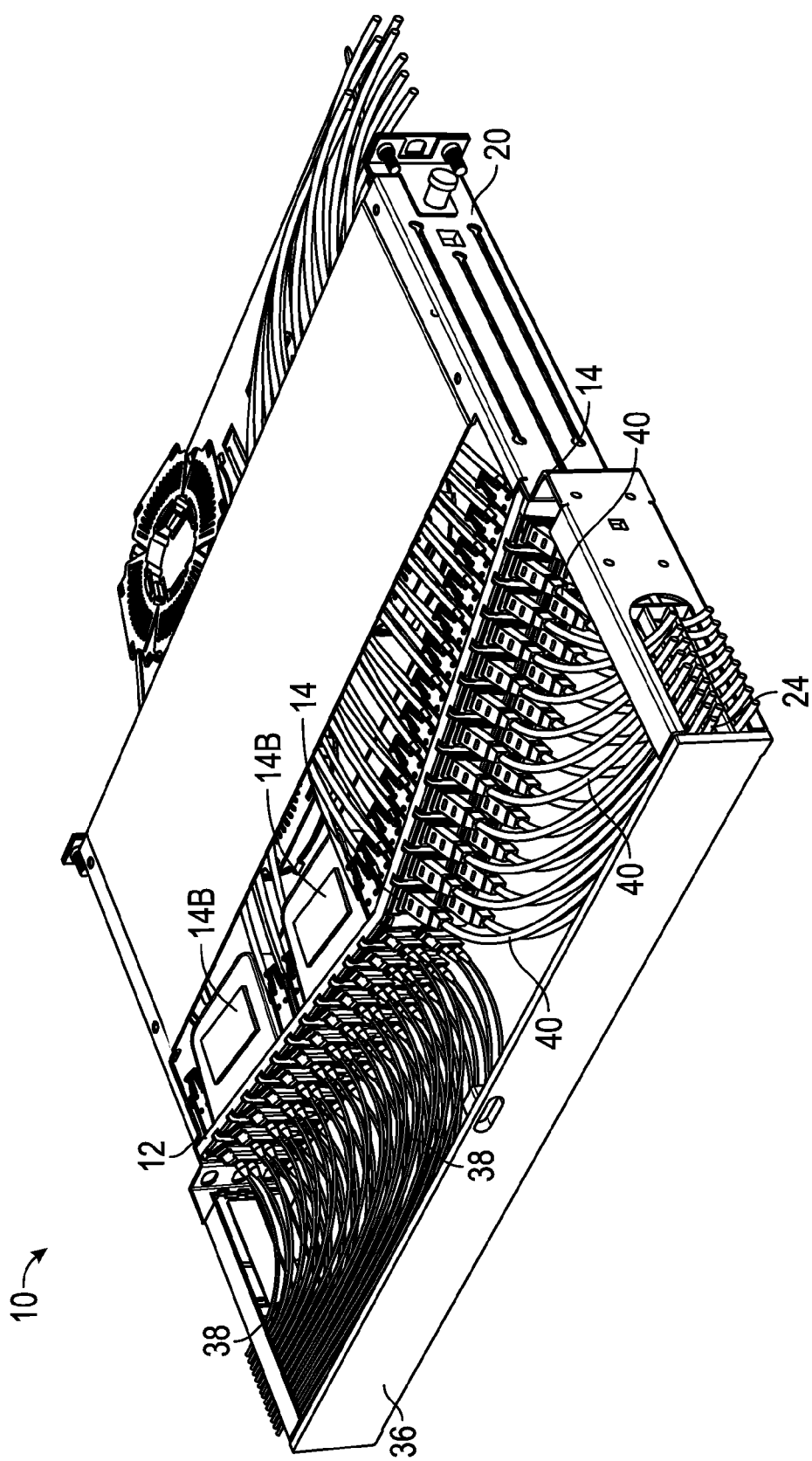
Figure 27:
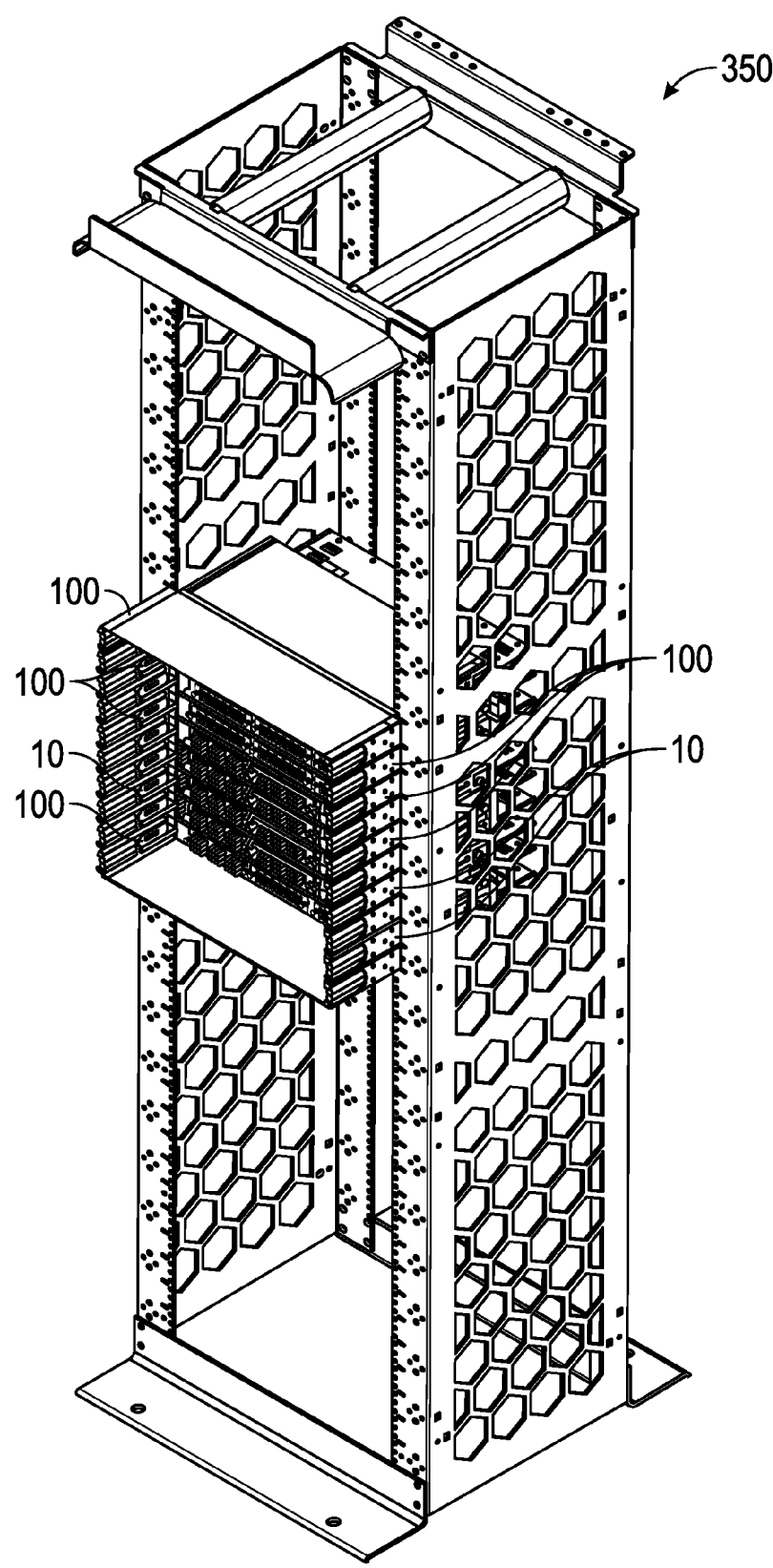
Figure 28:
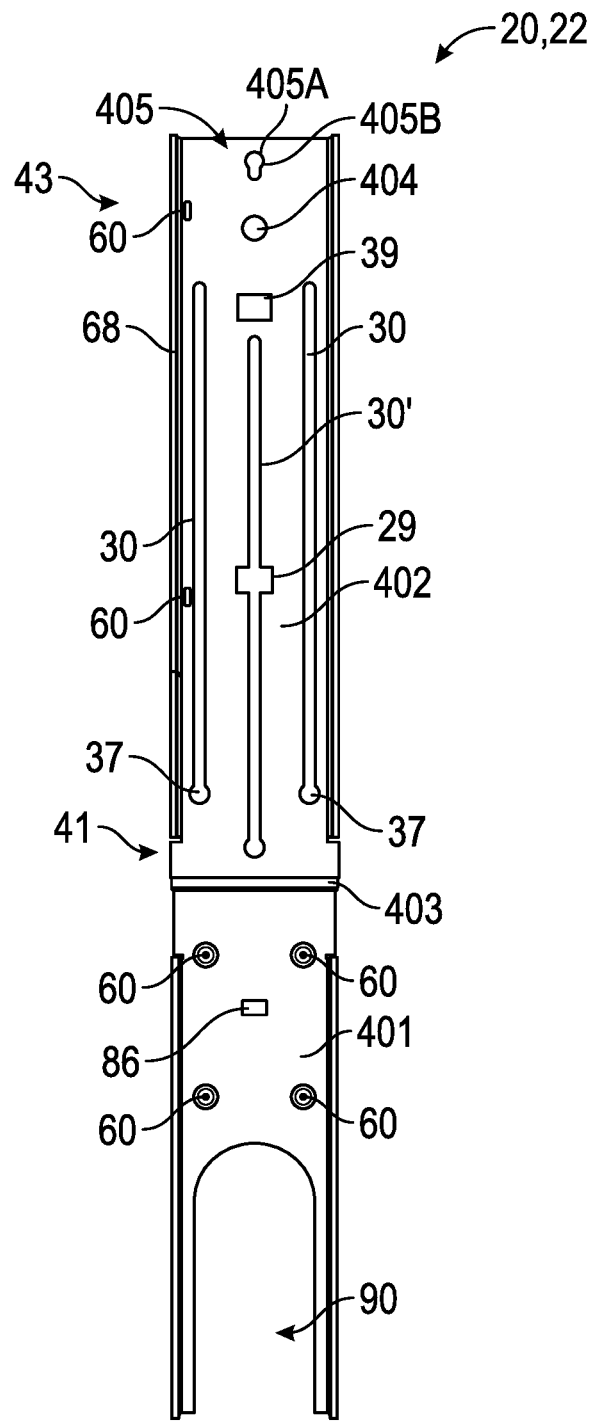
Figure 29:
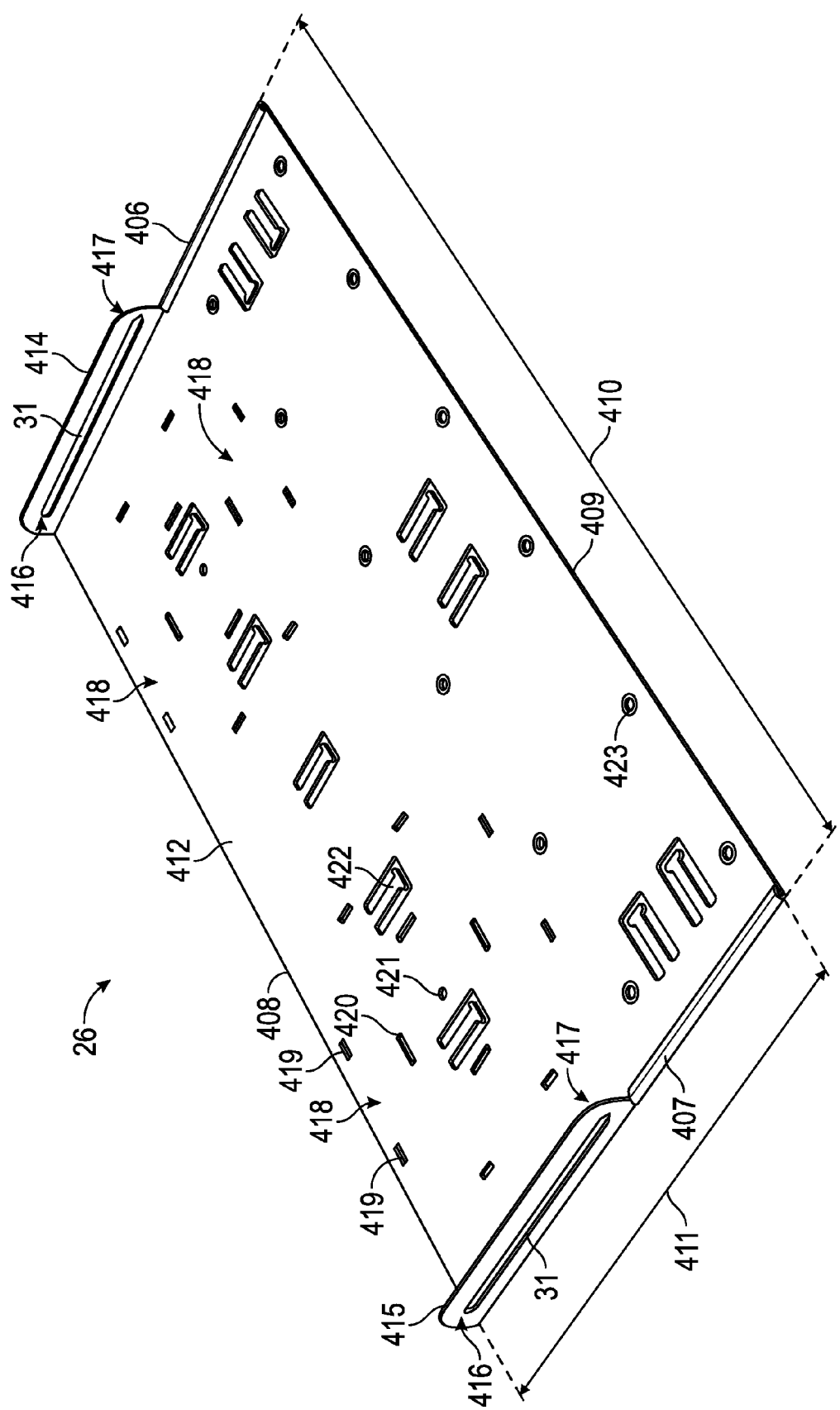
Figure 30:
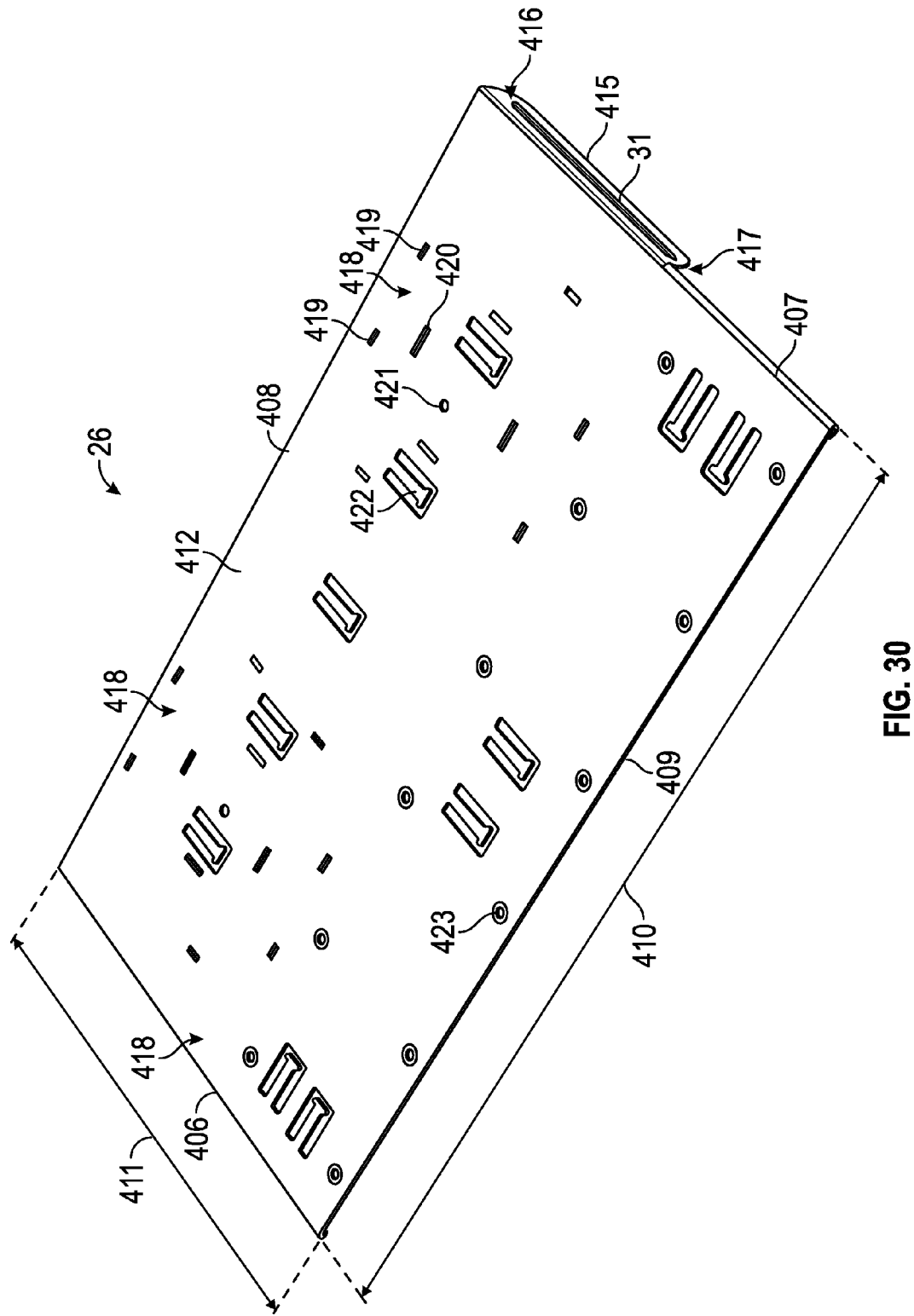
Figure 31:
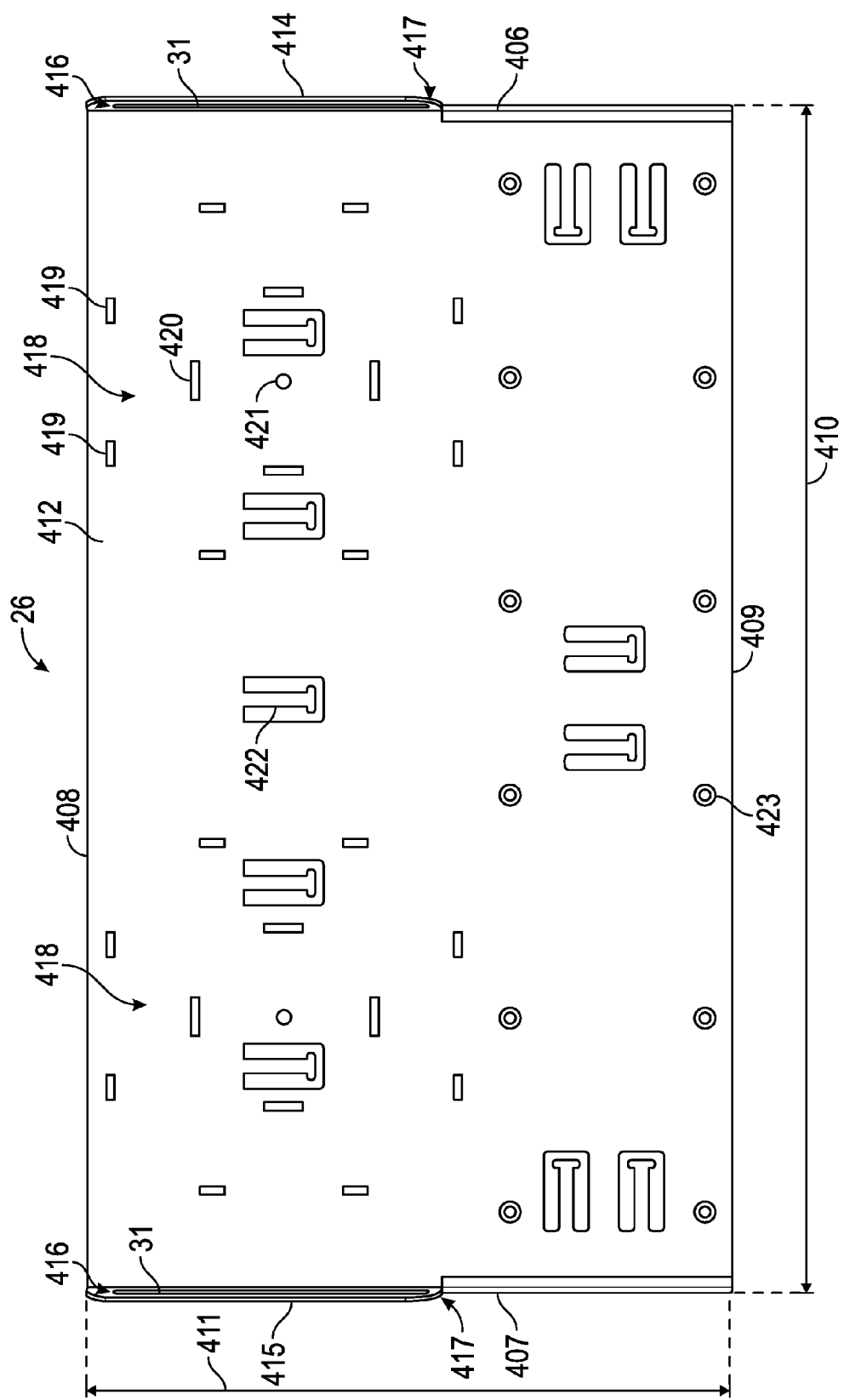
Figure 32:
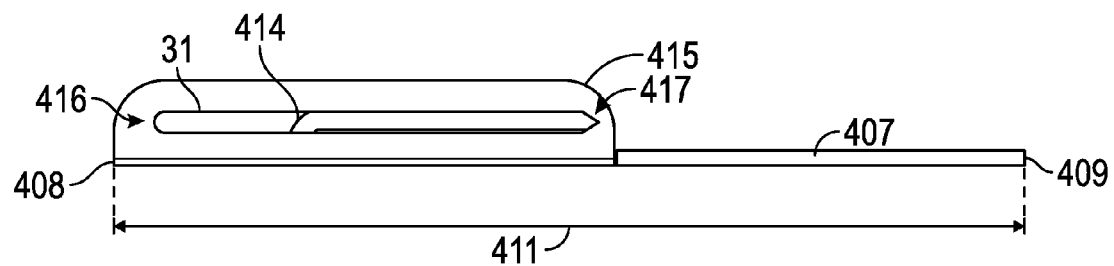
Figure 33:
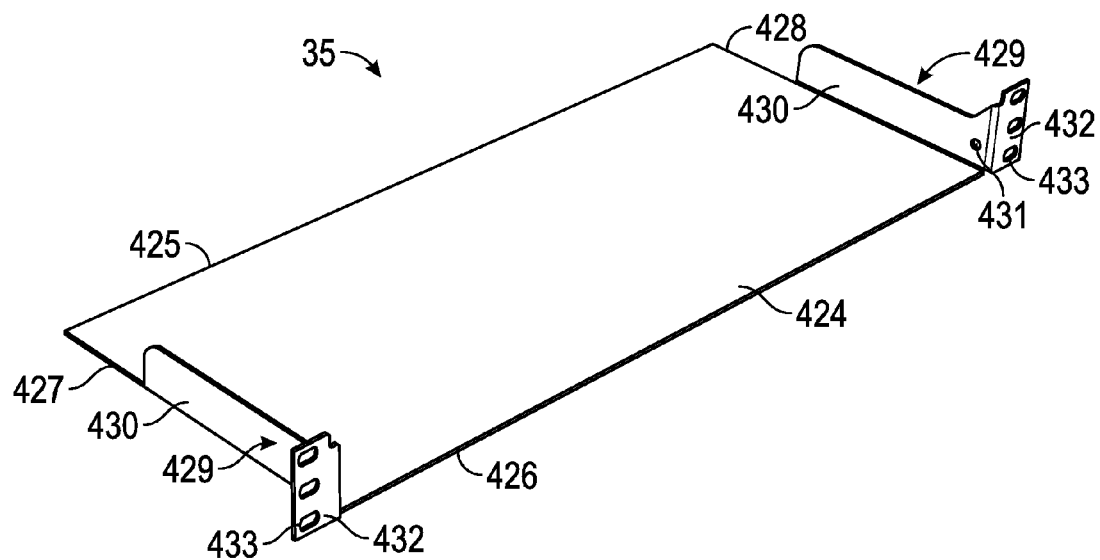
Figure 34:
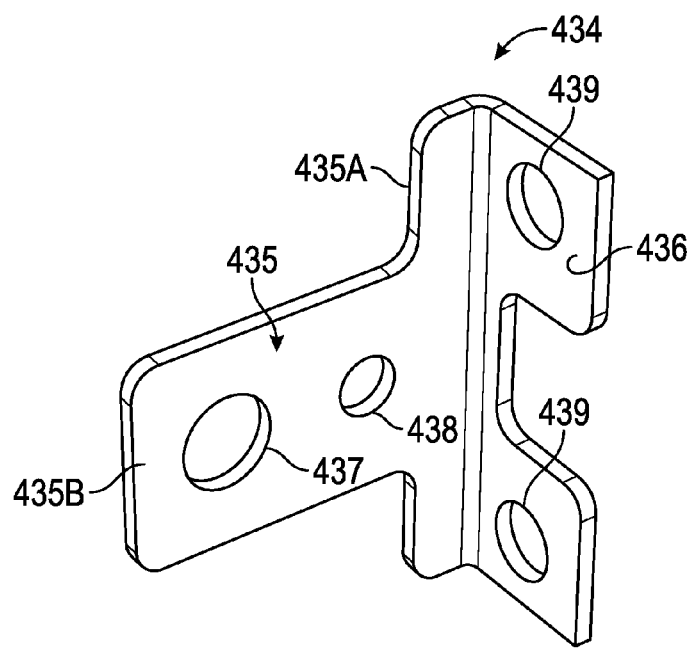
Figure 35:
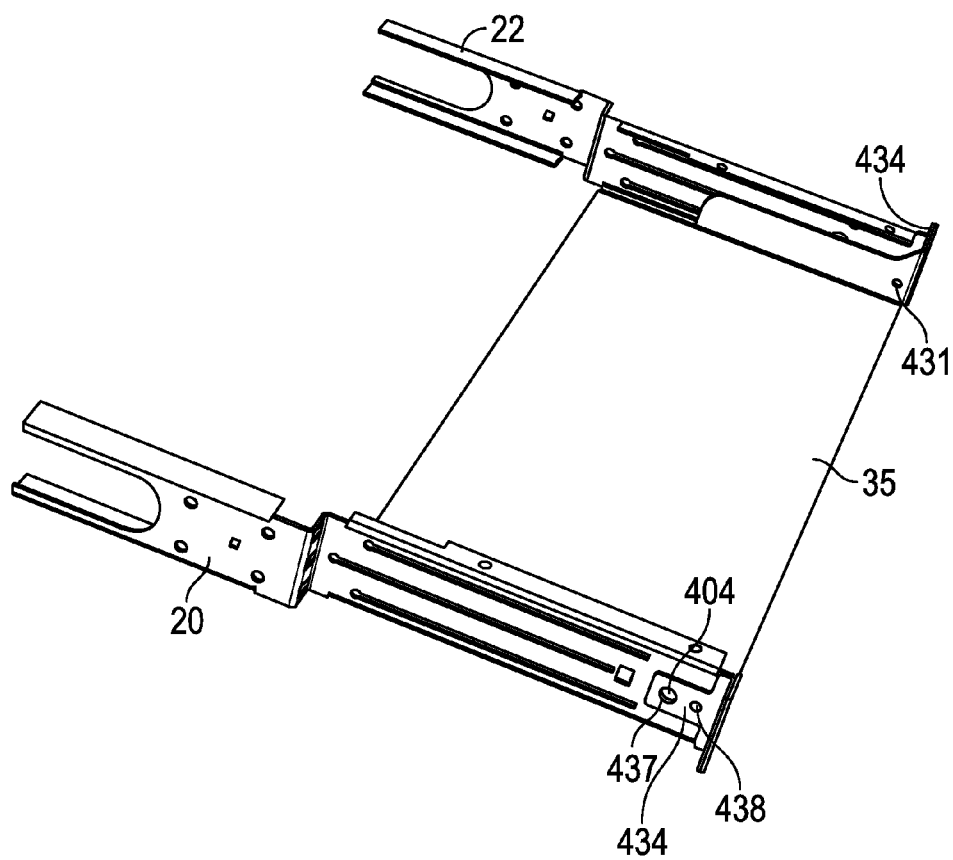
Figure 36:
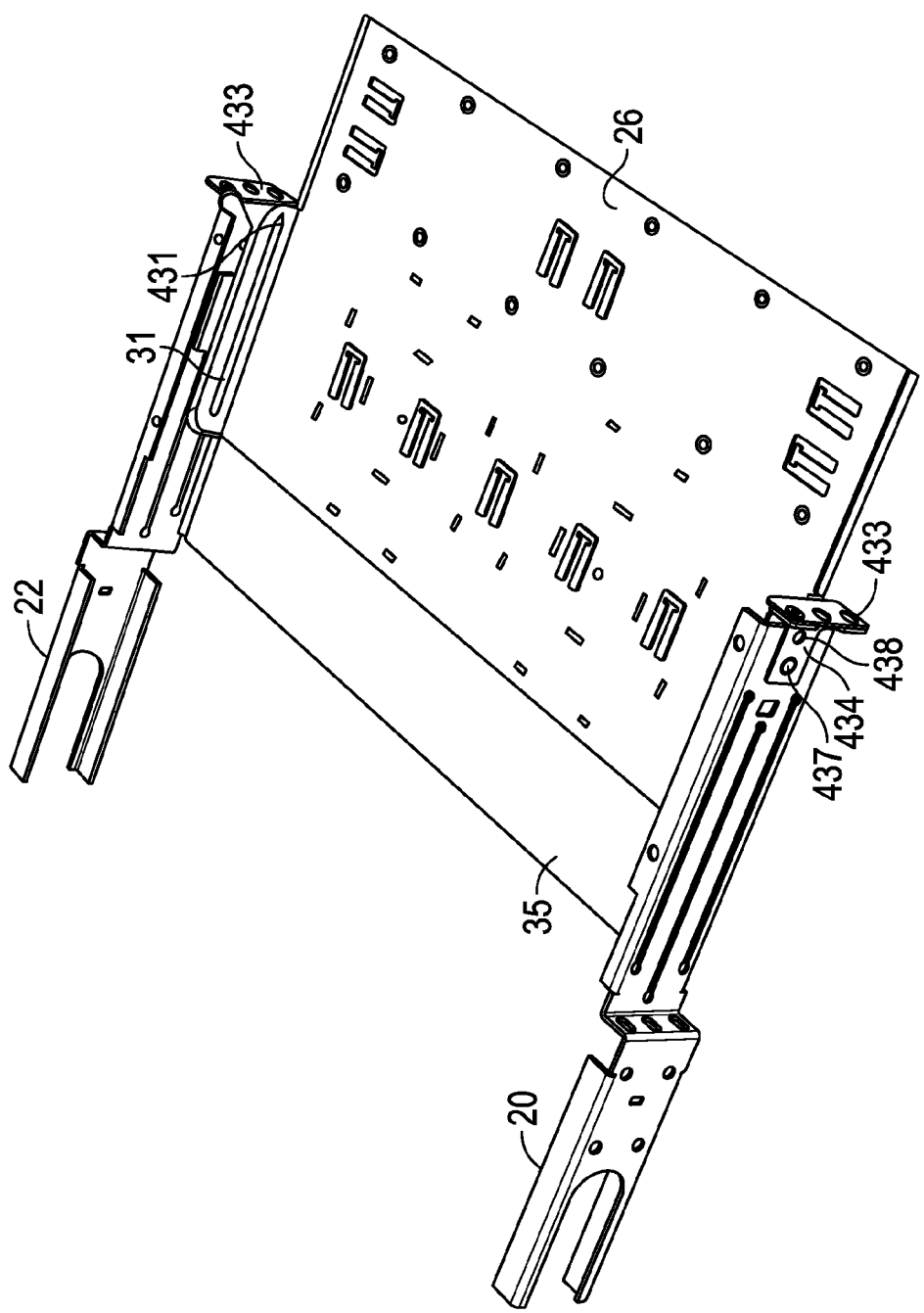
Figure 37:
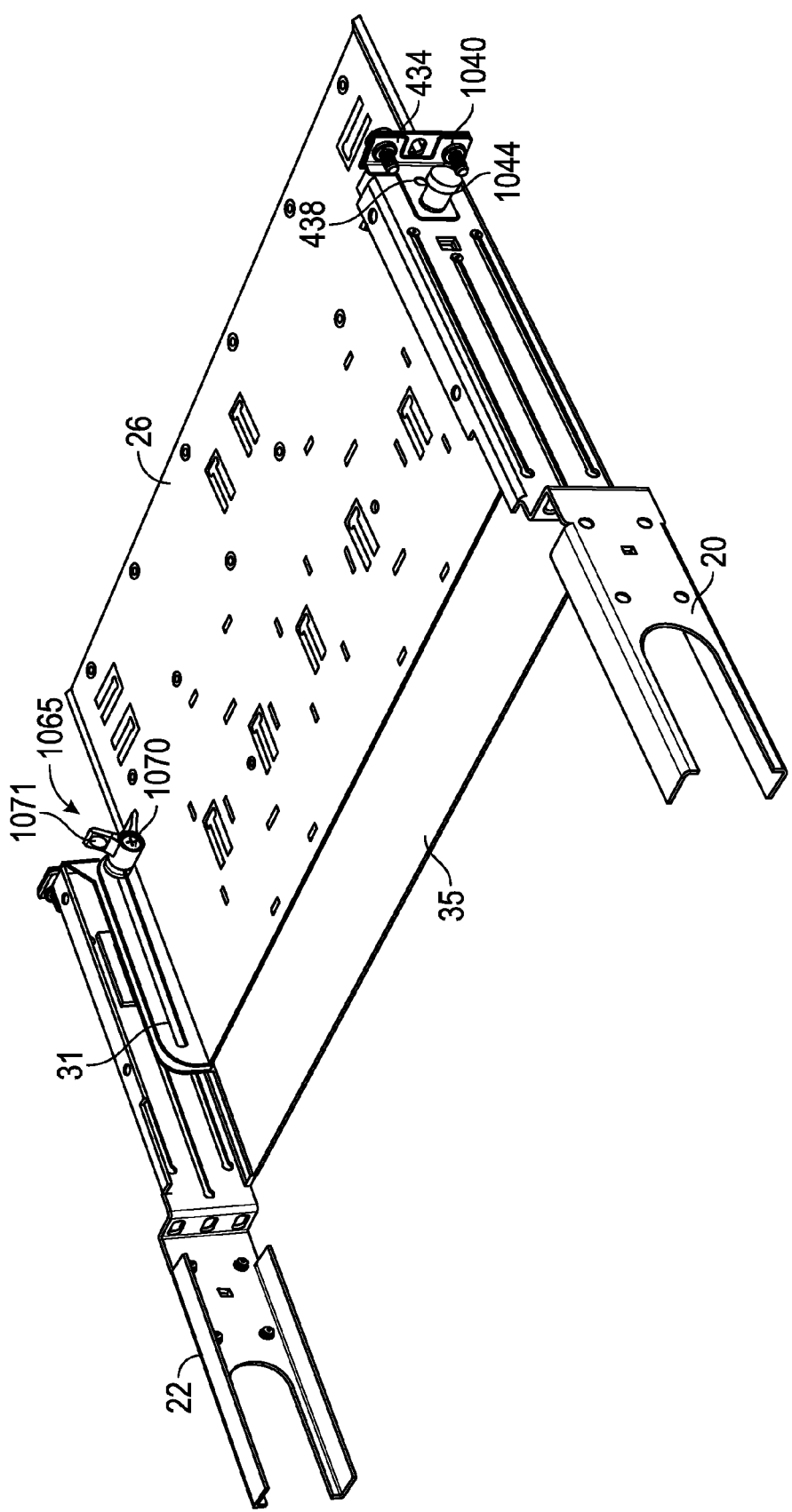
Figure 38:
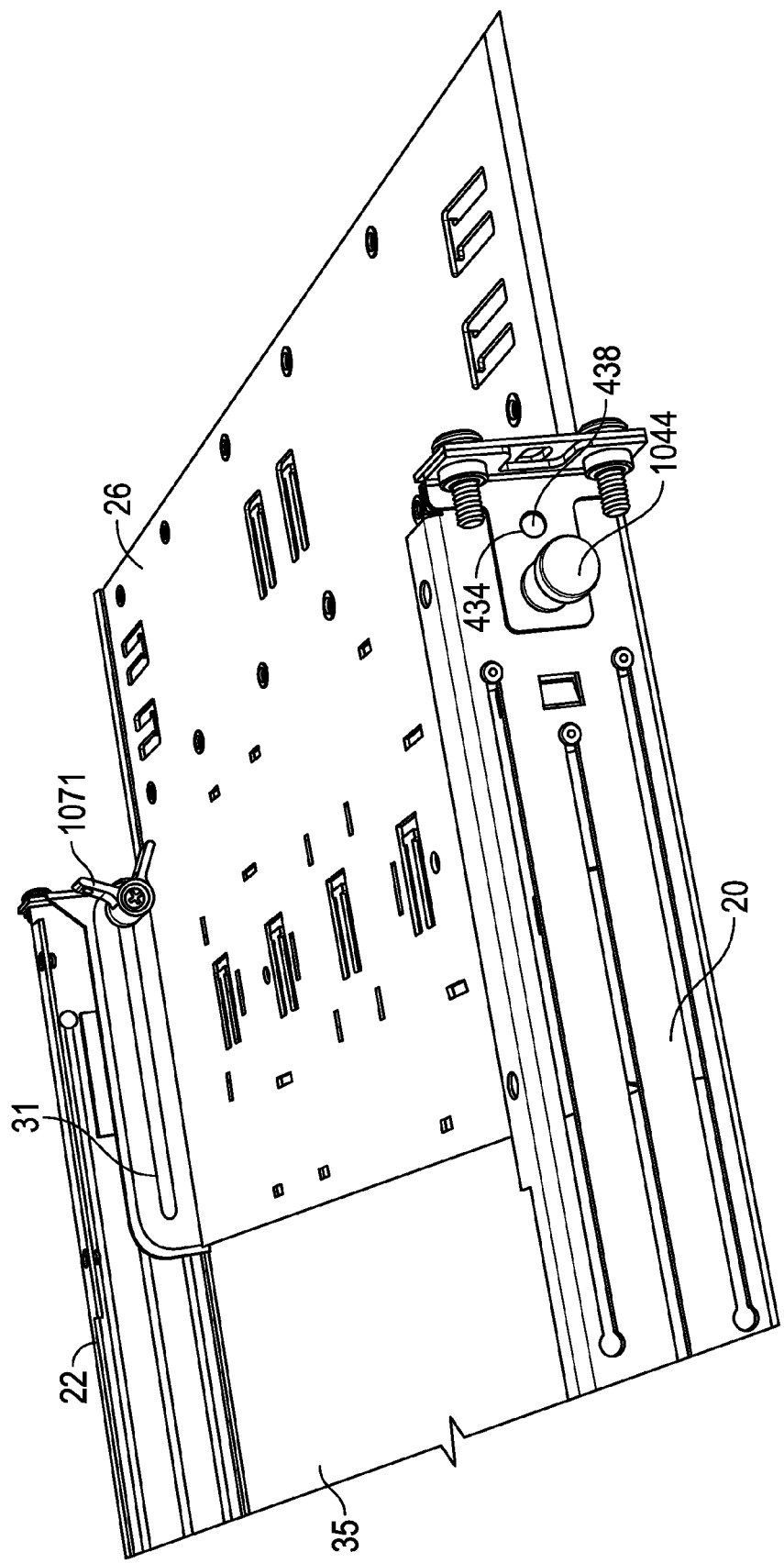
Figure 39:
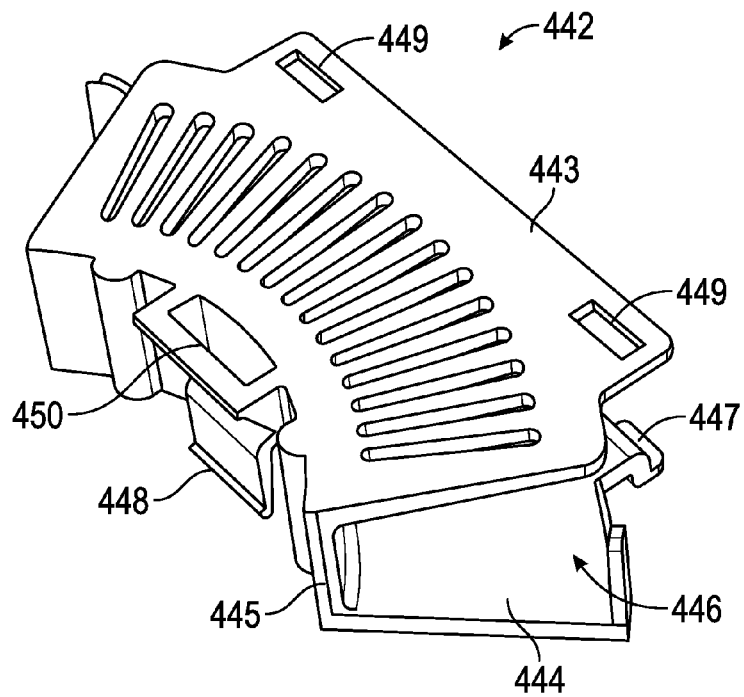
Figure 40:
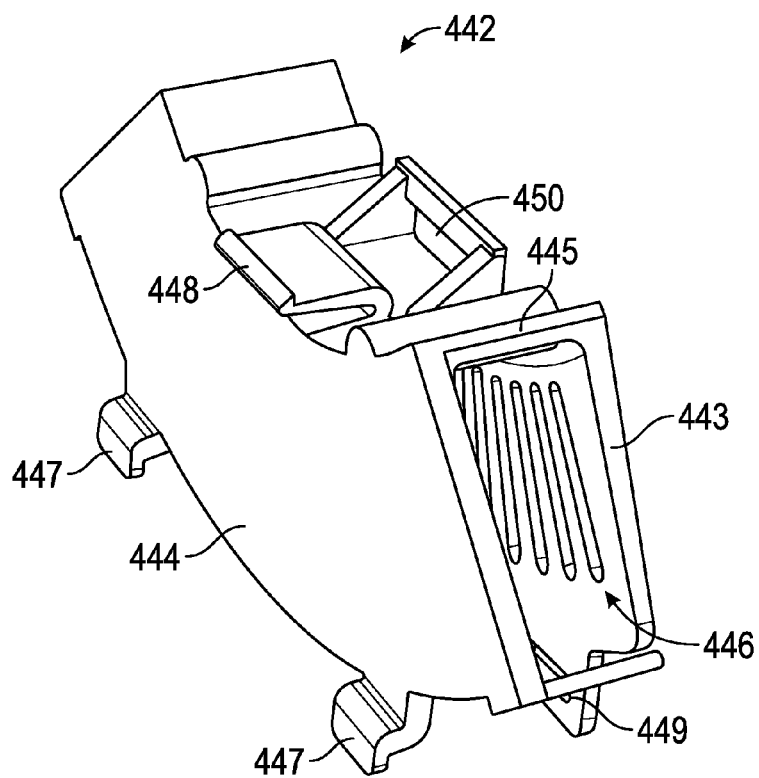
Figure 41:
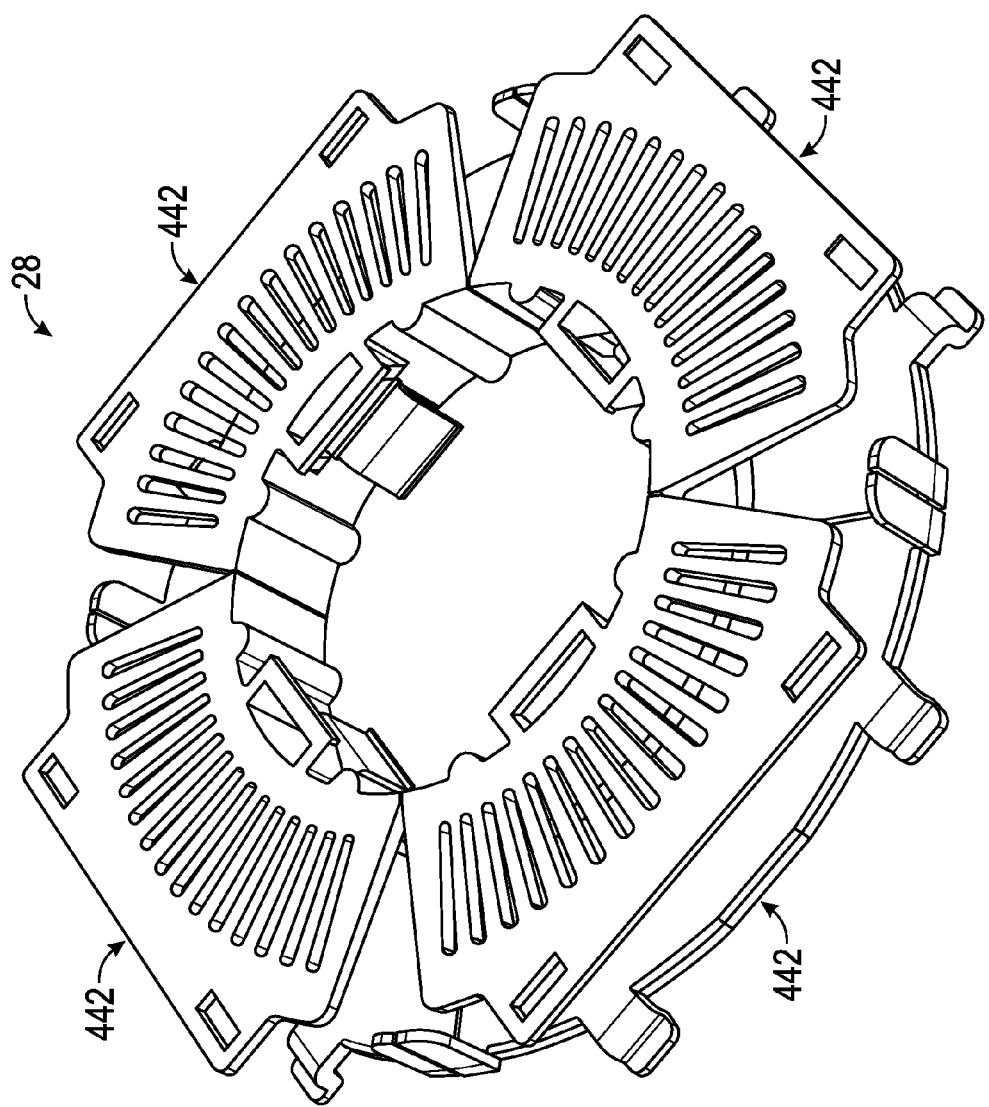
Figure 42:
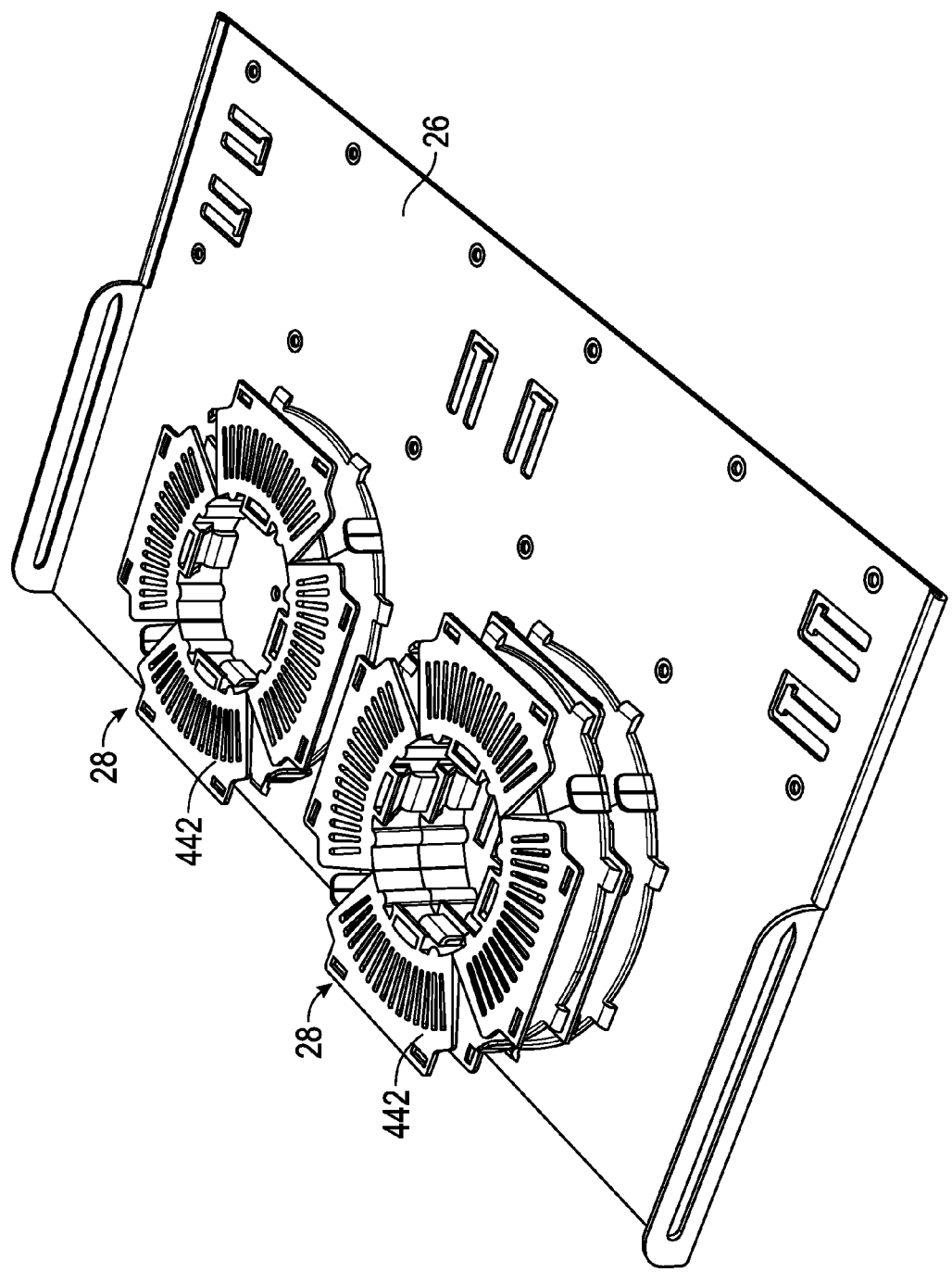
Figure 43:
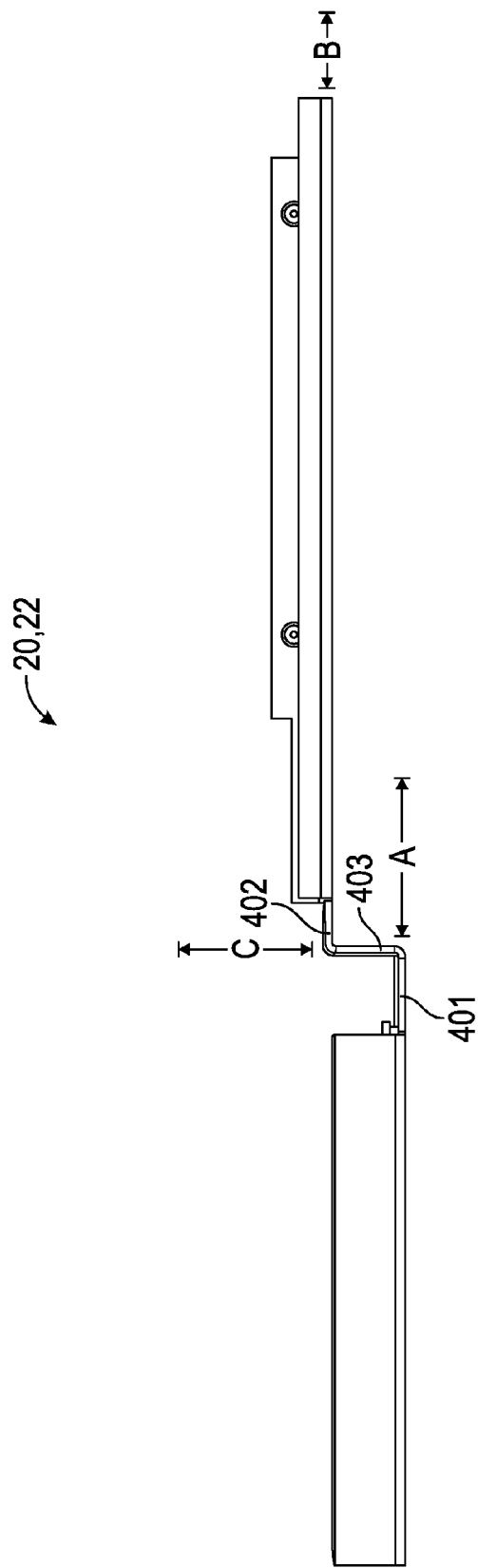
Figure 44:
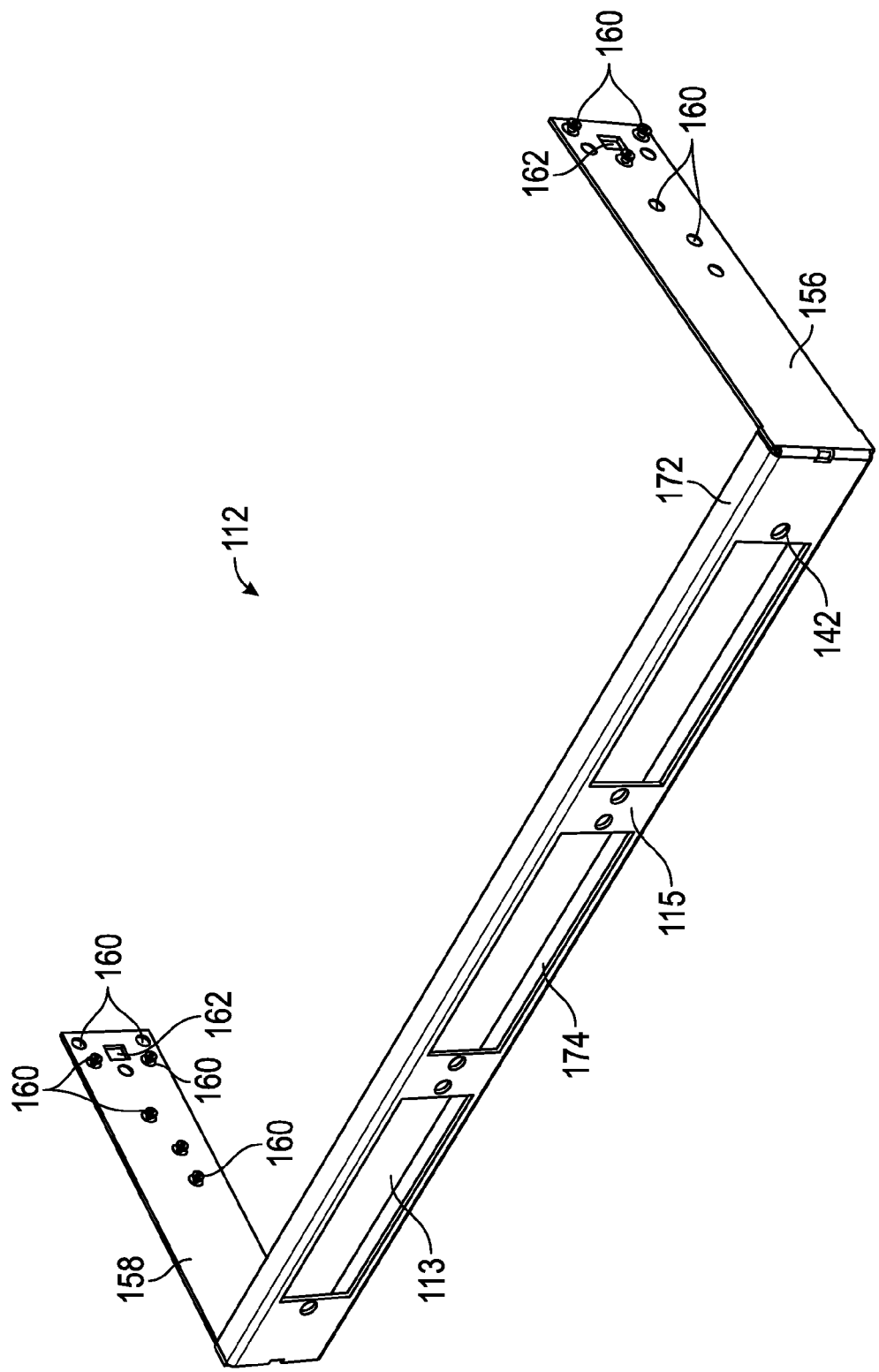
Figure 45:
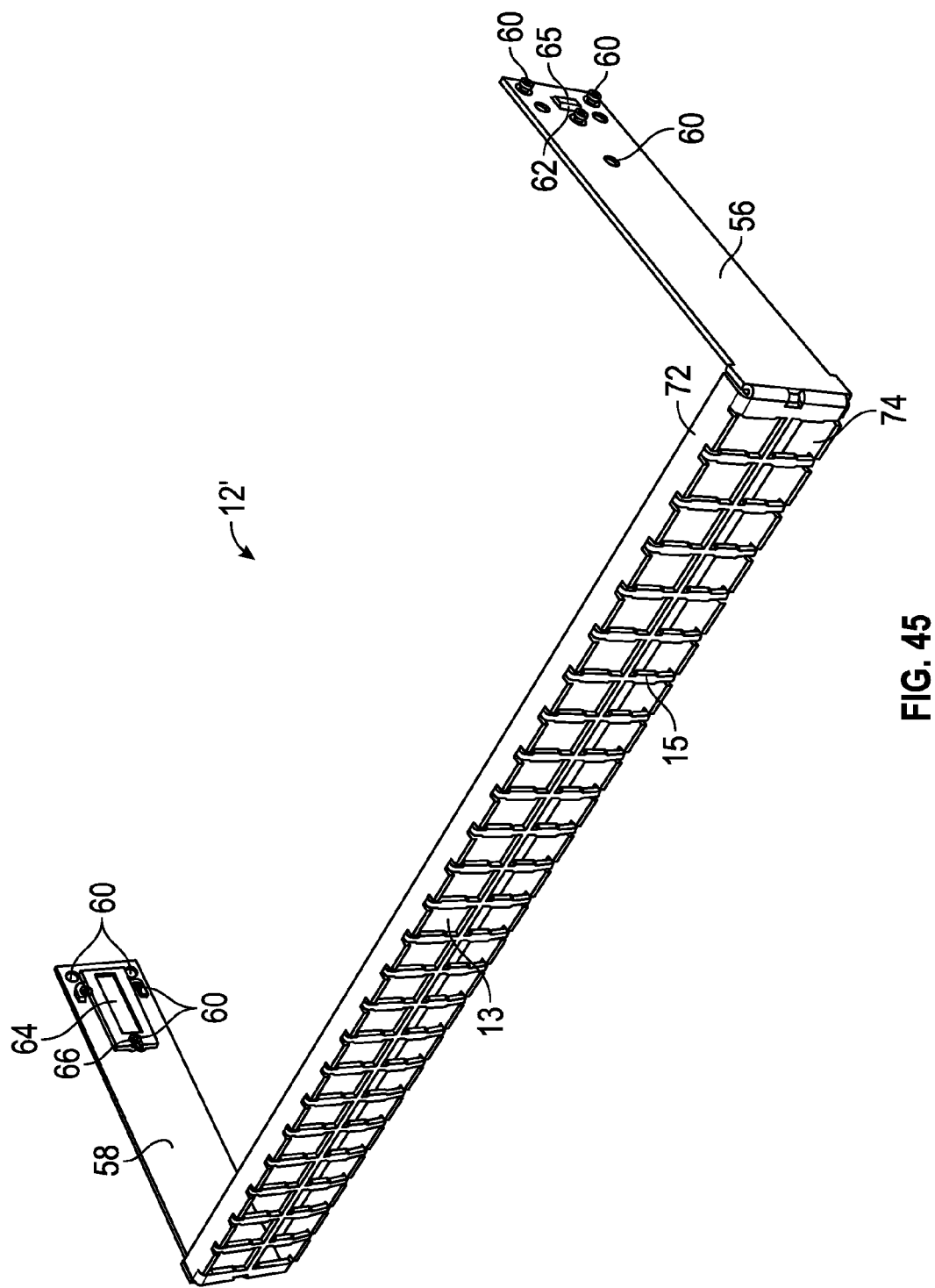
Figure 46:
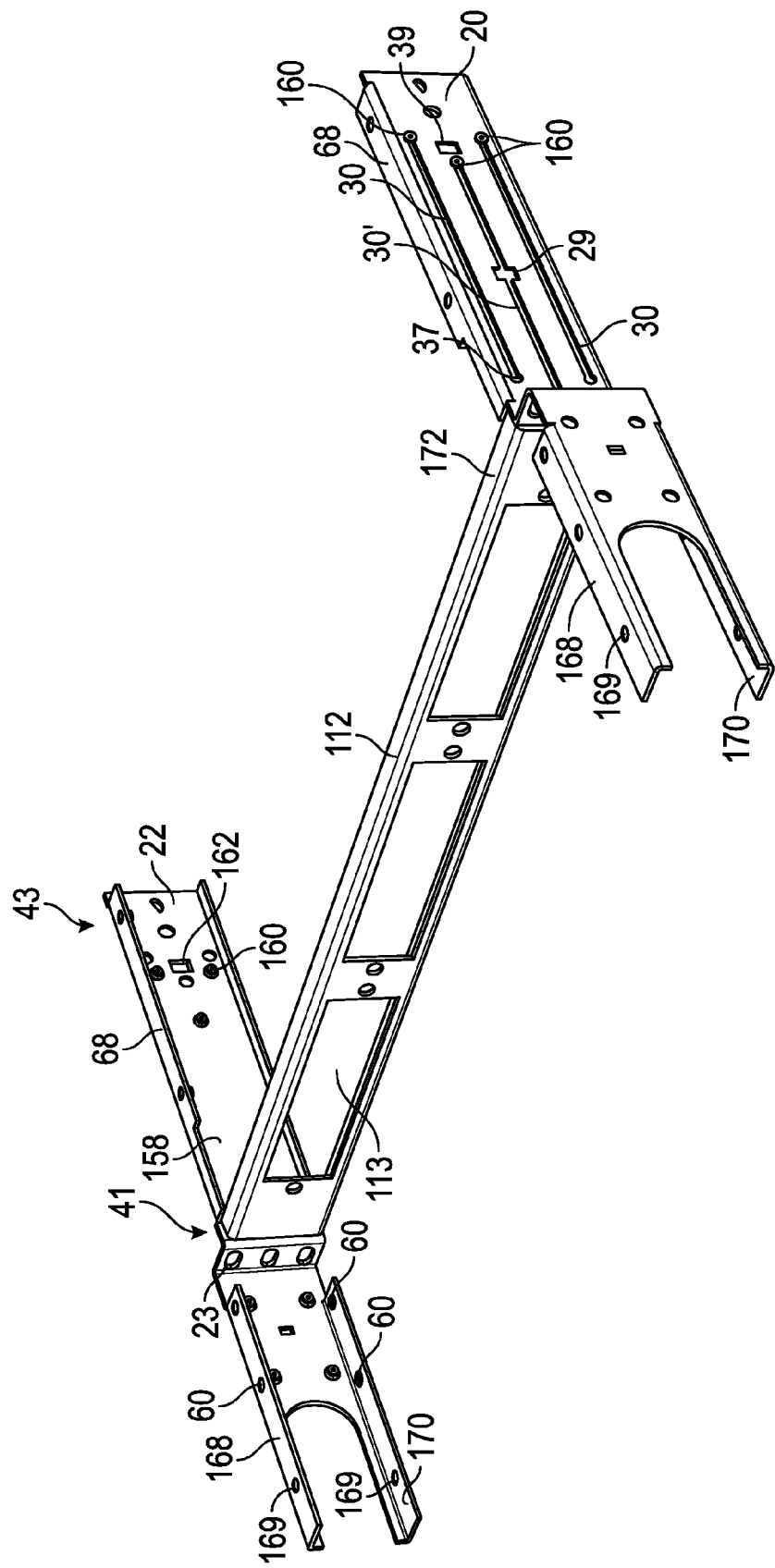
Figure 47:
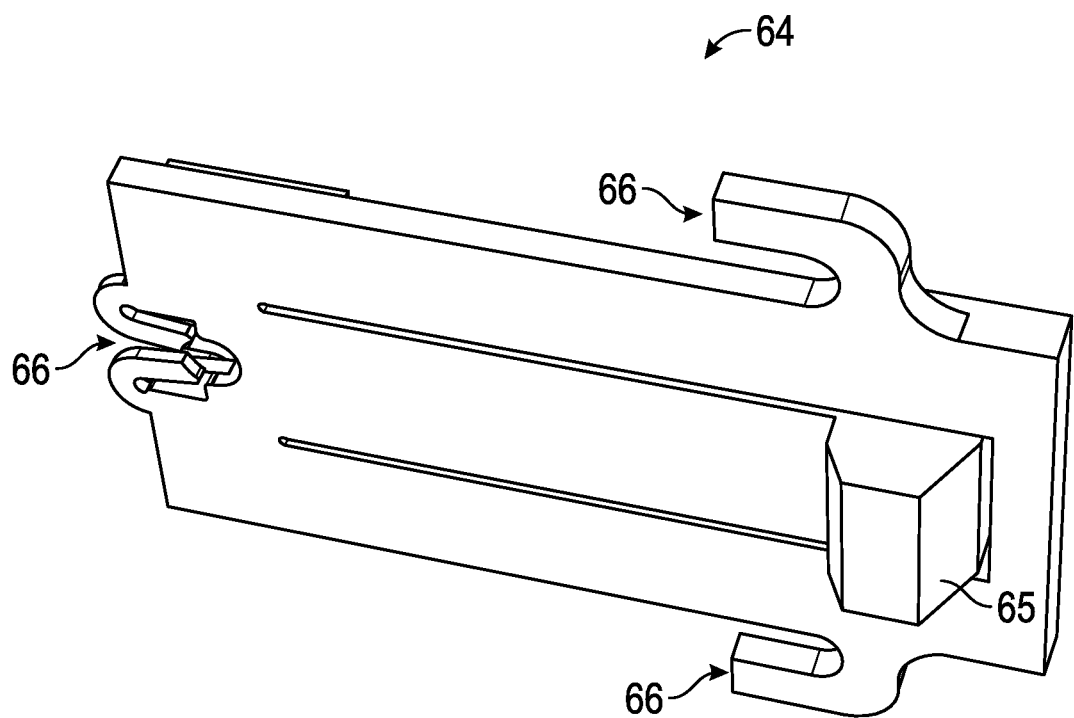
Figure 48:
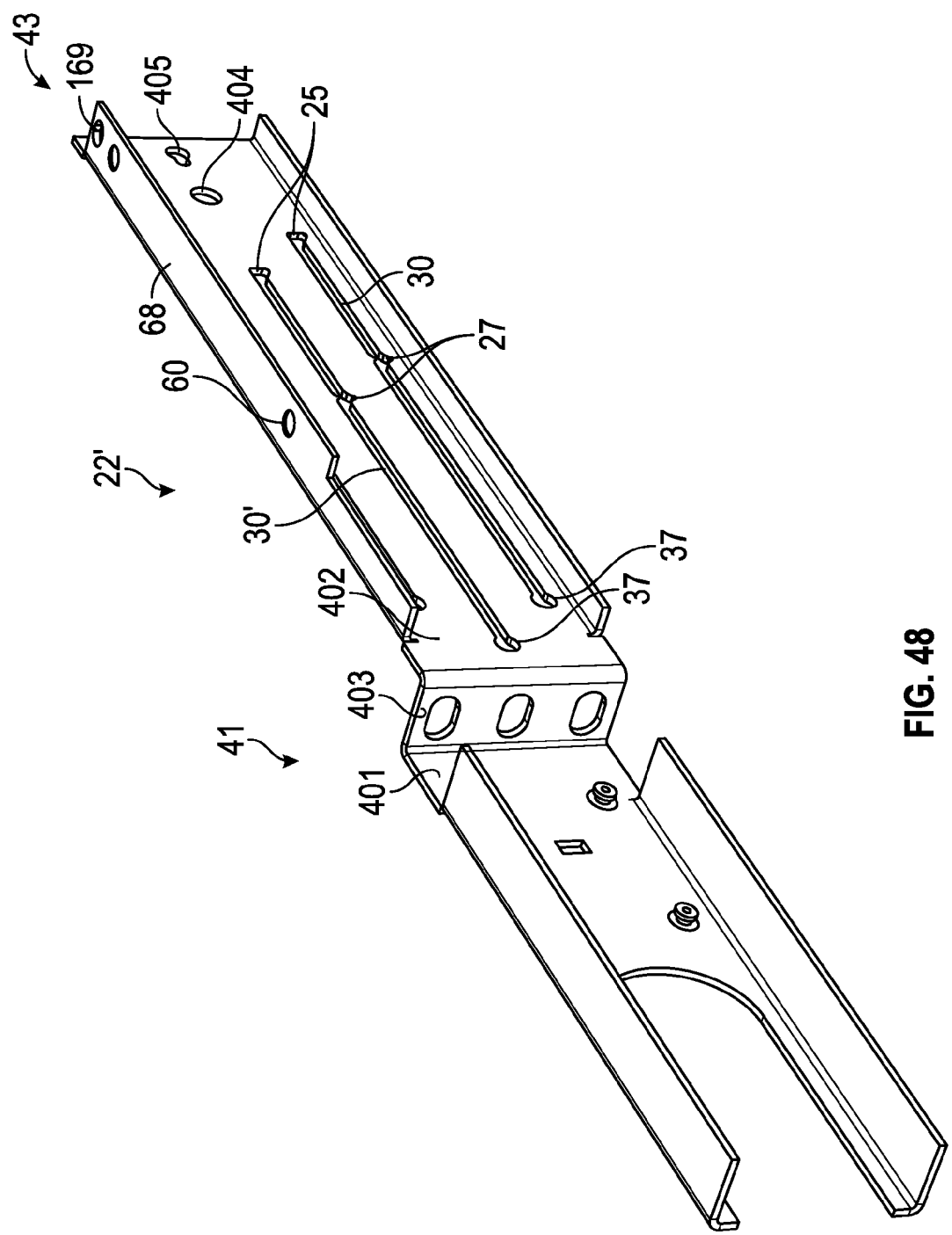
Figure 49:
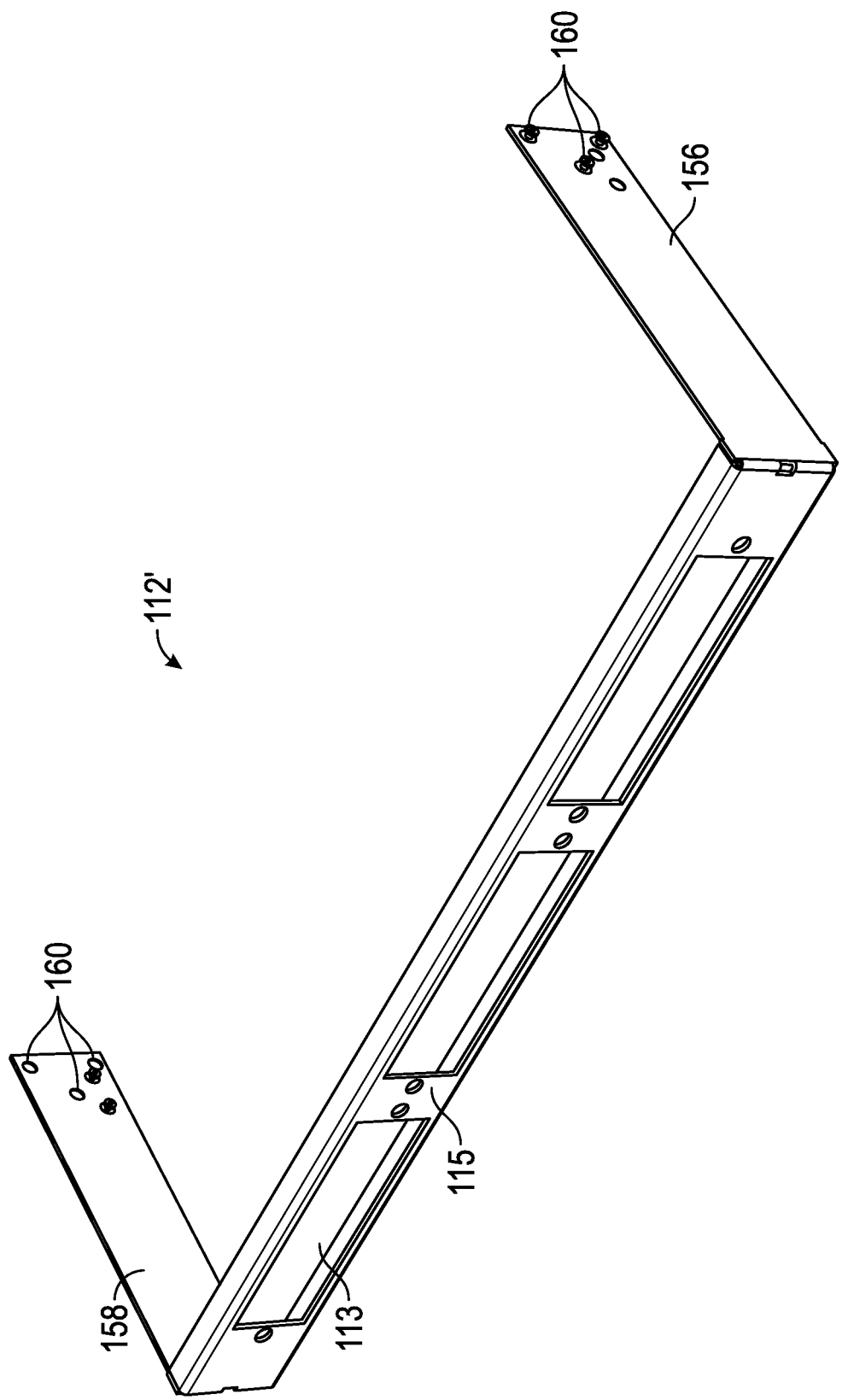
Figure 50:
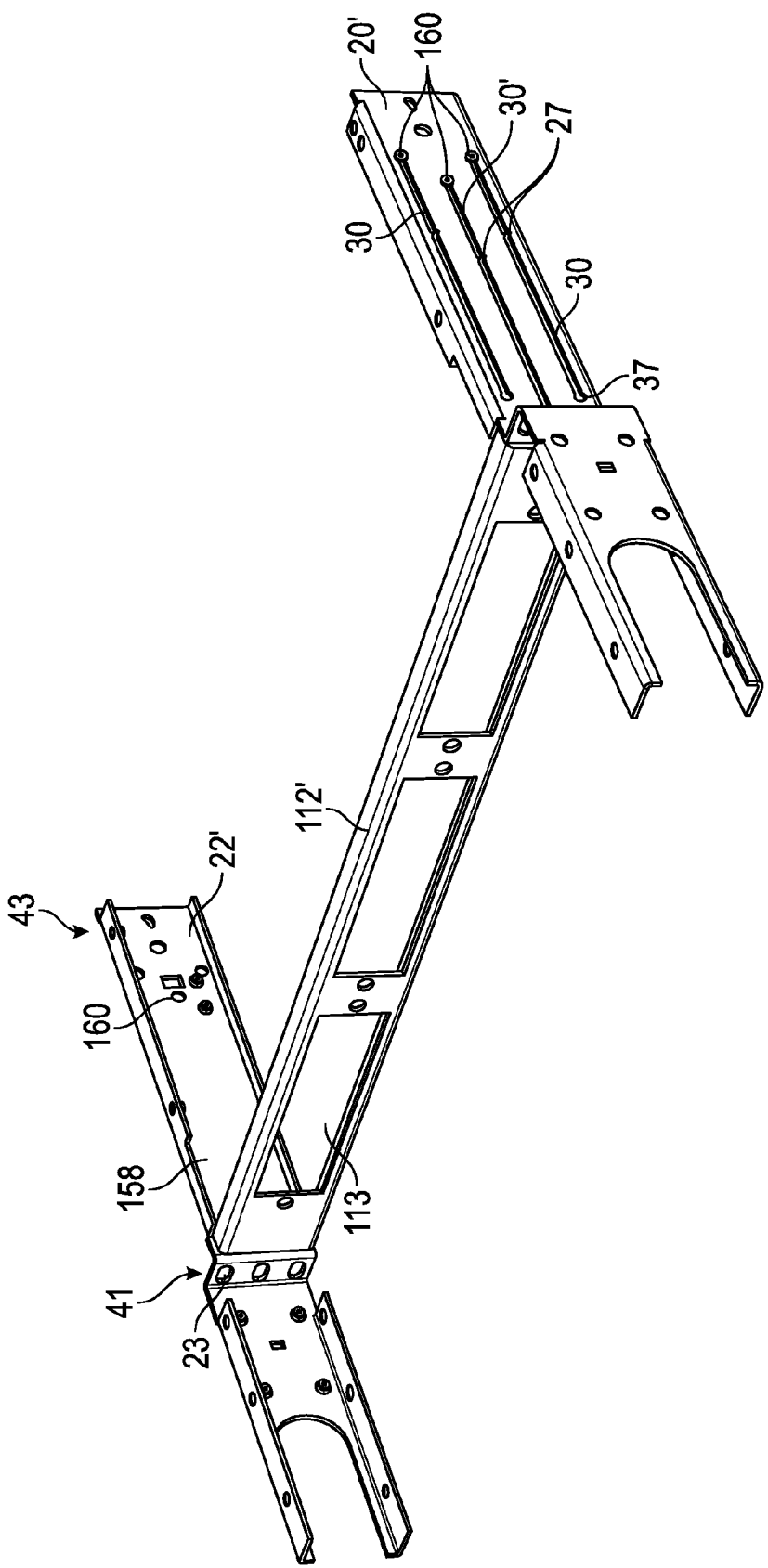
Figure 51:
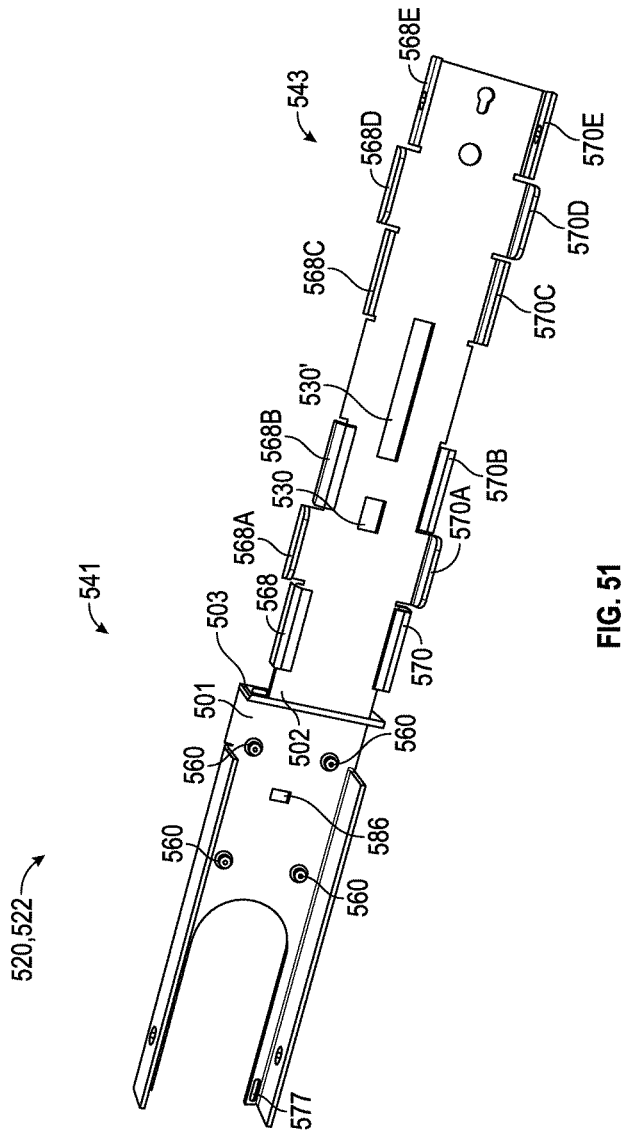
Figure 52:
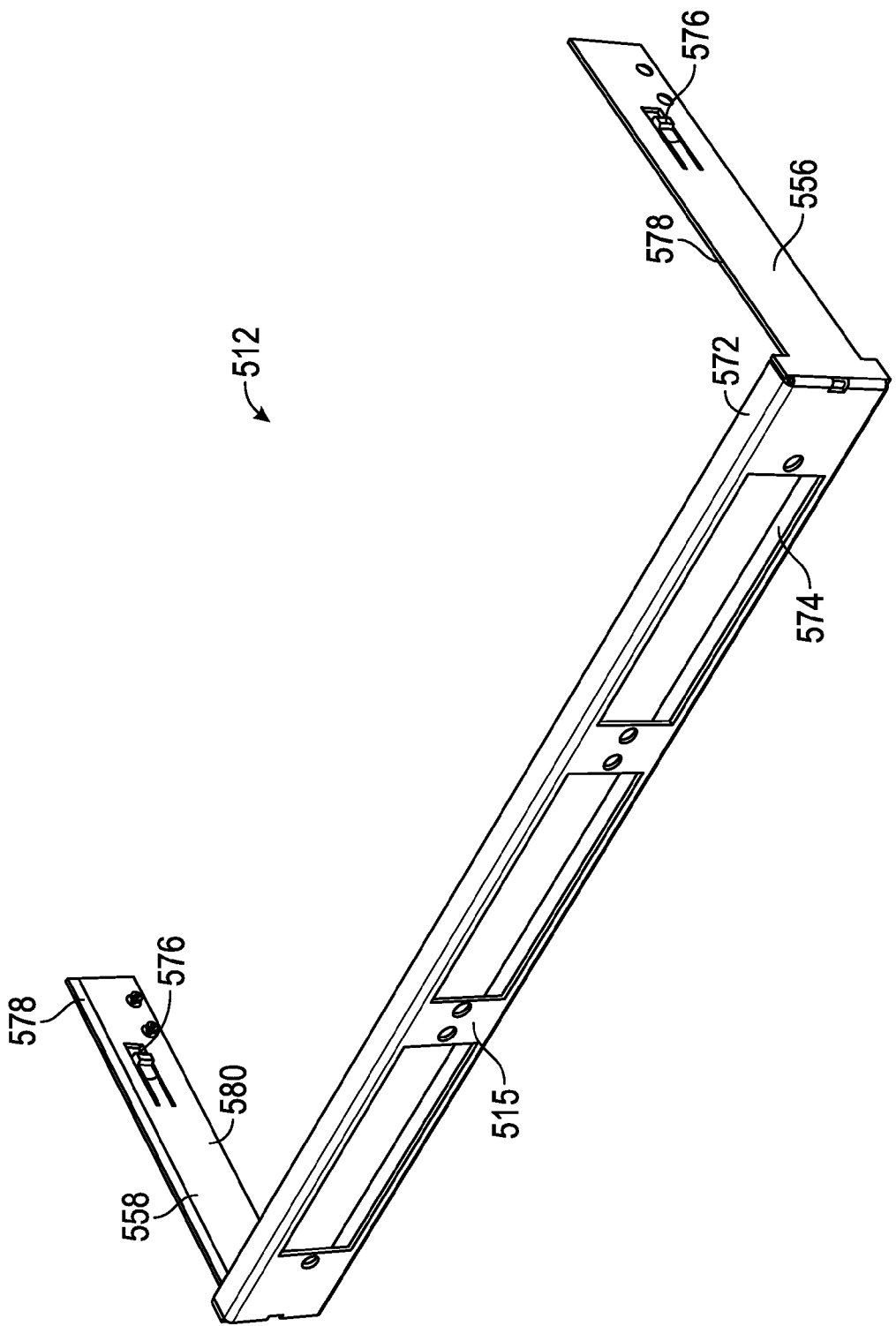
Figure 53:
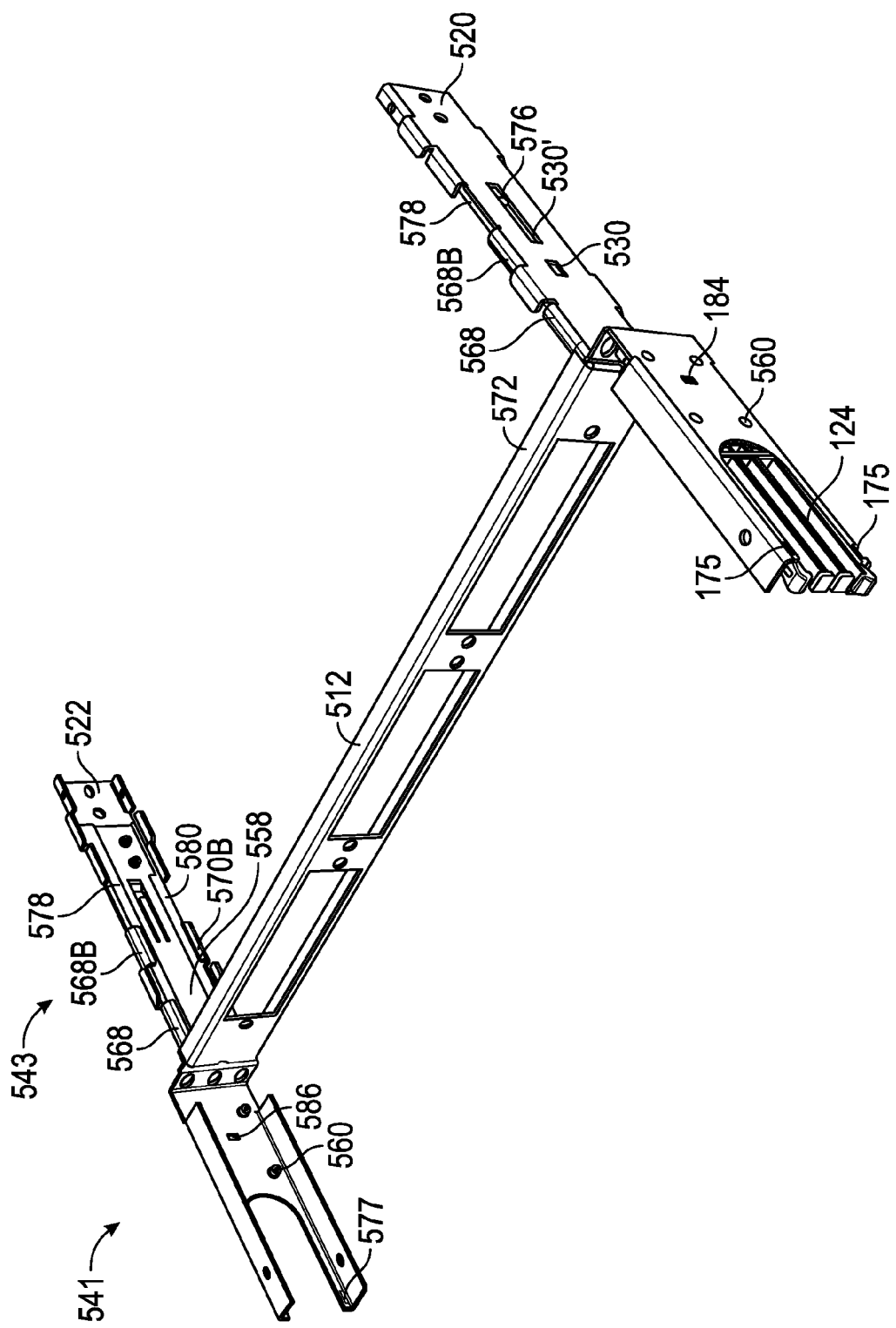
Figure 54:
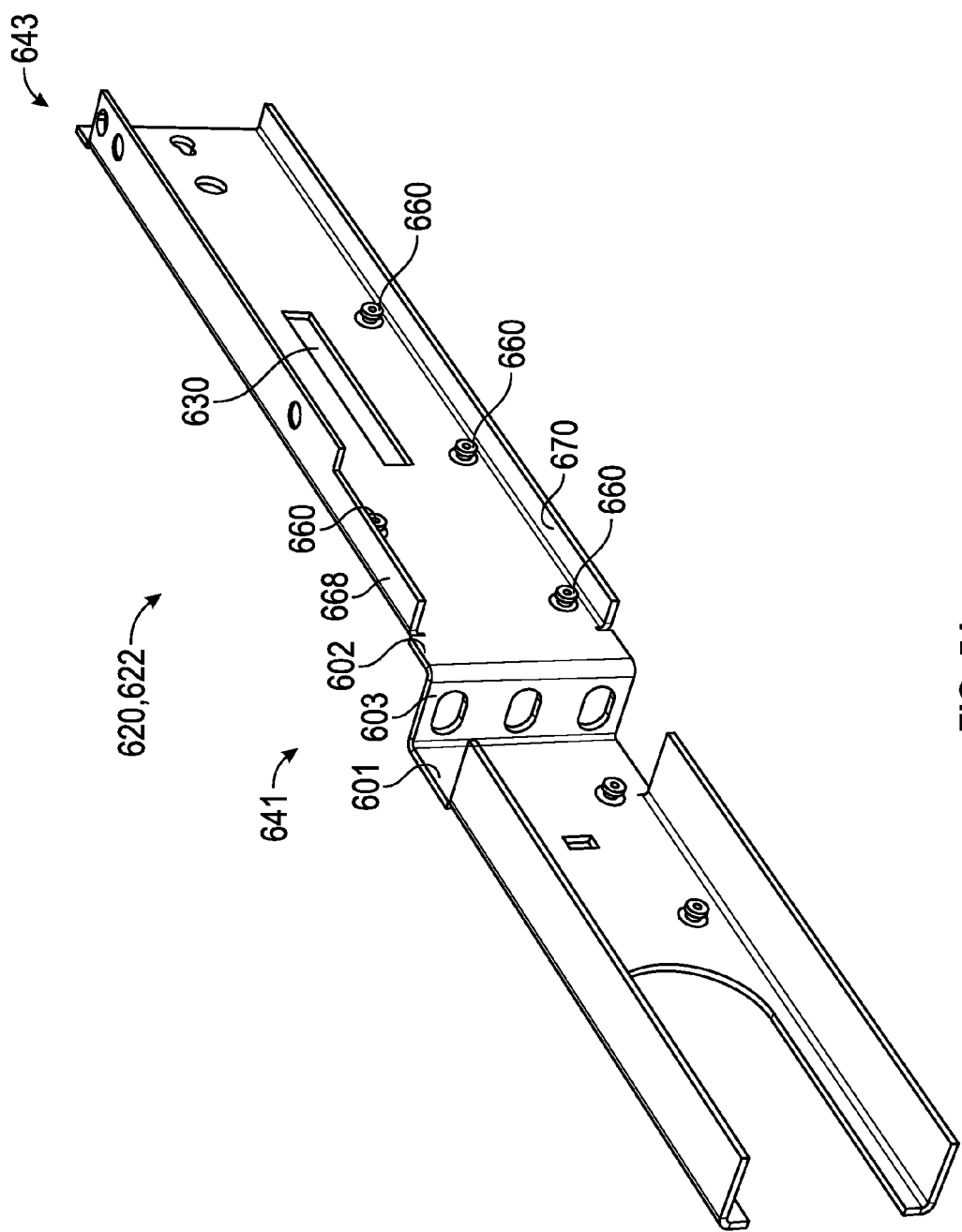
Figure 55:
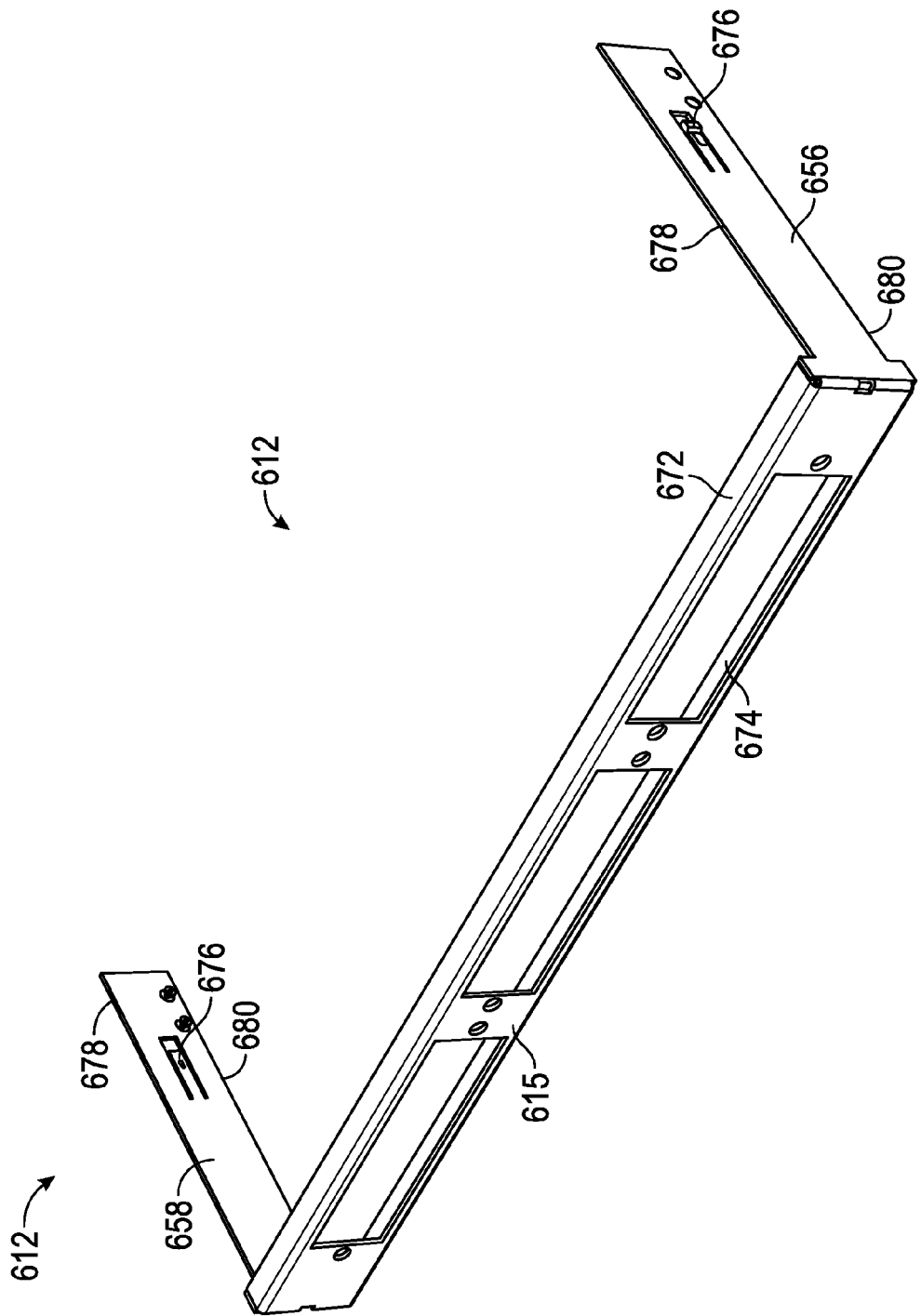
Figure 56:
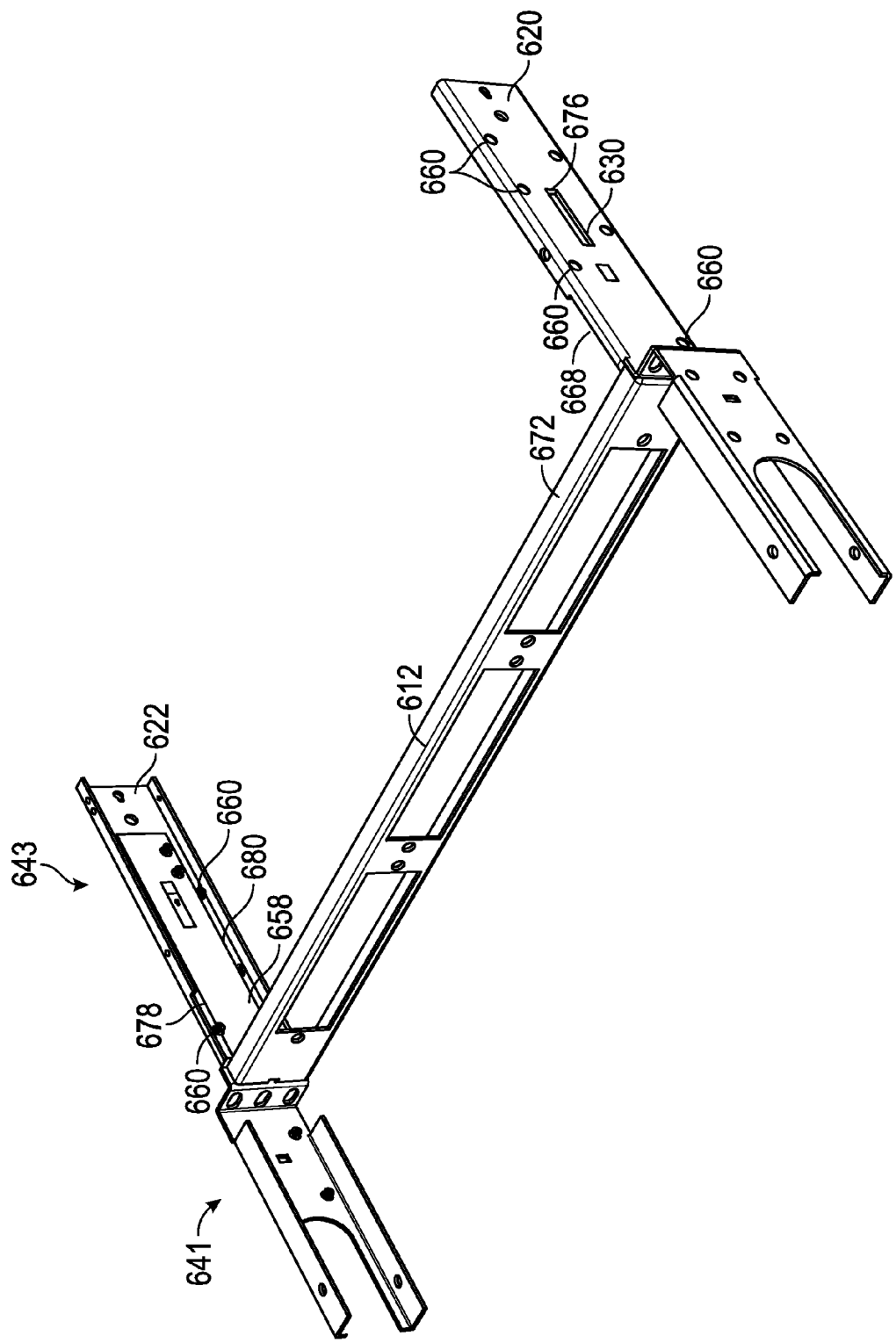
Figure 57:
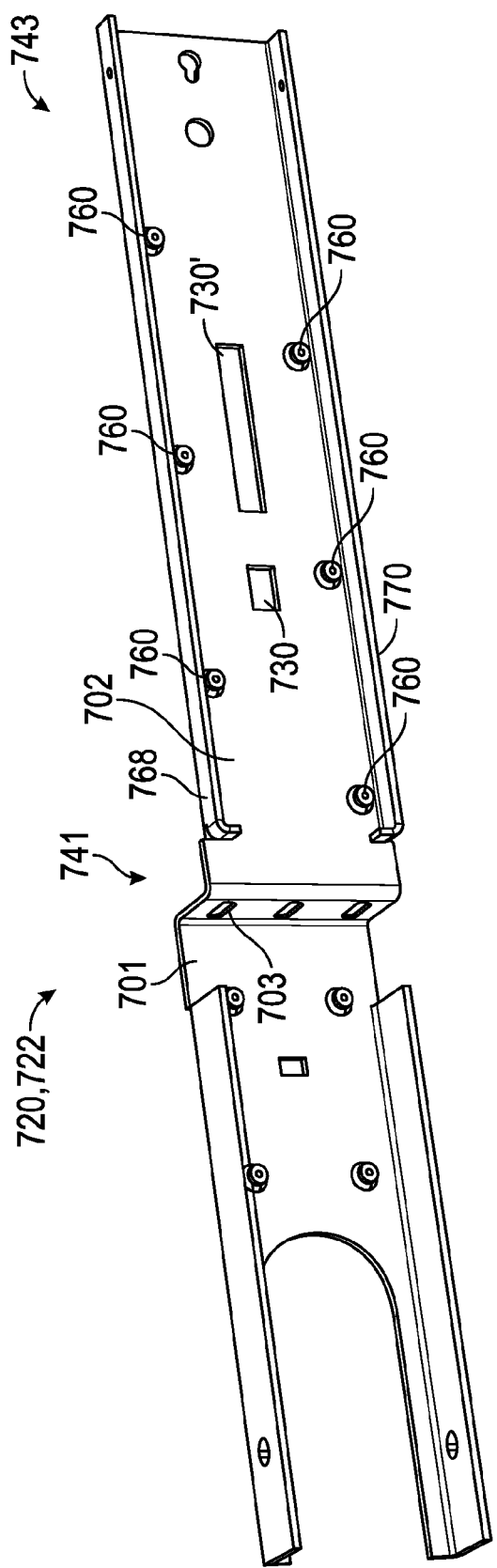
Figure 58:
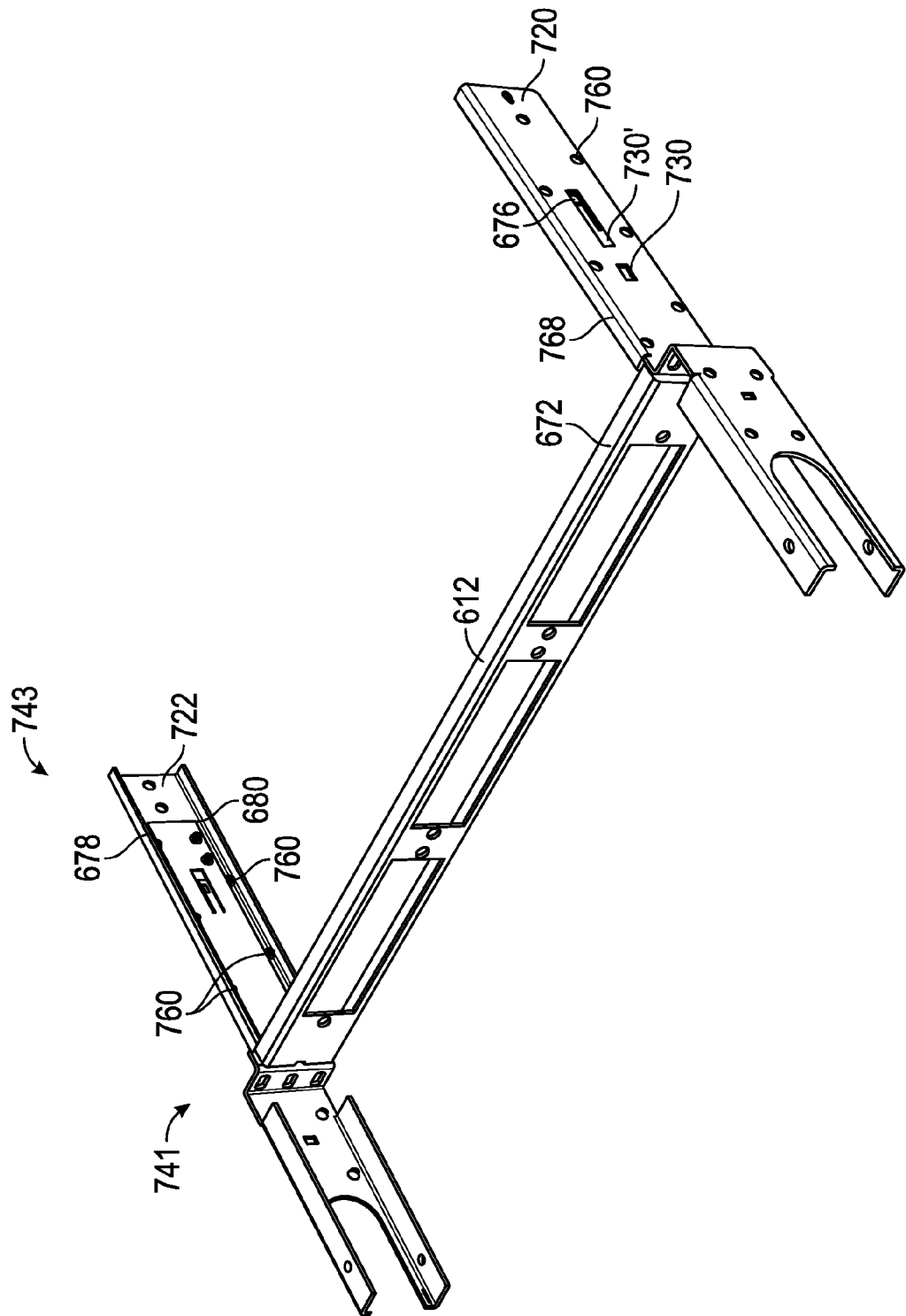
Figure 59:
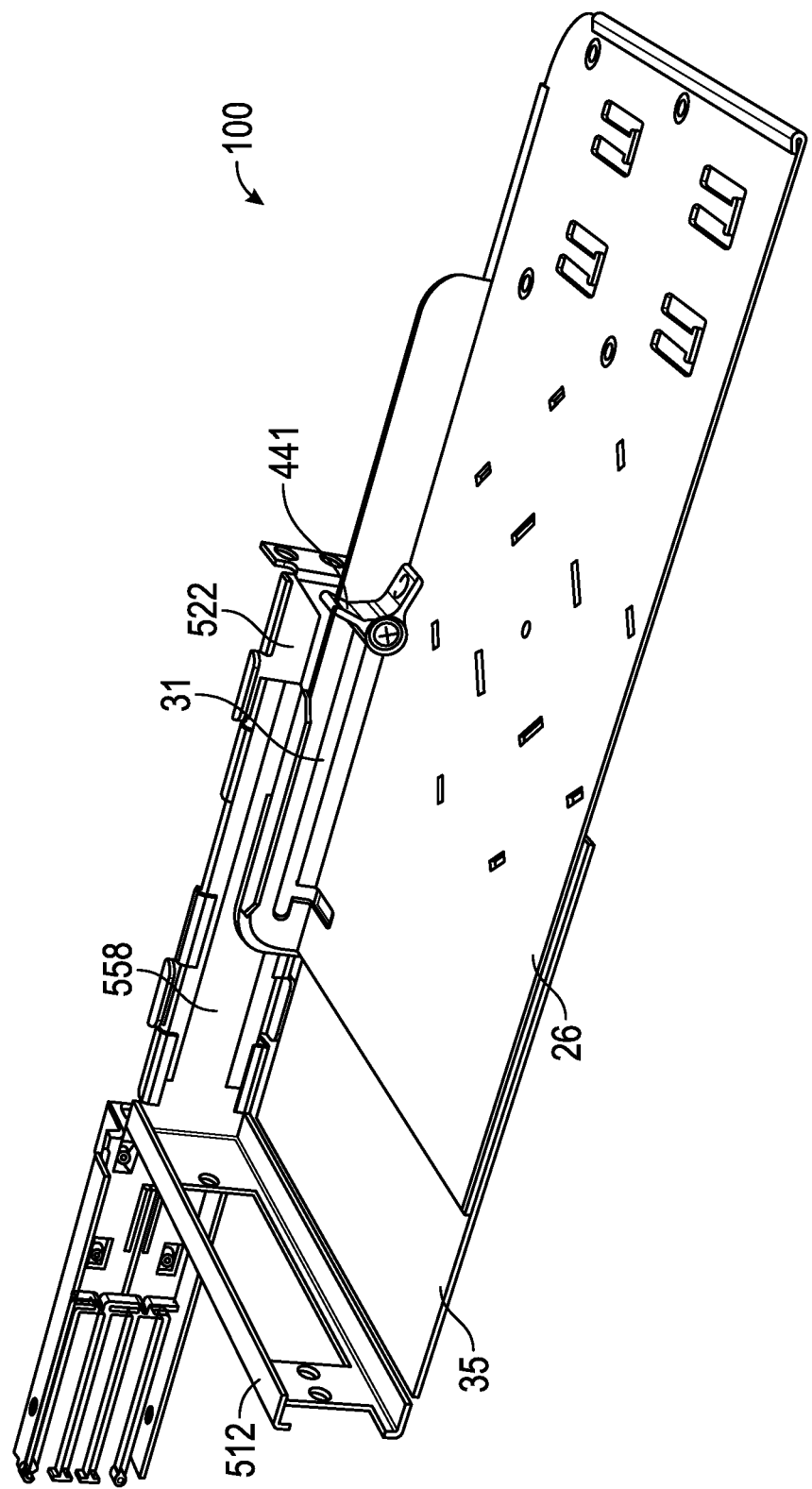
Figure 60:
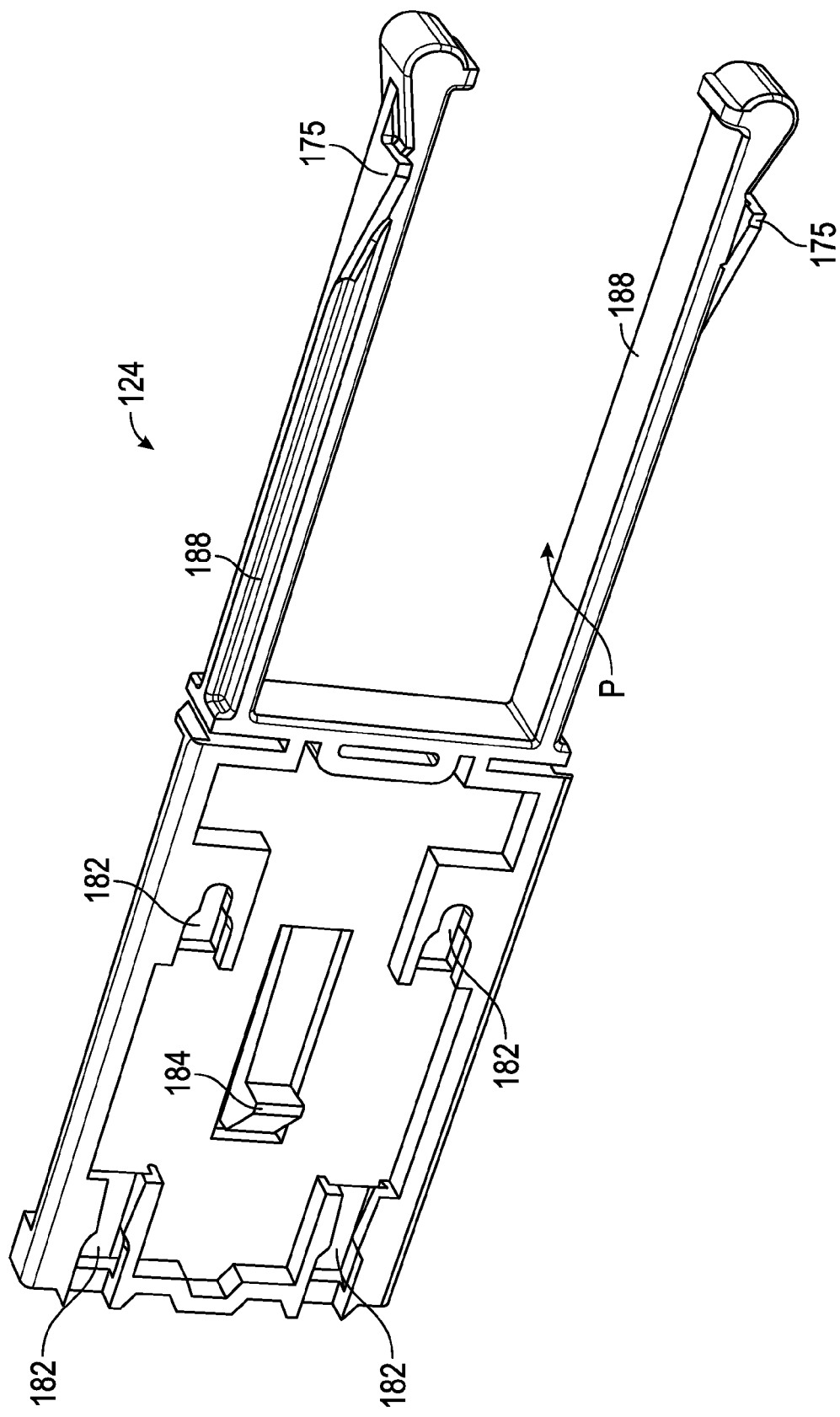
Figure 61:
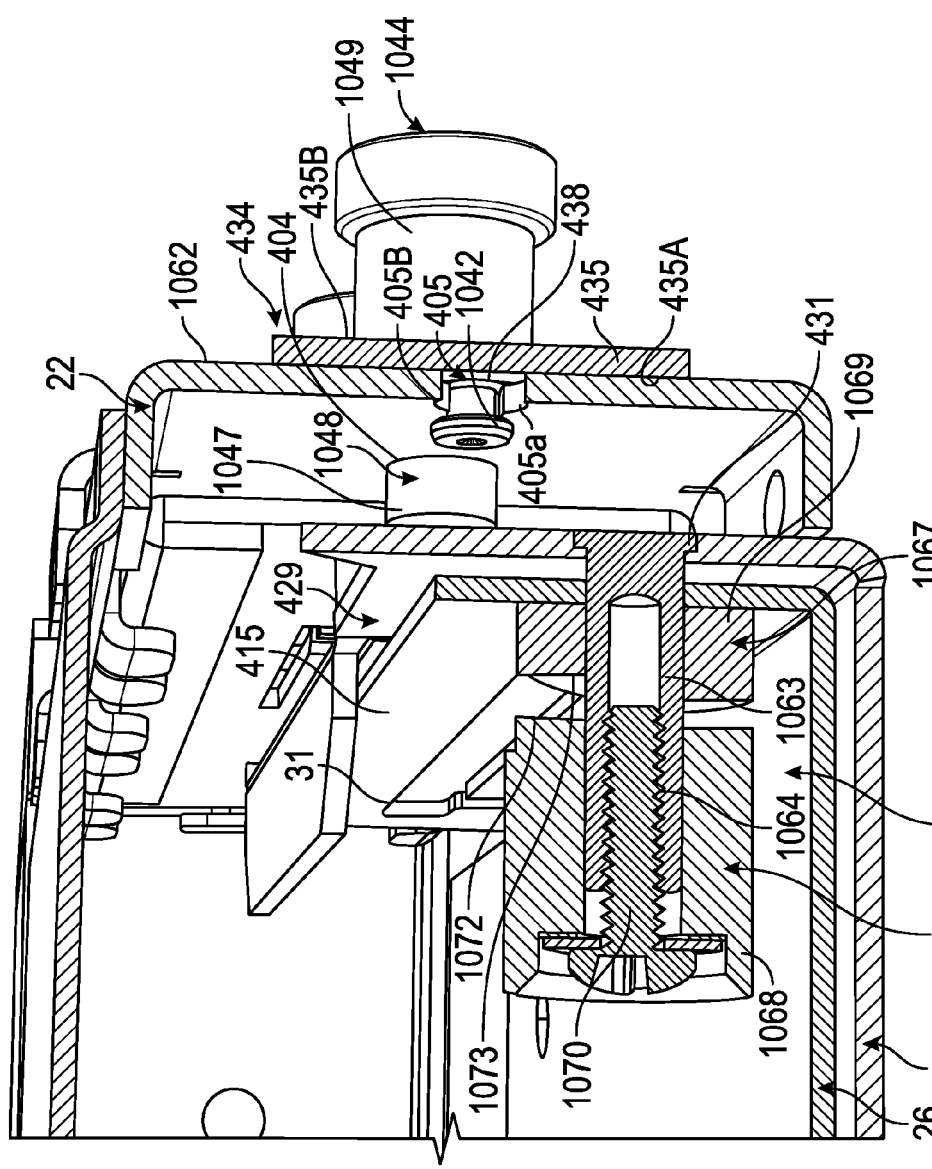
Figure 62:
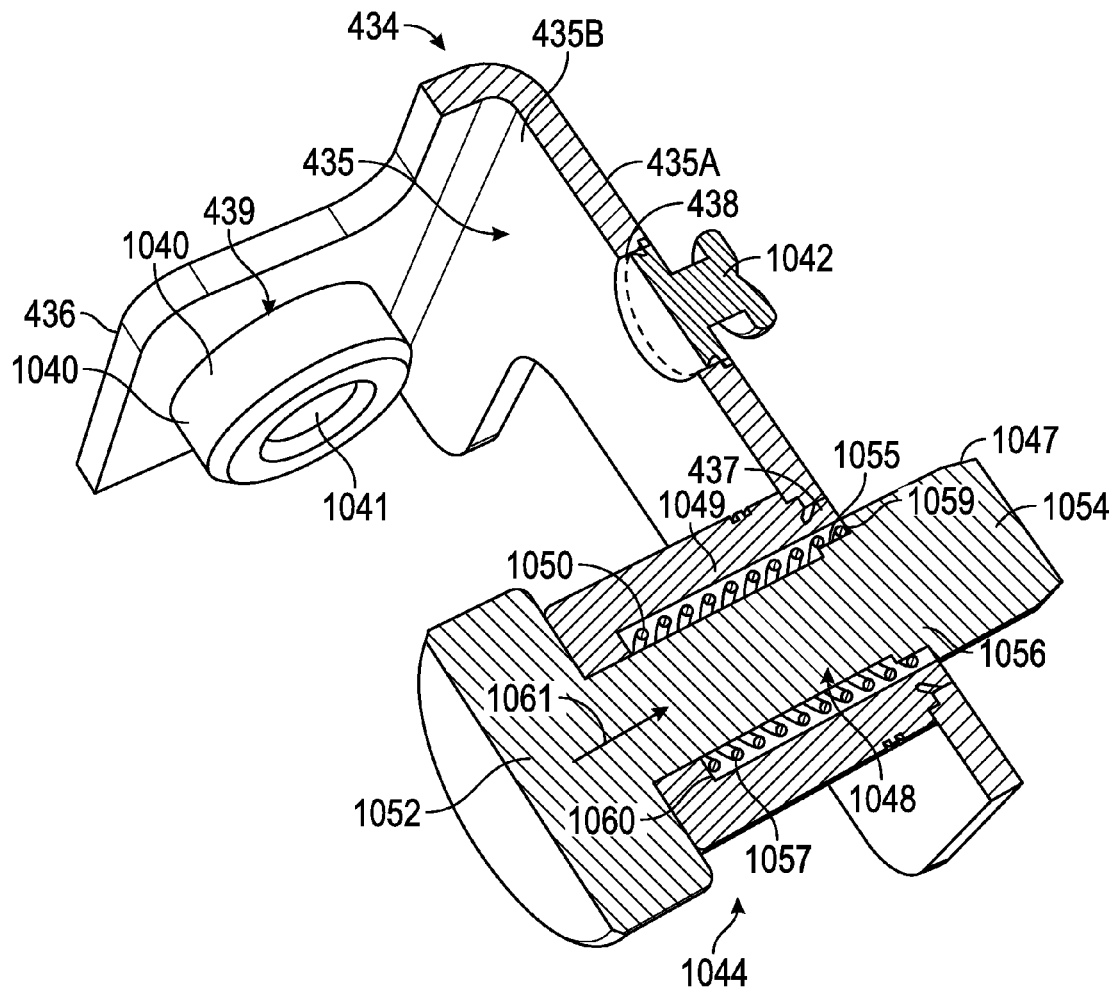
Figure 63:
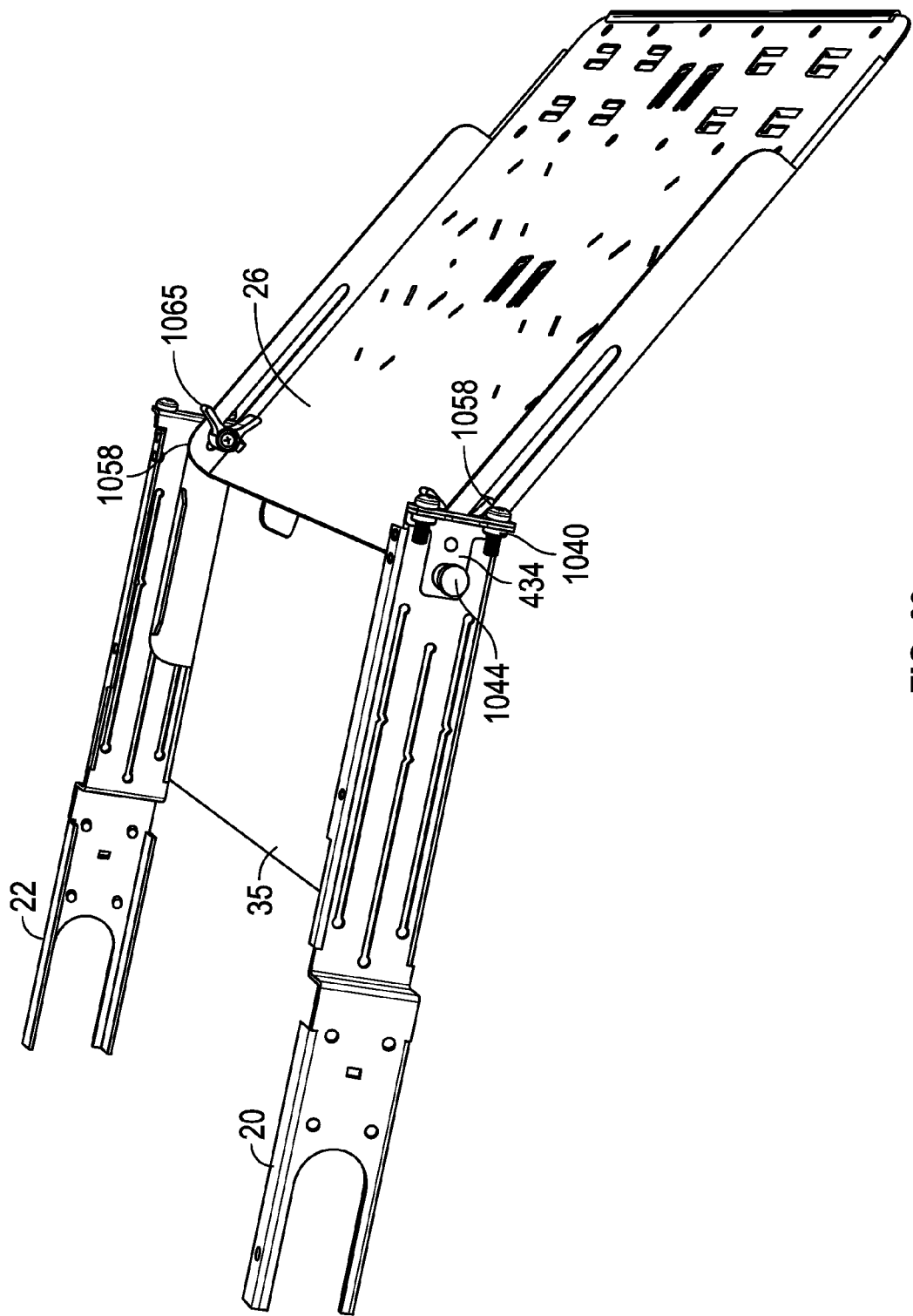
Figure 64:
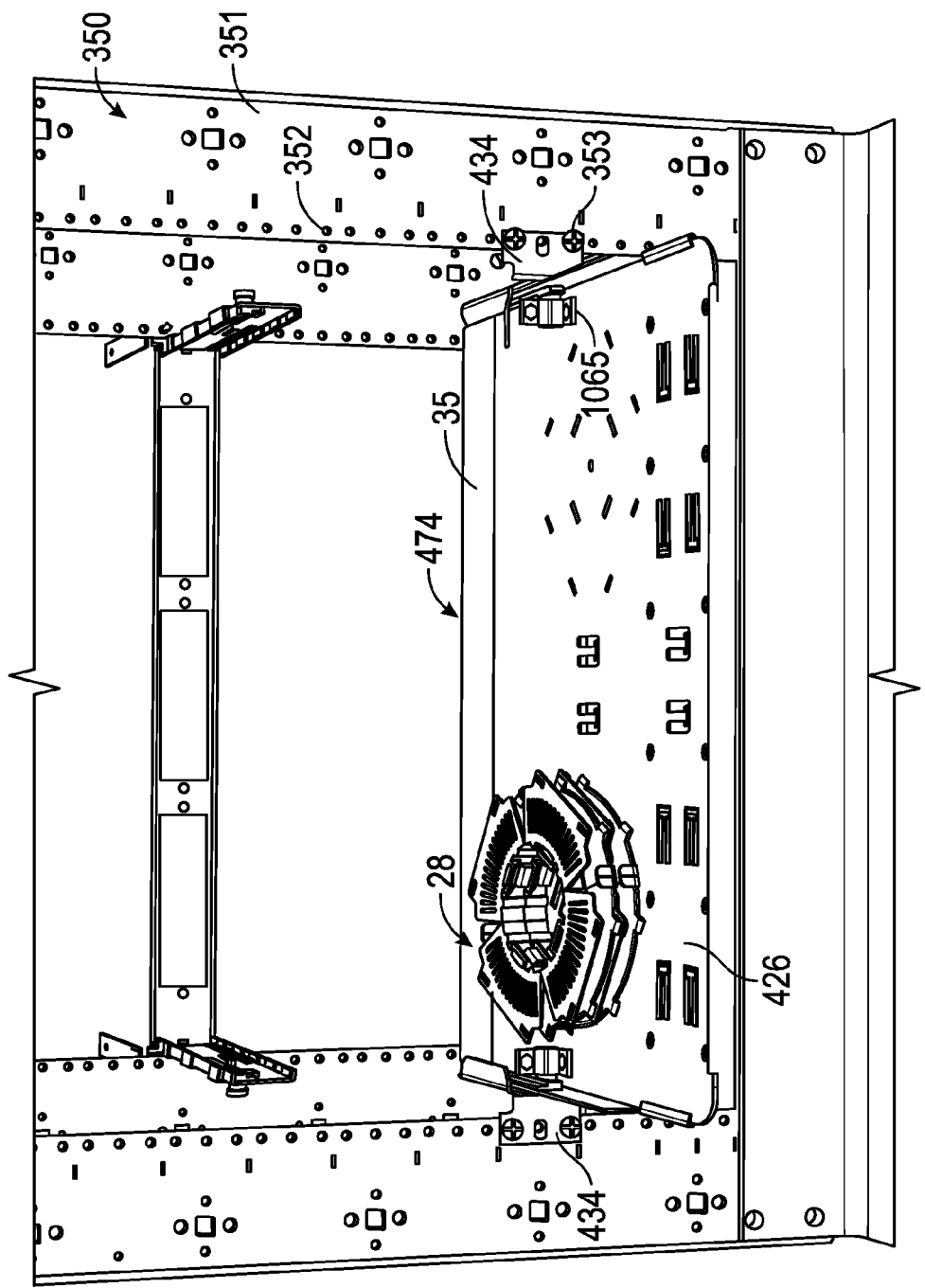

To assist those of ordinary skill in the art in making and using the disclosed assemblies, systems and methods, reference is made to the appended figures, wherein:

FIG. 1 is a top perspective view of a media patching system according to an exemplary embodiment of the present disclosure, prior to connector assemblies mounted to the system;

FIG. 2 is a bottom perspective view of the system of FIG. 1;

FIG. 3 is a top perspective view of the system of FIG. 1, after exemplary connector assemblies are mounted to the system;

FIG. 4 is a bottom perspective view of the system of FIG. 3;

FIG. 5 is a bottom view of the system of FIG. 3;

FIG. 6 is a partial top perspective view of the system of FIG. 1, after exemplary connector assemblies are mounted to the system;

FIG. 7 is a top perspective view of the cable management plate assembly including upper cable management plate and lower cable management plate of the system of FIG. 1;

FIG. 8 is a top perspective view of the system of FIG. 1, with front cover member attached;

FIG. 9 is a side perspective view of a bracket member of the system of FIG. 1;

FIG. 10 is a side perspective view of a cable management member of the system of FIG. 1;

FIG. 11 is a top perspective view of another exemplary media patching system of the present disclosure, prior to connector assemblies mounted to the system;

FIG. 12 is a bottom perspective view of the system of FIG. 11;

FIG. 13 is a top perspective view of the system of FIG. 11, after exemplary connector assemblies are mounted to the system;

FIG. 14 is a top perspective view of another exemplary media patching system of the present disclosure, prior to connector assemblies mounted to the system;

FIG. 15 is another top perspective view of the system of FIG. 14;

FIG. 16 is a top perspective view of the system of FIG. 14, after exemplary connector assemblies are mounted to the system;

FIG. 17 is a front view of an exemplary bezel member for use with the system of FIG. 14;

FIG. 18 is a rear view of the bezel member of FIG. 17;

FIG. 19 is a front perspective view of the bezel member of FIG. 17;

FIG. 20 is a front perspective view of the bezel member of FIG. 17, after an exemplary connector assembly is mounted to the bezel member;

FIG. 21 is a front perspective view of the bezel member of FIG. 17, after exemplary connector assemblies are mounted to the bezel member;

FIG. 22 is a front perspective view of another exemplary bezel member for use with the system of FIG. 14;

FIG. 23 is a front perspective view of the bezel member of FIG. 22, after an exemplary connector assembly is mounted to the bezel member;

FIG. 24 is a front perspective view of another exemplary bezel member for use with the system of FIG. 14;

FIG. 25 is a front perspective view of the bezel member of FIG. 24, after an exemplary connector assembly is mounted to the bezel member;

FIG. 26 is a top perspective view of the system of FIG. 3, after exemplary cables/wires are mounted to the system;

FIG. 27 is a side perspective view of exemplary media patching systems mounted with respect to a supporting structure;

FIG. 28 is a side view of the exemplary bracket member of FIG. 9;

FIG. 29 is a top, perspective view of an exemplary upper cable management plate according to the present disclosure;

FIG. 30 is a bottom, perspective view of an exemplary upper cable management plate of FIG. 29;

FIG. 31 is a top view of an exemplary upper cable management plate of FIG. 29;

FIG. 32 is a side view of an exemplary upper cable management plate of FIG. 29;

FIG. 33 is a perspective view of an exemplary lower cable management plate according to the present disclosure;

FIG. 34 is a perspective view of an exemplary bracket according to the present disclosure;

FIG. 35 is a perspective view of a partial assembly of an exemplary media patching system of FIG. 1, including first and second bracket members, lower cable management plate, and brackets;

FIG. 36 is a perspective view of a partial assembly of an exemplary media patching system of FIG. 1, including first and second bracket members, lower cable management plate, brackets, and upper cable management plate;

FIG. 37 is a perspective view of a partial assembly of an exemplary media patching system of FIG. 1, including first and second frame members, lower cable management plate, brackets, upper cable management plate, and spring-loaded pin assemblies;

FIG. 38 is a detailed, perspective view of a partial assembly of an exemplary media patching system of FIG. 1, including first and second bracket members, lower cable management plate, brackets, upper cable management plate, and spring-loaded pin assemblies;

FIG. 39 is a top, perspective view of an exemplary quarter spool according to the present disclosure;

FIG. 40 is a bottom, perspective view of the exemplary quarter spool of FIG. 39;

FIG. 41 is a perspective view of an exemplary spool assembly including four quarter spools;

FIG. 42 is a perspective view of the exemplary spool assembly of FIG. 41 secured to a cable management plate;

FIG. 43 is a bottom view of the exemplary bracket member of FIG. 28;

FIG. 44 is a side perspective view of an exemplary panel assembly;

FIG. 45 is a side perspective view of another exemplary panel assembly;

FIG. 46 is a side perspective view of the panel assembly of FIG. 44 mounted with respect to exemplary bracket members;

FIG. 47 is a side perspective view of an exemplary motion limiter member;

FIG. 48 is a side perspective view of another exemplary bracket member;

FIG. 49 is a side perspective view of another exemplary panel assembly;

FIG. 50 is a side perspective view of the panel assembly of FIG. 49 mounted with respect to exemplary bracket members;

FIG. 51 is a side perspective view of another exemplary bracket member;

FIG. 52 is a side perspective view of another exemplary panel assembly;

FIG. 53 is a side perspective view of the panel assembly of FIG. 52 mounted with respect to exemplary bracket members;

FIG. 54 is a side perspective view of another exemplary bracket member;

FIG. 55 is a side perspective view of another exemplary panel assembly;

FIG. 56 is a side perspective view of the panel assembly of FIG. 55 mounted with respect to exemplary bracket members;

FIG. 57 is a side perspective view of another exemplary bracket member;

FIG. 58 is a side perspective view of the panel assembly of FIG. 55 mounted with respect to exemplary bracket members;

FIG. 59 is a partial side perspective view of an exemplary media patching system according to the present disclosure;

FIG. 60 is a side perspective view of another exemplary cable management member;

FIG. 61 is a cross-sectional view of a partial assembly of an exemplary media patching system of FIG. 1, including first and second bracket members, lower cable management plate, upper cable management plate, and a bracket;

FIG. 62 is a cross-sectional view of a partial assembly of an exemplary media patching system of FIG. 1, including a bracket and a spring-loaded pin assembly;

FIG. 63 is a perspective view of a partial assembly of an exemplary media patching system of FIG. 1, including first and second frame members, lower cable management plate, brackets, and upper cable management plate pivoted relative to lower cable management plate; and FIG. 64 is a rear, perspective view of a cable management plate assembly including lower cable management plate and upper cable management plate secured directly to a rack without first and second bracket members.

DETAILED DESCRIPTION OF DISCLOSURE

The exemplary embodiments disclosed herein are illustrative of advantageous media patching systems of the present disclosure and methods/techniques thereof. It should be understood, however, that the disclosed embodiments are merely exemplary of the present disclosure, which may be embodied in various forms. Therefore, details disclosed herein with reference to exemplary patching systems/fabrication methods and associated processes/techniques of assembly and use are not to be interpreted as limiting, but merely as the basis for teaching one skilled in the art how to make and use the advantageous patching systems and/or alternative assemblies of the present disclosure.

In general, the present disclosure provides improved patching systems (e.g., patch panel assemblies), and related methods of use. The present disclosure provides improved systems/methods for the design and use of patching systems configured to support multiple media connections (e.g., high density, mixed media connections).

More particularly, the present disclosure provides advantageous systems/methods for the design and use of patching systems having one or more bracket members (e.g., Z-shaped bracket members) configured to facilitate cable management. In exemplary embodiments, the bracket members allow a panel assembly to move relative to the bracket members (e.g., for cable management purposes).

In certain embodiments, disclosed herein is a high density patching system configured to support multiple media connections. The improved systems provide users with the ability to install multiple media connections (e.g., copper-based and/or fiber optic connections) in the same patching system/enclosure. For example, high density jack patch panels can be utilized to support multiple media connections. The exemplary patching systems can be used to support one or more types of cables used in a communication network. Moreover, exemplary patch panel assemblies disclosed herein can advantageously increase patching density of the media patching system while maintaining port accessibility.

In exemplary embodiments, the present disclosure provides for improved systems/methods for the design/use of patching systems configured to support multiple media connections (e.g., copper and/or fiber optic connections) in the same patching system/enclosure, thereby providing a significant operational, commercial and/or manufacturing advantage as a result. Moreover, the present disclosure also provides for improved patching systems having one or more bracket members (e.g., Z-shaped bracket members), with the bracket members facilitating a panel assembly to move relative to the bracket members for cable management purposes, thereby providing a significant operational, commercial and/or manufacturing advantage as a result.

Referring now to the drawings, like parts are marked throughout the specification and drawings with the same reference numerals, respectively. Drawing figures are not necessarily to scale and in certain views, parts may have been exaggerated for purposes of clarity.

With reference to FIGS. 1-6, there is illustrated an embodiment of an exemplary media patching system 10 according to the present disclosure. In general, media patching system 10 is configured and dimensioned to be used as a patching system for media connections. More particularly, media patching system 10 can be configured to support high density, multiple (mixed) media connections, as discussed further below. It is noted that media patching system 10 can take a variety of forms, shapes and/or designs.

In exemplary embodiments, system 10 is a high density patching system configured to support multiple (mixed) media connections. In certain embodiments, system 10 provides users with the ability to install multiple media connections (e.g., copper-based connections, fiber optic connections, combinations thereof, or the like) in the same patching system/enclosure 10.

As discussed further below, panel assemblies 12 (e.g., patch panel assemblies/multi-connector panel assemblies 12) can be utilized with system 10 to support multiple media connections (e.g., copper and/or fiber optic connections). Exemplary patch panel assemblies/multi-connector panel assemblies 12 disclosed herein can advantageously increase the patching density of system 10.

In general, media patching system 10 includes a panel assembly 12 (e.g., patch panel assembly/multi-connector panel assembly 12). Exemplary panel assembly 12 has a front panel surface/segment 15 that includes a plurality of apertures 13 therethrough. As discussed in further detail below, each aperture 13 is typically configured and dimensioned to have a connector assembly/connective device 14, 14A or 14B mounted with respect thereto (FIGS. 3-6, 13, 16, 21 and 26). It is noted that the front panel surface/segment 15 of panel assembly 12 can be angled (FIGS. 1-6), or it can be substantially flat or planar (panel assembly 12' of FIGS. 11-13). Additionally, it is further noted that panel assembly 12, 12' can take a variety of shapes, forms and/or geometries.

As shown in FIGS. 1 and 3-5, one or more connector assemblies 14 can be mounted with respect to panel assembly 12 (e.g., with one aperture 13 configured to house/mount to one assembly 14), as described and disclosed in U.S. Pat. Nos. 8,439,702 and 8,672,709 noted above. More particularly, each connector assembly 14 typically includes a movable locking member 16 (FIGS. 3, 6 and 21) that is configured to releasably secure the connector assembly 14 to panel assembly 12 as described and disclosed in U.S. Pat. Nos. 8,439,702 and 8,672,709. Panel assembly 12 can include any number of connector assemblies 14 mounted thereon (e.g., one, two, three, four, a plurality, etc.).

Each exemplary connector assembly 14 takes the form of a copper-based electrical connector assembly 14. More particularly, it is noted that each connector assembly 14 includes a jack housing (e.g., high density modular communication jack housing) that is adapted to receive signals from a mating connecting assembly (e.g., a plug connector, such as an RJ-45 plug or an IEC 60603-7-7 compliant plug) inserted or introduced to a receiving space of the jack housing. As such, associated contacts (e.g., eight contacts) or the like of the jack housing are positioned for electrical communication with data signal transmission media plug elements/contacts introduced to the receiving space of the jack housing. In general, the jack housing of electrical connector assembly 14 is suitable for use in various applications, e.g., for interfacing with high frequency data transfer media, connection to data transfer devices or the like, etc. For example, the jack housing of connector assembly 14 may be mounted to a printed circuit board (PCB) and signals may transfer from a plug connector introduced to the receiving space of connector assembly 14 to the PCB and then to insulation displacement contacts (IDCs), thus completing the data interface and transfer through connector assembly 14.

In other embodiments and as discussed below in connection with FIGS. 13 and 21, panel assembly 12 can have one or more connector assemblies 14A mounted thereon (via apertures 13). Each connector assembly 14A takes the form of a fiber optic connector assembly 14A. Panel assembly 12 can include any number of connector assemblies 14A mounted thereon (e.g., one, two, three, four, a plurality, etc.).

More particularly, each connector assembly 14A includes one or more ports/adapters to facilitate communication with a mating assembly (e.g., fiber optic connector), that in turn can interact with various fiber optic media (fiber optic cables, etc.). The ports/adapters of assembly 14A are typically positioned for communication with fiber optic connectors introduced to a receiving space of connector assembly 14A. Similar to connector assembly 14, each connector assembly 14A can include a movable locking member 16 (FIGS. 13 and 21) that is configured to releasably secure the connector assembly 14A to panel assembly 12, as described above.

As shown in FIGS. 3-6, one or more connector assemblies 14B can be mounted with respect to panel assembly 12. Panel assembly 12 can include any number of connector assemblies 14B mounted thereon. Exemplary connector assembly 14B takes the form of a fiber optic cassette 14B having a plurality of fiber optic ports/adapters (e.g., 12 ports) for mating with fiber optic connectors. In certain embodiments, connector assembly 14B includes six port housings 18, with each port housing 18 including two or more fiber optic ports/adapters (e.g., LC, SC, MPO adapters).

Each port housing 18 is configured to be inserted through and mounted with respect to six respective apertures 13 of panel assembly 12 via locking members 16 disposed on each top end of connector assembly 14B (FIGS. 3 and 22), as similarly discussed above for locking members 16 of assemblies 14 and 14A. It is noted that connector assembly 14B can include any suitable number of port housings 18 and/or fiber optic ports and/or locking members 16 for mounting to panel assembly 12, and/or for fiber optic communication purposes.

It is noted that panel assembly 12 of system 10 can include any number, combination and/or permutation of connector assemblies/connector devices 14, 14A and/or 14B. As such, panel assembly 12 can include connector assemblies 14, 14A or 14B, or mixtures thereof. Thus, panel assembly 12 of system 10 advantageously provides users with the ability to install multiple (mixed) media connections (e.g., copper-based 14 and/or fiber optic connections 14A, 14B) in the same patching system/enclosure 10. Moreover, panel assembly 12 can advantageously increase patching density of the media patching system 10 while maintaining port accessibility. FIG. 26 shows a plurality of cables 38 mounted with respect to the ports of connector assemblies 14B, and a plurality of cables 40 mounted with respect to the jack housings of connector assemblies 14.

In certain embodiments, media patching system 10 is configured and dimensioned to be mounted with respect to a supporting structure 350 (e.g., rack 350-FIG. 27) or the like. As shown in FIG. 27, it is noted that exemplary media patching systems 10 (and 100) are adapted for use in conjunction with a rack 350 (e.g., network or server rack) or the like, although the present disclosure is not limited thereto. Rather, the disclosed media patching systems 10 and/or 100 are adapted for use in conjunction with other structures, such as, for example, frames, cabinets, supporting structures, or other structures that stand to benefit from proximate cable management functionality. For ease of disclosure, the potential structures to which the disclosed systems 10/100 may be mounted are collectively referred to as "rack(s)." However, it is to be understood that the present disclosure is not limited by or to implementations wherein the disclosed systems 10/100 are mounted with respect to, or used in conjunction with, a rack 350, but may be mounted with respect to, or used in conjunction with other structures/units (e.g., structures/units associated with cable routing).

As shown in FIG. 27, one or more media patching systems 10 and/or 100 can be mounted with respect to rack 350 or the like. Any suitable number of systems 10/100 can be mounted with respect to rack 350, and the systems 10/100 may or may not include cover members 33, 34 and/or 35. For example and as shown in FIG. 27, ten systems 10/100 are mounted with respect to rack 350, with the ten systems mounted proximal to one another within rack 350. In one embodiment, the top system 100 in rack 350 includes top cover members 33 and 34, and the bottom system 100 includes lower cable management plate 35.

Exemplary rack 350 is depicted in FIG. 27, and such rack 350 and other exemplary mounting structures suitable for use with systems 10/100 are described and disclosed in U.S. Pat. No. 7,983,038, the entire contents of which is hereby incorporated by reference in its entirety. However and as noted above, systems 10/100 may be mounted with respect to or used in conjunction with other structures/units.

Panel assembly 12 (e.g., patch panel assembly/multi-connector panel assembly 12) of media patching system 10 can be mounted with respect to a first bracket member 20 and a second bracket member 22 (FIGS. 1 and 9). A cable management member 24 can be mounted with respect to each bracket member 20, 22 for cable/wire management purposes of system 10. Each bracket member 20, 22 can be mounted with respect to an upper cable management plate 26. Upper cable management plate 26 can include one or more cable management spool assemblies 28 or the like removably mounted thereon for cable/wire management purposes of system 10. System 10 may or may not include top covers 33, 34 and/or lower cable management plate 35 (e.g., mounted with respect to bracket members 20, 22). System 10 may also include a door assembly 36 (e.g., mounted with respect to bracket members 20, 22) that is configured to open, close, lock and unlock as desired by a user.

In certain embodiments, panel assembly 12 can be movably mounted relative to bracket members 20, 22 via one or more slots 30 of bracket members 20, 22. Pull tab members 32 of panel assembly 12 can facilitate movement of panel assembly 12 relative to bracket members 20, 22. Upper cable management plate 26 can move relative to bracket members 20, 22 via slots 31 of upper cable management plate 26 (FIG. 7). In some embodiments, movement or sliding of the upper cable management plate 26 relative to bracket members 20, 22 can be independent from movement of panel assembly 12. Upper cable management plate 26 can therefore be extended from the media patching system 10 without affecting the position of panel assembly 12 (or 112).

As noted above and as shown in FIGS. 11-13, system 10 can include an alternative panel assembly 12' having a front panel surface/segment 15 that is substantially flat or planar. Similar to panel assembly 12, the flat/planar front panel surface/segment 15 of panel assembly 12' can include any number, combination and/or permutation of connector assemblies/connector devices 14, 14A and/or 14B mounted thereon, via apertures 13 of panel assembly 12'. As such, panel assembly 12' can include connector assemblies 14, 14A or 14B, or mixtures thereof. Thus, panel assembly 12' of system 10 advantageously provides users with the ability to install multiple (mixed) media connections (e.g., copper-based connections 14, fiber optic connections 14A, 14B, combinations thereof, or the like) in the same patching system/enclosure 10. Moreover, panel assembly 12' can advantageously increase patching density of the media patching system 10 while maintaining port accessibility. Panel assembly 12' can be mounted with respect to first bracket member 20 and second bracket member 22, as similarly discussed above.

In other embodiments and as shown in FIGS. 14-16, exemplary media patching system 100 is similar to system 10 discussed above, with some differences. Similar to system 10 discussed above, media patching system 100 is configured and dimensioned to be used as a patching system for multiple media connections. More particularly, media patching system 100 can be configured to support high density, multiple (mixed) media connections. It is noted that media patching system 100 can take a variety of forms, shapes and/or designs.

In exemplary embodiments, system 100 is a high density patching system configured to support multiple media connections. System 100 provides users with the ability to install multiple media connections (e.g., e.g., copper-based connections, fiber optic connections, combinations thereof, or the like) in the same patching system/enclosure 100.

Similar to system 10 above, media patching system 100 includes a panel assembly 112 (e.g., patch panel assembly or multi-connector panel assembly 112). In certain embodiments, media patching system 100 is configured and dimensioned to be mounted with respect to a supporting structure 350 (e.g., rack 350—FIG. 27) or the like. As shown in FIG. 27, it is noted that exemplary media patching systems 100 (and 10) are adapted for use in conjunction with a rack 350 (e.g., network or server rack) or the like. As shown in FIG. 27, one or more media patching systems 100 (and/or 10) can be removably mounted with respect to rack 350 or the like.

Panel assembly 112 of media patching system 100 can be mounted with respect to a first bracket member 20 and a second bracket member 22 (FIGS. 9 and 14-16). A cable management member 24 can be mounted with respect to each bracket member 20, 22 for cable/wire management purposes of system 100. Each bracket member 20, 22 can be mounted with respect to an upper cable management plate 26. Upper cable management plate 26 can include one or more cable management spool assemblies 28 or the like removably mounted thereon for cable/wire management purposes. System 100 may or may not include top covers 33, 34 and/or lower cable management plate 35 (e.g., mounted with respect to bracket members 20, 22). System 100 may also include a door assembly 36 (e.g., mounted with respect to bracket members 20, 22) that is configured to open, close, lock and unlock as desired by a user.

In certain embodiments, panel assembly 112 can be movably mounted relative to bracket members 20, 22 via one or more slots 30 of bracket members 20, 22. Pull tab members 132 of panel assembly 112 can facilitate movement of panel assembly 112 relative to bracket members 20, 22. Upper cable management plate 26 can move relative to bracket members 20, 22 via slots 31 of upper cable management plate 26 (FIG. 7).

Exemplary panel assembly 112 has a front panel surface/segment 115 that includes a plurality of apertures 113. As shown in FIGS. 14-25 and as discussed in further detail below, each aperture 113 is typically configured and dimensioned to have a connector assembly/connective device 14, 14A, 14B, 14C or 14D mounted with respect thereto (e.g., via bezel member 144, 146 or 148). As discussed further below, each aperture 113 of panel assembly 112 is typically associated with one or more mounting holes 142 of front panel surface/segment 115 of panel assembly 112.

It is noted that the front panel surface/segment 115 of panel assembly 112 can be substantially flat or planar (FIGS. 14-16), or it can be can be angled. Additionally, it is further noted that assembly 112 can take a variety of shapes, forms and/or geometries.

As shown in FIGS. 16-25, exemplary panel assembly 112 can include or be associated with one or more removable bezel members 144, 146 and/or 148. Bezel member 144 can include one or more apertures 213, with each aperture 213 configured and dimensioned to have a connector assembly/connective device 14, 14A, 14B mounted/housed with respect thereto, as similarly discussed above in connection with apertures 13 of panel assembly 12 (e.g., via moving locking members 16 of connector assembly/connective device 14, 14A, 14B). As such, one or more connector assembly/connective device 14, 14A, 14B can be mounted with respect to bezel member 144 (FIGS. 20-21).

In exemplary embodiments, the front face of bezel member 144 includes one or more handle members 150, and the rear face of bezel member 144 includes one or more mounting members 152 for the releasable attachment to mounting holes 142 of panel assembly 112.

Turning to bezel member 146 (FIG. 22), exemplary bezel member 146 includes an aperture or slot 313, with aperture 313 configured and dimensioned to have a connector assembly/connective device 14C mounted/housed with respect thereto (FIG. 23). Similar to bezel member 144, the front face of bezel member 146 includes one or more handle members 150, and the rear face of bezel member 146 includes one or more mounting members 152 for the releasable attachment to mounting holes 142 of panel assembly 112. Exemplary connector assembly 14C takes the form of a fiber optic cassette 14C having a plurality of fiber optic ports/adapters (e.g., 12 ports) for mating with fiber optic connectors.

With reference to bezel member 148 (FIG. 24), exemplary bezel member 148 includes an aperture or slot 413, with aperture 413 configured and dimensioned to have a connector assembly/connective device 14D mounted/housed with respect thereto (FIG. 25). Similar to bezel member 144, the front face of bezel member 148 includes one or more handle members 150, and the rear face of bezel member 148 includes one or more mounting members 152 for the releasable attachment to mounting holes 142 of panel assembly 112.

In certain embodiments, connector assembly 14D includes a mounting plate 154, with the front face of mounting plate 154 having one or more handle members 150', and the rear face of mounting plate 154 having one or more mounting members 152' for the releasable attachment to mounting holes 142' of bezel member 148. Exemplary connector assembly 14D takes the form of a fiber optic cassette 14D having a plurality of fiber optic ports/adapters (e.g., 12 ports) for mating with fiber optic connectors.

It is noted that panel assembly 112 of system 100 can include any number, combination and/or permutation of bezel members 144, 146 and/or 148, and thus can include any number, combination and/or permutation of connector assemblies/connector devices 14, 14A, 14B, 14C and/or 14D. As such, panel assembly 112 can include connector assemblies 14, 14A, 14B, 14C and/or 14D (alone or in combinations thereof). Thus, panel assembly 112 of system 100 advantageously provides users with the ability to install multiple media connections (e.g., e.g., copper-based connections 14, fiber optic connections 14A, 14B, 14C, 14D, combinations thereof, or the like) in the same patching system/enclosure 100. Moreover, panel assembly 112 can advantageously increase patching density of the media patching system 100 while maintaining port accessibility.

With reference to FIGS. 9 and 28, perspective and side views of exemplary bracket members 20, 22 are shown. In exemplary embodiments, each bracket member 20, 22 defines a substantially z-shaped configuration, including a first planar segment 401, a second planar segment 402, and a third planar segment 403 connecting the first and second planar segments 401, 402. As discussed further below, exemplary first and second planar segments 401, 402 are substantially parallel relative to each other and define sides of the media patching system 10, 100. One or more slots 30 can extend along the length defined by second planar segment 402. Exemplary third planar segment 403 is substantially perpendicular to first and second planar segments 401, 402, although the present disclosure is not limited thereto.

Exemplary bracket members 20, 22 include a first aperture 404 and a second aperture 405 spaced relative to each other and passing through the second planar segment 402. Exemplary first aperture 404 defines a circular shape. Second aperture 405 includes a large diameter portion 405a and a small diameter portion 405b. As discussed further below, first and second apertures 404, 405 can be used to detachably secure a bracket 34 (shown in FIG. 34) to the bracket members 20, 22.

Turning now to FIGS. 29-32, perspective, top and side views of an exemplary upper cable management plate 26 of a cable management plate assembly are provided. Upper cable management plate 26 can define a substantially rectangular configuration, including first and second side edges 406, 407, a front edge 408, and a rear edge 409. Front and rear edges 408, 409 define a width 410 of upper cable management plate 26 and first and second side edges 406, 407 define a depth 411 of upper cable management plate 26. The width 410 can be dimensioned such that upper cable management plate 26 can be positioned between the first and second bracket members 20, 22.

Upper cable management plate 26 includes a substantially planar body portion 412 extending between first and second side edges 406, 407, front edge 408, and rear edge 409. Each of the first and second side edges 406, 407 includes a flange 414, 415 extending therefrom in a direction perpendicular to the plane defined by body portion 412. Flanges 414, 415 extend a partial distance along depth 411. The length of flanges 414, 415 can be varied to change the distance which upper cable management plate 26 can slide and extend from the rear portion of media patching system 10, 100.

Each flange 414, 415 includes an elongated slot 31 (e.g., a track 31) formed therein along which upper cable management plate 26 can slide or move relative to first and second bracket members 20, 22. Each slot 31 includes a proximal end 416 and a distal end 417. In particular, proximal end 416 can be disposed near front edge 408 and distal end 417 can be disposed near the midpoint of upper cable management plate 26.

Exemplary body 412 includes one or more groups of slots 418 formed thereon. In particular, groups of slots 418 include two slots 419 which are aligned and parallel to each other, and a slot 420 which is offset from and parallel to slots 419. In some embodiments, four groups of slots 418 can be positioned circumferentially around a central bore 421. As discussed further below, groups of slots 418 can be used to detachably secure one or more spool assemblies 28 to body 412.

In some embodiments, body 412 includes one or more tabs 422 formed therein for organizing cables on upper cable management plate 26. In some embodiments, body 412 includes one or more apertures with a threaded insert 423 positioned therein. Threaded inserts 423 can be used to secure additional cable management or organization components to upper cable management plate 26.

FIG. 33 shows a perspective view of an exemplary lower cable management plate 35 of media patching system 10. Together, upper cable management plate 26 and lower cable management plate 35 interconnect to form a cable management plate assembly. Additionally, components such as spools, can be added to the cable management plate assembly formed by upper cable management plate 26 and lower cable management plate 35. Lower cable management plate 35 includes a planar body 424 with a front edge 425, a rear edge 426, and first and second side edges 427, 428. Each of the first and second side edges 427, 428 includes a flange 429 (e.g., an L-shaped flange 429) extending perpendicularly relative to body 424. Each flange 429 includes a first portion 430 extending parallel to the respective first and/or second side edge 427, 428. In particular, first portion 430 extends a partial distance from rear edge 426 to a point offset from front edge 425. First portion 430 includes an aperture 431 that is involved in the connection of the upper cable management plate 26 to the lower cable management plate 35 in a manner that is explained below. Each flange 429 further includes a second portion 432 extending approximately ninety degrees from first portion 430 and extending parallel to rear edge 426. Second portion 432 extends away from body 424. Second portion 432 can include two or more openings 433 formed therein.

FIG. 34 shows a perspective view of an exemplary securing member 434. As discussed below, securing member 434 assists in interlocking lower cable management plate 35 to first and second bracket members 20, 22. Securing member 434 can define a substantially L-shaped configuration including a first portion 435 and a second portion 436 extending at approximately ninety degrees relative to each other. First portion 435 includes an inner surface 435a and an outer surface 435b. First portion 435 includes two apertures 437, 438 (e.g., circular openings) formed therein which are complementary to respective first and second apertures 404, 405 of first and second bracket members 20, 22. Second portion 436 includes two separated extensions, each including an aperture 439 complementary to an opening 433 formed in second portion 432 of lower cable management plate 35.

FIG. 61 is a perspective cut away view that shows the bracket 434 connected to a bracket member 22. It should be understood that a bracket 434 can be connected to bracket member 20 in a substantially similar manner A pem 1042 can be compression fit into opening 438 in bracket 434 such that the pem 1042 extends from the inner surface 435a of the first portion 435 of the bracket 434 and passes through opening 405 in the bracket member 20. In particular, the pem 1042 can pass freely through the large diameter opening 405a and can be configured to prevent passage of the pem 1042 through the small diameter opening 405b. A spring-loaded pin assembly 1044 can also be mated with the bracket 434. The spring-loaded pin assembly 1044 includes a housing 1049 that can be compression fit into opening 437 of the bracket 434 such that the spring-loaded pin assembly 1044 extends from the outer surface 435b of the first portion 435 of the bracket 434. An end portion 1047 of a pin body 1048 disposed within the pin housing 1049 can extend from the inner surface 435a of the first portion 435 of the bracket 434 and passes through opening 404 in the bracket member 20.

FIG. 62 is a cross-sectional view of spring-loaded pin assembly 1044 mated with bracket 434. The spring-loaded pin assembly 1044 includes a pin body 1048 that can translate inside a cavity or opening 1050 formed in the pin housing 1049. The pin body 1048 includes a head 1052 on one end that is always disposed outside of the housing 1049, a small diameter region 1056 extending from the head 1052 and through the opening 1050 in the housing 1049, and a large diameter region 1054 disposed at an opposing end of the small diameter region 1056 relative to the head 1052. In some embodiments, the pin body 1048 can include an intermediate diameter region 1055 disposed between the small diameter region 1056 and the large diameter region 1054. The transition from the small diameter region 1054, the intermediate diameter region 1055, and the large diameter region 1054 can be formed in a stepped manner A spring 1057 can be disposed within the opening 1050 and around the pin body 1048. In particular, the spring 1057 can be disposed between a face 1059 of the large diameter region 1054 of the pin body 1048 and a face 1060 of housing 1049, thereby biasing the head 1052 of the pin body 1048 towards the housing 1049 in the direction indicated by arrow 1061.

In some embodiments, an internally threaded member 1040 can be detachably mated with the bracket 434. In particular, the internally threaded member 1040 can be compression fit into the aperture 439 of the bracket 434 such that the member 1040 can extend from the second portion 436 adjacent to the outer surface 435b of the first portion 435 of the bracket 434. The threaded internal aperture 1041 of the member 1040 can be aligned with the aperture 439. Thus, rather than manipulating a nut to ensure alignment of the nut with a fastening member when connecting the bracket 434 to the lower cable management plate 35, the internally threaded member 1040 can remain attached to the bracket 434 to continuously provide a fastening portion in the bracket 434 that is aligned and ready to receive a fastening member. The internally threaded member 1040 therefore improves efficiency in assembling the bracket 434 and the lower cable management plate 35.

With reference to FIGS. 61-63 and 35-38, the bracket 434 can be connected to bracket member 22 as follows. The bracket 434 can be positioned on the outer surface 1062 of the bracket member 22 such that the pem 1042 extending from the inner surface 435a of the first portion 435 of the bracket 434 passes through the large diameter portion 405a of the opening 405 in the bracket member 22, e.g., a first position of the bracket 434. In the first position, the pin body 1048 of the spring-loaded pin assembly 1044 is not aligned with the opening 404 of the bracket member 22, and therefore cannot yet pass through the opening 404 of the bracket member 22. The bracket 434 can be slid backward such that the pem 1042 moves or slides into the small diameter portion 405b of the opening 405 in the bracket member 22, e.g., a second position of the bracket 434. When the bracket 434 is in the second position, the pin body 1048 is aligned with the opening 404 and passes through the opening 404 due to the force of the spring 1057 inside pin assembly 1044. In particular, the spring 1057 biasing the pin body 1048 forces a portion of the large diameter region 1054 into the opening 404 to interlock the bracket 434 with the bracket member 22. The spring-loaded pin assembly 1044 therefore acts as a quick release mechanism for connecting and disconnecting the bracket 434 from the bracket members 20, 22.

Once the bracket 434 has been connected to each bracket member 20, 22, lower cable management plate 35 can be detachably fixed to the bracket members 20, 22 by positioning flanges 429 of lower cable management plate 35 against the bracket 434 such that openings 433 of the lower cable management plate 35 and apertures 439 of bracket 434 are aligned (see FIGS. 35 and 36). When the openings 433 and apertures 439 are aligned, panel mounting screws 1058 can be passed through the openings 433 and apertures 439 and screwed into internally threaded pieces 1040 to secure the lower cable management plate 35 to brackets 434 and, thereby, to the first and second bracket members 20, 22 (see FIGS. 37 and 38).

FIG. 61 further shows a detailed view of how the upper cable management plate 26 is mounted to the lower cable management plate 35 such that the upper cable management plate 26 can slide relative to the lower cable management plate 35. In particular, one end of a pem 1063 can be compression fit into opening 431. The pem 1063 thereby extends inward from the flange 429 of the lower cable management plate 35 and passes through slot 31 in flange 415 of the upper cable management plate 26. The pem 1063 includes an internally threaded bore 1064 extending therein. A thumb latch 1065, e.g., a fastening member, including a first cylindrical portion 1066 with a first cam portion 1068 and a second cylindrical portion 1067 with a second cam portion 1069, e.g., a cam lock mechanism, is mounted to the outer surface of the pem 1063.

The second cylindrical portion 1067 can be rotationally fixed to the pem 1063. The first cylindrical portion 1066 can be attached to the pem 1063 with a screw 1070. The screw 1070 includes threads complementary to the threads of the pem 1063 such that the screw 1070 can mate with the internally threaded bore 1064. The second cylindrical portion 1067 can rotate about pem 1063 and can be manipulated to rotate in either direction with fingers 1071 (see FIGS. 37 and 38). When the first cylindrical portion 1066 of the thumb latch 1065 is disposed in a release position or configuration, the upper cable management plate 26 can slide relative to the lower cable management plate 35 with pem 1063 riding or sliding within slot 431. In particular, in the release position or configuration, a first cam surface 1072 of the first cam portion 1068 can be disposed in a spaced relation relative to the second cam surface 1073 of the second cam portion 1069 along the pem 1063.

When the first cylindrical portion 1066 of the thumb latch 1065 is rotated into a locking position or configuration, the first cam surface 1072 can interact with the second cam surface 1073 to push the second cylindrical portion 1067 towards the inner surface of flange 415 of the upper cable management plate 26. In particular, the first cylindrical portion 1066 can be rotated along the pem 1063 to rotate the screw 1070 deeper into the internally treaded bore 1064 of the pem 1063. The first cam surface 1072 can thereby press against the second cam surface 1073 to push the second cylindrical portion 1067 against the inner surface of flange 415 of the upper cable management plate 26.

The friction force created between the second cylindrical portion 1067 and the flange 415 of the upper cable management plate 26 fixates or secures the upper cable management plate 26 to the lower cable management plate 35 such that the upper cable management plate 26 cannot translate relative to the lower cable management plate 35. In particular, the pressure of the second cylindrical portion 1067 against the flange 415 prevents the pem 1063 from sliding within the slot 31 of the flange 415. To release and move the upper cable management plate 26 relative to the lower cable management plate 35, the first cylindrical portion 1066 can be rotated away from the second cylindrical portion 1067 to release and allow sliding of the pem 1063 within the slot 31 of the flange 415.

Thus, rather than removing the entire media patching system 10 from the rack 350, to access cables supported by upper cable management plate 26, upper cable management plate 26 can slide out from the rear of media patching system 10 (see FIG. 63). Upon at least partially extending upper cable management plate 26 from the rear of media patching system 10 along slots 31, pems 1063 can act as hinges to at least partially allow upper cable management plate 26 to rotate or pivot relative to media patching system 10. In particular, the upper cable management plate 26 can slide along the pems 1063 between the proximal end 416 and the distal end 417 of the slots 31 (see FIG. 32). At the proximal end 416 position, the upper cable management plate 26 can be positioned in a fully extended position relative to the lower cable management plate 35, and the rounded configuration of the proximal end 416 of the slot 31 allows variation in the pivot angle of the upper cable management plate 26 relative to the lower cable management plate 35. At the distal end 417 position, the upper cable management plate 26 can be positioned in a fully retracted position relative to the lower cable management plate 35. The upper cable management plate 26 can therefore pivot relative to first and second bracket members 20, 22 and lower cable management plate 35 as is shown in FIG. 63. For example, upper cable management plate 26 can pivot in a downward direction relative to a plane defined by or parallel to first and second bracket members 20, 22, lower cable management plate 35, or both. Greater access can thereby be provided to cables stored or organized on upper cable management plate 26.

Cable management plate assembly 474 (FIG. 64) includes the assembly of upper cable management plate 26 and lower cable management plate 35. In some embodiments, the cable management plate assembly 474 need not be connected to bracket members 20, 22. Rather, as shown in FIG. 64, the cable management plate assembly 474 provides versatility in that the cable management plate assembly 474 can be connected directly to the back portions 351 of the uprights of the rack 350. In the configuration shown in FIG. 64, openings 433 in second portion 432 in flanges 429 of lower cable management plate 35 are not aligned with apertures 439 in bracket 434. Instead, openings 433 can be aligned with openings 352 formed in the back portions 351 of the uprights of rack 350 and panel mounting screws 353 can pass through the openings 433 and the corresponding openings 352 in the back portions 351 of the uprights of rack 350 to secure the cable management plate assembly 474 to the rack 350. The upper cable management plate 26 can be secured to the lower cable management plate 35 as describe above and can slide and pivot relative to the lower cable management plate 35 when the thumb latches 1065 are disposed in the release position. Thus, the cable management plate assembly 474 can advantageously be located further back in the rack 350 when cable management in that location is needed or desired, and can be secured to the rack 350 independently of a media patching system 10.

FIGS. 39 and 40 show perspective views of an exemplary quarter spool 442. Quarter spool 442 includes a top surface 443 and a bottom surface 444 separated by an inner wall 445. Inner wall 445 connects top and bottom surfaces 443, 444 relative to each other and forms a cavity 446 between top and bottom surfaces 443, 444. Bottom surface 444 includes two S-shaped flanges 447 extending from an outer edge of quarter spool 442, and further includes a single U-shaped flange 448 on an opposing inner edge of quarter spool 442.

Flanges 447, 448 can be configured and dimensioned complementary to slots 419, 420 of cable management plate 26. In particular, flanges 447 can be complementary to slots 419 and flange 448 can be complementary to slot 420 such that quarter spools 442 can be mounted onto cable management plate 26. During assembly, flanges 447 can be inserted into slots 419 such that a portion of flanges 447 passes through slots 419. Flange 448 can be depressed and inserted into slot 420 to detachably lock quarter spool 442 to cable management plate 26. For example, upon release of flange 448, flange 448 can spring or snap outward within slot 420 and interlock relative to cable management plate 26. One or more cables can be passed through cavity 446 and wrapped around quarter spool 442 to organize the cables on cable management plate 26.

In some embodiments, quarter spool 442 can define an approximately ninety degree portion or circumference of a full spool assembly 28. As shown in FIGS. 41 and 42, four quarter spools 442 can be individually interlocked relative to cable management plate 26 such that spool assemblies 28 are formed. Inner walls 445 of quarter spools 442 can mate to form a substantially complete circumference around which cables can be wrapped (e.g., for cable management purposes).

In some embodiments and as shown in FIGS. 39 and 42, top surface 443 of quarter spool 442 can include two slots 449 near the outer edge of quarter spool 442, and further includes a single slot 450 extending from the inner edge of quarter spool 442. It should be understood that slots 449 can be complementary to flanges 447 and slot 450 can be complementary to flange 448. Quarter spools 442 can thereby be stacked relative to each other (e.g., on top of another) to provide additional space onto which cables can be organized.

With reference again to FIGS. 9 and 28, and also to FIG. 43, each exemplary bracket member 20, 22 defines a substantially z-shaped configuration, including a first planar segment 401, a second planar segment 402, and a third planar segment 403 connecting the first and second planar segments 401, 402.

More particularly and as shown in FIG. 43, first planar segment 401 defines the plane of Arrow A, second planar segment 402 defines the plane of Arrow B, and third planar segment 403 defines the plane of Arrow C. As noted, exemplary first and second planar segments 401, 402 are substantially parallel relative to each other and define sides of the media patching system 10, 100. Exemplary third planar segment 403 is substantially perpendicular/transverse to first and second planar segments 401, 402, and exemplary first and second planar segments 401, 402 are substantially parallel relative to each other and are spaced apart from one another, although the present disclosure is not limited thereto.

As shown in FIG. 28, one or more slots 30 can extend along a length defined by second planar segment 402. In certain embodiments, second planar segment 402 includes top and bottom slots 30, and a middle slot 30' positioned between the top and bottom slots 30. In general, slots 30, 30' extend through segment 402 (and slots 29, 37, 39 extend through segment 402, discussed below).

In some embodiments and as shown in FIG. 28, middle slot 30' includes an enlarged slot portion 29. Exemplary enlarged slot portion 29 takes the form of a rectangular or square slot portion 29, although the present disclosure is not limited thereto. Rather, slot portion 29 can take a variety of forms/shapes (e.g., polygonal, circular, etc.). Enlarged slot portion 29 can be positioned at a suitable position along the length of slot 30' (e.g., approximately half-way along the length of slot 30'; at or near the proximal end of slot 30', etc.). It is noted that middle slot 30' may or may not include enlarged slot portion 29.

The proximal ends of slots 30, 30' can include enlarged/detent portions 37 (e.g., positioned at, near or proximal to proximal end 41 of second planar segment 402). Enlarged/detent portions 37 can take a variety of forms/shapes (e.g., circular, polygonal, etc.). In general and as discussed further below, enlarged portions 37 act as a detent to position the sliding panel assembly 112, and provide a means/position to mount the panel assembly 112 to the bracket members 20, 22.

Exemplary second segment 402 can also include distal slot portion 39 positioned at or near (e.g., proximal to) distal end 43 of second planar segment 402 (e.g., spaced from the distal end of slot 30' and substantially axially aligned with slot portion 29). Distal slot portion 39 can take a variety of forms/shapes (e.g., polygonal, circular, etc.).

With reference again to FIG. 9, the third segment 403 of each bracket member 20, 22 typically includes one or more apertures 23 (e.g., three apertures 23) therethrough. In general, each aperture 23 is configured and dimensioned to allow bracket member 20, 22 to be mounted with respect to rack 350 (FIG. 27) or the like (e.g., via corresponding apertures on rack 350, and with fastening members or the like through the respectively aligned bracket/rack apertures).

In exemplary embodiments, each bracket member 20, 22 is fabricated from a single piece of material (e.g., fabricated from a single piece of sheet metal or the like), although the present disclosure is not limited thereto. As such, exemplary bracket members 20, 22 advantageously reduce cost by eliminating extra parts required to mount a system 10, 100 to a rack 350 or the like. Moreover, the exemplary bracket members 20, 22 advantageously reduce the amount of weight (e.g., the amount of metal) needed to fabricate the system 10, 100, while still providing sufficient structural rigidity to system 10, 100.

In other embodiments, it is noted that each bracket member 20, 22 can be fabricated from a variety of materials (e.g., from one material, or from a combination of materials), and can take a variety of shapes/designs.

With reference again to FIGS. 14 and 15, and also to FIG. 44, exemplary panel assembly 112 defines a substantially U-shaped configuration, including the front panel surface/segment 115, a first side segment 156, and a second side segment 158. In general, front panel segment 115 connects the first and second side segments 156, 158 to define the substantially U-shaped configuration of panel assembly 112.

In exemplary embodiments, panel assembly 112 is fabricated from a single piece of material, although the present disclosure is not limited thereto. For example, the segments 115, 156, 158 can be integral to one another, with the side segments 156, 158 bent back to form the substantially U-shaped configuration of panel assembly 112.

Exemplary first and second side segments 156, 158 are substantially parallel relative to each other and define sides of the panel assembly 112. Exemplary front panel segment 115 is substantially perpendicular to first and second side segments 156, 158, although the present disclosure is not limited thereto. Rather, it is noted that front panel segment 115 can be angled (e.g., similar to panel segment 15 of FIG. 1). As such, assembly 112 (e.g., front panel segment 115) can take a variety of shapes, forms and/or geometries.

FIGS. 11 and 45 show another exemplary panel assembly 12' of the present disclosure. Similar to panel assembly 112 (and panel assembly 12), exemplary panel assembly 12' defines a substantially U-shaped configuration, including the front panel surface/segment 15, a first side segment 56, and a second side segment 58.

In exemplary embodiments and as shown in FIGS. 14-16, 44 and 46, panel assembly 112 (or assembly 12', or assembly 12 - FIGS. 1-6, 11-13 and 45) can be movably mounted relative to bracket members 20, 22 via one or more slots 30, 30' of bracket members 20, 22 (FIG. 28). As noted above, pull tab members 32, 132 of panel assembly 12, 12', 112 can facilitate movement of panel assembly 12, 12', 112 relative to bracket members 20, 22.

Moreover and as discussed in detail above, cable management plate 26 can move relative to bracket members 20, 22 via slots 31 of cable management plate 26 (FIG. 37). In exemplary embodiments, movement or sliding of cable management plate 26 relative to bracket members 20, 22 can be independent from movement of panel assembly 12, 12', 112 relative to bracket members 20, 22. Cable management plate 26 can therefore be extended from the media patching system 10 without affecting the position of panel assembly 12, 12', 112 (e.g., for cable management purposes).

With reference to FIG. 44, the inner surface of first side segment 156 can include one or more protrusion members 160 (e.g., panel fasteners, panel screws, PEMs, etc.) that extend inwards from the inner surface of first side segment 156. Similarly, the inner surface of second side segment 158 can include one or more protrusion members 160.

Moreover, the outer surface of first side segment 156 can include one or more protrusion members 160, and the outer surface of second side segment 158 can include one or more protrusion members 160. The distal end of first and second side segments 156, 158 each can include an aperture 162 therethrough (e.g., rectangular, polygonal, circular aperture 162, etc.).

Similarly and as shown in FIG. 45, the inner and outer surfaces of first side segment 56 can include one or more protrusion members 60, and the inner and outer surfaces of second side segment 58 can include one or more protrusion members 60. The distal end of first and second side segments 56, 58 each can include an aperture 62 therethrough.

In exemplary embodiments and as shown in FIGS. 44-47, a motion limiter member 64 is configured and dimensioned to be mounted with respect to the inner surface of each distal end of first and second side segments 56, 58, 156, 158 of panel assembly 12' or 112.

More particularly and as depicted in FIG. 45, each motion limiter member 64 is configured to mount to one or more inner protrusion members 60 (or 160) of segments 56, 58 (or 156, 158), with a portion of a tab member 65 (e g , cammed tab member 65) of the motion limiter member 64 protruding and extending through each aperture 62, 162 (e.g., extending through each aperture 62, 162 and beyond the outer surface of segments 56, 58, 156, 158).

As shown in FIG. 47, exemplary motion limiter member 64 includes one or more fastener features 66 (e.g., three fastener features 66), with each fastener feature 66 configured to releasably mount to an inner protrusion member 60, 160. One or more fastener features 66 can include members that snap-fit onto a protrusion member 60, 160.

With reference to FIGS. 28 and 44-46, to mount panel assembly 112, 12' (or 12) to bracket members 20, 22, a user can position segments 56, 58, 156, 158 of panel assembly 112, 12' (or 12) between bracket members 20, 22 (e.g., prior to or after bracket members 20, 22 are mounted to rack 350 via apertures 23) so that one or more protrusion members 60, 160 of the outer surface of segments 56, 58, 156, 158 are each positioned within an enlarged portion 37 of slots 30, 30' of bracket members 20, 22.

The panel assembly 112, 12' can then be moved back toward the distal end 43 of bracket members 20, 22 until each outer protrusion member 60, 160 within slots 30, 30' reaches the distal end of slots 30, 30' (FIG. 46), and with a portion of each tab member 65 of the mounted motion limiter member 64 protruding/extending through each aperture 62, 162 and also protruding/extending through each distal slot portion 39 of bracket members 20, 22. As such and in this position, each aperture 62, 162 (and each tab member 65) is respectively aligned with a distal slot portion 39 of a bracket member 20, 22.

However, it is noted that some embodiments may not include a motion limiter member 64 mounted to segments 56, 58, 156 and/or 158, and therefore in this position each aperture 62, 162 is respectively aligned with a distal slot portion 39 of a bracket member 20, 22 without the tab member 65 extending through aligned apertures 62, 162 and slot portions 39 (FIG. 46). With respect to FIG. 46, it is noted that a motion limiter member 64 can be mounted to the inner surfaces of segments 156, 158, as similarly shown in FIG. 45 for panel assembly 12', with the tab member 65 extending through aligned apertures 162 and slot portions 39 in the position shown in FIG. 46.

It is noted that prior to or after mounting the panel assembly 112, 12' (or 12) to bracket members 20, 22, the connector assemblies/connective devices 14, 14A, 14B, 14C and/or 14D can be mounted with respect to panel assembly 112, 12', 12 (FIGS. 3-6, 13, 16, 26, 27), as discussed above.

For example, prior to or after mounting the panel assembly 112 to bracket members 20, 22 as shown in FIG. 46, each aperture 113 of panel assembly 112 can have a connector assembly/connective device 14, 14A, 14B, 14C or 14D mounted with respect thereto (e.g., via bezel members 144, 146 or 148). Similarly, prior to or after mounting the panel assembly 12, 12' to bracket members 20, 22, each aperture 13 of panel assembly 12, 12' can have a connector assembly/connective device 14, 14A or 14B mounted with respect thereto (FIGS. 3-6, 13).

It is noted that a user can move/pull (e.g., via pull tab members 32, 132) the panel assembly 112, 12', 12 from the position shown in FIG. 46 toward the proximal end 41 of second segment 402 of bracket member 20, 22 (FIGS. 28 and 46), with the tab members 65 extending through apertures 62, 162 being released from slot portions 39, and then the panel assembly 112, 12', 12 moving toward proximal end 41 and relative to bracket members 20, 22 with the outer protrusion members 60, 160 traveling within slots 30, 30' until the panel assembly 112, 12', 12 reaches a desired proximal position determined by the user.

For example, the user can move the panel assembly 112, 12', 12 toward proximal end 41 until the tab members 65 extending through apertures 62, 162 also extend through aligned slot portions 29 of slot 30', and with the outer protrusion members 60, 160 positioned within slots 30, 30'. In such a position (tabs 65 in slots 29), a user can easily access and manage the connector assemblies/connective devices 14, 14A, 14B, 14C, 14D of panel assembly 112, 12', 12 (e g , manage, access, plug, unplug the media, cables, wires, fibers, ports, etc. to or from 14, 14A, 14B, 14C, 14D), and/or mount/replace/remove/repair the connector assemblies/connective devices 14, 14A, 14B, 14C, 14D of panel assembly 112, 12', 12.

In this regard, it is noted that when panel assembly 112, 12', 12 is in such a forward position (e.g., with tab members 65 extending through apertures 62, 162 also extending through aligned slot portions 29 of slot 30'), the slot portions 29, via tab members 65 extending therethrough, provide a stop position for panel assembly 112, 12', 12 such that users can easily access and manage assemblies/devices 14, 14A, 14B, 14C, 14D (e.g., when the panel assembly 12', 112, is moved proximally away from the back position shown in FIG. 46).

After a user is done with panel assembly 112, 12', 12 in the forward position (tab members 65 through slot portions 29), the user can move the panel assembly 112, 12', 12 distally to the back position shown in FIG. 46. For example, with user force (distally—via members 32, 132) the tab members 65 can be released from slot portions 29, and then the panel assembly 112, 12', 12 can be moved toward distal end 43 (relative to bracket members 20, 22) with the outer protrusion members 60, 160 traveling within slots 30, 30' until the panel assembly 112, 12', 12 reaches the distal end of slots 30, 30' and with tab members 65 extending through distal slot portions 39. In the back position shown in FIG. 46, it is noted that the panel assembly 112, 12', 12 is also prevented from moving further distally because the top and bottom flanges 68, 70 of second segment 402 (FIG. 9) engage/contact with the respective top and bottom flanges 72, 74, 172, 174 of panel assembly 112, 12', 12 (FIGS. 44-46) when the panel assembly 112, 12', 12 is at or near the back position shown in FIG. 46.

Alternatively, after a user is done with panel assembly 112, 12', 12 in the forward position (tab members 65 through slot portions 29), the user can move the panel assembly 112, 12', 12 even more proximally with the outer protrusion members 60, 160 traveling within slots 30, 30' until the panel assembly 112, 12', 12 reaches the proximal end 41 of slots 30, 30'. At such proximal position, the outer protrusion members 60, 160 are positioned within the enlarged portions 37 of slots 30, 30', and the user can also easily access and manage the assemblies/connective devices 14, 14A, 14B, 14C, 14D, or the user can remove/replace the panel assembly 112, 12', 12 from bracket members 20, 22 (e.g., via removing/disengaging the outer protrusion members 60, 160 from enlarged portions 37 of slots 30, 30').

It is noted that when panel assembly 112, 12', 12 is mounted relative to bracket members 20, 22 via outer protrusion members 60, 160 traveling within slots 30, 30', the user can advantageously move/position the panel assembly 112, 12', 12 to a desired position along slots 30, 30' for access and/or management purposes (e.g., to easily access/manage the assemblies/connective devices 14, 14A, 14B, 14C, 14D). Additionally, a user can easily remove or replace a panel assembly 112, 12', 12 from bracket members 20, 22, as noted above. Further, it is noted that when outer protrusion members 60, 160 travel within slots 30, 30' (e.g., proximally or distally), the slots 30, 30' advantageously prevent binding of the sliding panel assembly 112, 12', 12 as it slides/moves proximally or distally.

Turning now to FIGS. 48-50, an alternative panel assembly 112' and alternative bracket members 20', 22' for use with media patching system 10, 100 is shown. It is noted that assemblies 12, 12' discussed above can have similar features/structures as panel assembly 112', as described further below, and such panel assemblies 12, 12' having similar features/structures as panel assembly 112' can be utilized with media patching system 10, 100 as well.

The panel assembly 112' and bracket members 20', 22' can be structurally and functionally similar to the panel assembly 112 and bracket members 20, 22 discussed above, with some differences.

With reference to FIGS. 48 and 50, each exemplary bracket member 20', 22' defines a substantially z-shaped configuration, including a first planar segment 401, a second planar segment 402, and a third planar segment 403 connecting the first and second planar segments 401, 402.

One or more slots 30, 30' can extend along a length defined by second segment 402. Second segment 402 can include top and bottom slots 30, and a middle slot 30' positioned between the top and bottom slots 30.

In exemplary embodiments, one or more slots 30, 30' include a downward angled slot portion 27. Each slot portion 27 can take a variety of forms/shapes/angles. Each angled slot portion 27 can be positioned at a suitable position along the length of slots 30, 30' (e.g., approximately one-third or one-half of the way along the length of slots 30, 30'; at or near the proximal or distal end of slots 30, 30', etc.).

The proximal ends 41 of slots 30, 30' can include enlarged portions 37 (e.g., positioned proximal to proximal end 41 of second segment 402). Enlarged portions 37 can take a variety of forms/shapes.

The distal ends 43 of slots 30, 30' can include downward angled slot portion 25. Each slot portion 25 can take a variety of forms/shapes/angles.

With reference to FIG. 49, exemplary panel assembly 112' defines a substantially U-shaped configuration, including the front panel segment 115, a first side segment 156, and a second side segment 158. It is noted that front panel segment 115 can be angled (e g , similar to panel segment 15 of FIG. 1). As such, assembly 112' (e.g., front panel segment 115) can take a variety of shapes, forms and/or geometries.

As shown in FIG. 50, panel assembly 112' can be movably mounted relative to bracket members 20', 22' via one or more slots 30, 30'. Pull tab members 32, 132 can facilitate movement of assembly 112' relative to bracket members 20', 22'. Moreover and as discussed above, the movement of cable management plate 26 relative to bracket members 20', 22' can be independent from movement of panel assembly 112' relative to bracket members 20', 22'.

With reference to FIG. 49, the outer surface of first side segment 156 can include one or more protrusion members 160 (e.g., three members 160), and the outer surface of second side segment 158 can include one or more protrusion members 160.

With reference to FIGS. 48-50, to mount panel assembly 112' to bracket members 20', 22', a user can position segments 156, 158 of panel assembly 112' between bracket members 20', 22' so that one or more protrusion members 160 of the outer surface of segments 156, 158 are each positioned within an enlarged portion 37 of slots 30, 30' of bracket members 20', 22'.

The panel assembly 112' can then be moved back toward the distal end 43 of bracket members 20', 22' until each outer protrusion member 160 within slots 30, 30' reaches the distal end of slots 30, 30' (FIG. 50), and with each outer protrusion member 160 positioned within a downward angled slot portion 25.

It is noted that prior to or after mounting the panel assembly 112' to bracket members 20', 22', assemblies/ devices 14, 14A, 14B, 14C and/or 14D can be mounted with respect to panel assembly 112', as discussed above.

It is noted that a user can move/pull (e.g., via pull tab members 132) the panel assembly 112' from the position shown in FIG. 50 toward the proximal end 41, with the protrusion members 160 being removed each downward angled slot portion 25, and with the panel assembly 112' then moving toward proximal end 41 and relative to bracket members 20', 22' with the outer protrusion members 160 traveling within slots 30, 30' until the panel assembly 112' reaches a desired proximal position determined by the user.

For example, the user can move the panel assembly 112' toward proximal end 41 until the outer protrusion members 160 are positioned within downward angled slot portions 27. In such a position, a user can easily access and manage the assemblies 14, 14A, 14B, 14C, 14D, and/or mount/remove the assemblies 14, 14A, 14B, 14C, 14D.

In this regard, it is noted that when panel assembly 112' is in such a forward position (e.g., with outer protrusion members 160 within downward angled slot portions 27), the slot portions 27 provide a stop position for panel assembly 112' such that users can easily access and manage assemblies 14, 14A, 14B, 14C, 14D.

After a user is done with panel assembly 112' in the forward position (protrusion members 160 within downward angled slot portions 27), the user can move the panel assembly 112' distally to the back position shown in FIG. 50, as discussed above.

Alternatively, after a user is done with panel assembly 112' in the forward position (protrusion members 160 within downward angled slot portions 27), the user can move the panel assembly 112' even more proximally with the outer protrusion members 160 traveling within slots 30, 30' until the panel assembly 112' reaches the proximal end 41 of slots 30, 30'. At such proximal position, the outer protrusion members 160 are positioned within the enlarged portions 37 of slots 30, 30', and the user can also easily access and manage the assemblies 14, 14A, 14B, 14C, 14D, or the user can remove/replace the panel assembly 112' from bracket members 20', 22' (e.g., via removing/disengaging the outer protrusion members 160 from enlarged portions 37 of slots 30, 30').

It is noted that when panel assembly 112' is mounted relative to bracket members 20', 22' via outer protrusion members 160 traveling within slots 30, 30', the user can advantageously move/position the panel assembly 112' to a desired position along slots 30, 30' for access and/or management purposes (e.g., to easily access/manage the assemblies/connective devices 14, 14A, 14B, 14C, 14D). Additionally, a user can easily remove or replace a panel assembly 112' from bracket members 20', 22', as noted above.

Turning now to FIGS. 51-53, an alternative panel assembly 512 and alternative bracket members 520, 522 for use with media patching system 10, 100 is shown. It is noted that assemblies 12, 12' discussed above can have similar features/structures as panel assembly 512, as described further below, and such panel assemblies 12, 12' having similar features/structures as panel assembly 512 can be utilized with media patching system 10, 100 as well.

The panel assembly 512 and bracket members 520, 522 can be structurally and functionally similar to the panel assemblies 12, 112 and bracket members 20, 22 discussed above, with some differences.

With reference to FIGS. 51 and 53, each exemplary bracket member 520, 522 defines a substantially z-shaped configuration, including a first planar segment 501, a second planar segment 502, and a third planar segment 503 connecting the first and second planar segments 501, 502.

First and second slots 530, 530' (e.g., rectangular slots 530, 530') can extend along a length defined by second planar segment 502. Each slot 530, 530' can take a variety of forms/shapes/lengths. In exemplary embodiments, slots 530, 530' are spaced apart from one another on segment 502, and are substantially axially aligned with one another along segment 502.

As shown in FIG. 51, exemplary bracket members 520, 522 include first top and first bottom flanges 568, 570 of second segment 502. Exemplary bracket members 520, 522 also include second top and second bottom flanges 568A, 570A, third top and third bottom flanges 568B, 570B, fourth top and fourth bottom flanges 568C, 570C, fifth top and fifth bottom flanges 568D, 570D, and sixth top and sixth bottom flanges 568E, 570E.

In certain embodiments, first top and first bottom flanges 568, 570 and third top and third bottom flanges 568B, 570B take the form of C-shaped flanges or the like. Second top and second bottom flanges 568A, 570A, fourth top and fourth bottom flanges 568C, 570C, fifth top and fifth bottom flanges 568D, 570D, and sixth top and sixth bottom flanges 568E, 570E take the form of L-shaped flanges or the like. It is noted that bracket members 520, 522 can include other numbers/permutations of top/bottom flanges (e.g., four top/bottom flanges, seven top/bottom flanges, etc.), and that each flange can take a variety of shapes/structures/designs.

With reference to FIG. 52, exemplary panel assembly 512 defines a substantially U-shaped configuration, including the front panel segment 515, a first side segment 556, and a second side segment 558. It is noted that front panel segment 515 can be angled (e.g., similar to panel segment 15 of FIG. 1). As such, panel assembly 512 (e.g., front panel segment 515) can take a variety of shapes, forms and/or geometries.

As shown in FIG. 52, the outer surface of first side segment 556 can include one or more tab members 576 (e.g., a cammed or hemmed tab member 576), and the outer surface of second side segment 558 can include one or more tab members 576 (e.g., a cammed or hemmed tab member 576).

The top inner surface of exemplary side segments 556, 558 includes an enlarged section 578 (e.g., folded/molded section 578) that extends along a length of side segments 556, 558 (e.g., extends substantially along top inner surface of side segments 556, 558). Likewise, the bottom inner surface of side segments 556, 558 includes an enlarged section 580 (e.g., folded/molded section 580) that extends along a length of side segments 556, 558 (e.g., extends substantially along bottom inner surface of side segments 556, 558).

As shown in FIG. 53, panel assembly 512 can be movably mounted relative to bracket members 520, 522 via one or more slots 530, 530', and/or by positioning enlarged sections 578, 580 of side segments 556, 558 within the first top and first bottom flanges 568, 570 and within the third top and third bottom flanges 568B, 570B of bracket members 520, 522 (FIG. 53). Pull tab members 32, 132 can facilitate movement of assembly 512 relative to bracket members 520, 522. Moreover and as discussed above, the movement of cable management plate 26 relative to bracket members 520, 522 can be independent from movement of panel assembly 512 relative to bracket members 520, 522.

With reference to FIGS. 51-53, to mount panel assembly 512 to bracket members 520, 522, a user can position segments 556, 558 of panel assembly 512 between bracket members 520, 522 so that the distal ends of enlarged sections 578, 580 of side segments 556, 558 are inserted into/within the first top and first bottom flanges 568, 570, and then into/within the third bottom flanges 568B, 570B of bracket members 520, 522 (FIG. 53).

The tab members 576 of segments 556, 558 can then each be positioned within respective slots 530' of bracket members 520, 522.

The panel assembly 512 can then be moved back toward the distal end 543 of bracket members 520, 522 until each tab member 576 within slots 530' reaches the distal end of slots 530' (FIG. 53), and/or until first top and first bottom flanges 568, 570 of second segment 502 engage/contact with the respective top and bottom flanges 572, 574 of panel assembly 512 (FIG. 53).

It is noted that prior to or after mounting the panel assembly 512 to bracket members 520, 522, assemblies 14, 14A, 14B, 14C and/or 14D can be mounted with respect to panel assembly 512, as similarly discussed above.

In use, a user can move/pull (e.g., via pull tab members 132) the panel assembly 512 from the position shown in FIG. 53 toward the proximal end 541, with the tab members 576 moving proximally in slots 530' until they are proximally removed from each slot 530', with the panel assembly 512 then moving toward proximal end 541 with the enlarged sections 578, 580 traveling within the flanges 568, 570, 568B, 570B until the panel assembly 512 reaches a desired proximal position determined by the user.

For example, after the tab members 576 are proximally removed from the slots 530', the panel assembly 512 can be moved toward proximal end 541 with the enlarged sections 578, 580 traveling within the flanges 568, 570, 568B, 570B until the tab members 576 are positioned within slots 530.

In such a position (tabs 576 within slots 530), a user can easily access and manage the assemblies 14, 14A, 14B, 14C, 14D, and/or mount/remove the assemblies 14, 14A, 14B, 14C, 14D from panel assembly 512.

In this regard, it is noted that when panel assembly 512 is in such a forward position (e.g., tabs 576 within slots 530), the slots 530 provide a stop position for panel assembly 512 such that users can easily access and manage assemblies 14, 14A, 14B, 14C, 14D.

After a user is done with panel assembly 512 in the forward position (tabs 576 within slots 530), the user can move the panel assembly 512 distally to the back position shown in FIG. 53, as discussed above.

Alternatively, after a user is done with panel assembly 512 in the forward position (tabs 576 within slots 530), the user can move the panel assembly 512 even more proximally with the tab members 576 traveling within slots 530 until they are proximally removed from slots 530. The user can then continue to slide the panel assembly 512 proximally until the enlarged sections 578, 580 no longer travel within the flanges 568, 570, 568B, 570B. The user can then remove/replace the panel assembly 512 from bracket members 520, 522.

It is noted that when panel assembly 512 is mounted relative to bracket members 520, 522 as discussed above, the user can advantageously move/position the panel assembly 512 to a desired position along bracket members 520, 522 for access and/or management purposes (e.g., to easily access/manage the assemblies/connective devices 14, 14A, 14B, 14C, 14D). Additionally, a user can easily remove or replace a panel assembly 512 from bracket members 520, 522, as noted above.

Turning now to FIGS. 54-56, an alternative panel assembly 612 and alternative bracket members 620, 622 for use with media patching system 10, 100 is shown. It is noted that assemblies 12, 12' discussed above can have similar features/structures as panel assembly 612, as described further below, and such panel assemblies 12, 12' having similar features/structures as panel assembly 612 can be utilized with media patching system 10, 100 as well.

The panel assembly 612 and bracket members 620, 622 can be structurally and functionally similar to the panel assemblies 12, 112 and bracket members 20, 22 discussed above, with some differences.

With reference to FIGS. 54 and 56, each exemplary bracket member 620, 622 defines a substantially z-shaped configuration, including a first planar segment 601, a second planar segment 602, and a third planar segment 603 connecting the first and second planar segments 601, 602.

At least one slot 630 (e.g., rectangular slot 630) can extend along a length defined by second segment 602. Each slot 630 can take a variety of forms/shapes/lengths.

As shown in FIGS. 54 and 56, the inner surface of second segment 602 includes one or more protrusion members 660. In exemplary embodiments, the top inner surface of second segment 602 includes a plurality of protrusion members 660 (e.g., three members 660) that are spaced apart from one another along a length of the top inner surface of second segment 602. Similarly, the bottom inner surface of second segment 602 includes a plurality of protrusion members 660 (e.g., three members 660) that are spaced apart from one another along a length of the bottom inner surface of second segment 602.

With reference to FIG. 55, exemplary panel assembly 612 defines a substantially U-shaped configuration, including the front panel segment 615, a first side segment 656, and a second side segment 658. It is noted that front panel segment 615 can be angled (e g , similar to panel segment 15 of FIG. 1). As such, panel assembly 612 (e.g., front panel segment 615) can take a variety of shapes, forms and/or geometries.

As shown in FIG. 55, the outer surface of first side segment 656 can include one or more tab members 676 (e.g., a cammed or hemmed tab member 676), and the outer surface of second side segment 658 can include one or more tab members 676 (e.g., a cammed or hemmed tab member 676).

As shown in FIG. 56, panel assembly 612 can be movably mounted relative to bracket members 620, 622 via one or more slots 630, and/or by positioning the top and bottom edges 678, 680 of side segments 656, 658 between: (i) the plurality of protrusion members 660 that are spaced apart from one another along a length of the top inner surface of second segment 602, and (ii) the plurality of protrusion members 660 that are spaced apart from one another along a length of the bottom inner surface of second segment 602 (FIG. 56). Pull tab members 32, 132 can facilitate movement of assembly 612 relative to bracket members 620, 622. Moreover and as discussed above, the movement of cable management plate 26 relative to bracket members 620, 622 can be independent from movement of panel assembly 612 relative to bracket members 620, 622.

With reference to FIGS. 54-56, to mount panel assembly 612 to bracket members 620, 622, a user can position segments 656, 658 of panel assembly 612 between bracket members 620, 622 so that the distal ends of top and bottom edges 678, 680 of side segments 656, 658 are positioned between/against the first proximal top/bottom protrusion members 660 of second segment 602 (FIG. 56).

The panel assembly 612 can then be moved back toward the distal end 643 of bracket members 620, 622 until each tab member 676 is positioned within respective slots 630 of bracket members 620, 622, and while the top and bottom edges 678, 680 of side segments 656, 658 are positioned between/against the top/bottom protrusion members 660 of second segment 602.

The panel assembly 612 can then be moved back toward the distal end 643 of bracket members 620, 622 until each tab member 676 within slots 630 reaches the distal end of slots 630 (FIG. 56), and/or until first top and first bottom flanges 668, 670 of second segment 602 engage/contact with the respective top and bottom flanges 672, 674 of panel assembly 612 (FIG. 56).

It is noted that prior to or after mounting the panel assembly 612 to bracket members 620, 622, assemblies 14, 14A, 14B, 14C and/or 14D can be mounted with respect to panel assembly 612, as similarly discussed above.

In use, a user can move/pull (e.g., via pull tab members 132) the panel assembly 612 from the position shown in FIG. 56 toward the proximal end 641, with the tab members 676 moving proximally in slots 630 until they are proximally removed from each slot 630, with the panel assembly 612 then moving toward proximal end 641 with the top and bottom edges 678, 680 traveling between/against the top/bottom protrusion members 660 of second segments 602 until the panel assembly 612 reaches a desired proximal position determined by the user. In such user desired positions, a user can easily access and manage the assemblies 14, 14A, 14B, 14C, 14D, and/or mount/remove the assemblies 14, 14A, 14B, 14C, 14D from panel assembly 612.

After a user is done with panel assembly 612 in a desired forward position, the user can move the panel assembly 612 distally to the back position shown in FIG. 56, as discussed above.

Alternatively, after a user is done with panel assembly 612 in a desired position, the user can move the panel assembly 612 proximally until the top/bottom edges 678, 680 no longer travel between/against the top/bottom protrusion members 660 of second segments 602. The user can then remove/replace the panel assembly 612 from bracket members 620, 622.

It is noted that when panel assembly 612 is mounted relative to bracket members 620, 622 as discussed above, the user can advantageously move/position the panel assembly 612 to a desired position along bracket members 620, 622 for access and/or management purposes (e.g., to easily access/manage the assemblies/connective devices 14, 14A, 14B, 14C, 14D). Additionally, a user can easily remove or replace a panel assembly 612 from bracket members 620, 622, as noted above.

Turning now to FIGS. 57-58, and also with reference to FIG. 55, alternative bracket members 720, 722 for use with media patching system 10, 100 is shown. The bracket members 720, 722 can be structurally and functionally similar to the bracket members 20, 22 discussed above, with some differences.

With reference to FIGS. 57-58, each exemplary bracket member 720, 722 defines a substantially z-shaped configuration, including a first planar segment 701, a second planar segment 702, and a third planar segment 703 connecting the first and second planar segments 701, 702.

First and second slots 730, 730' (e.g., rectangular slots 730, 730') can extend along a length defined by second segment 702. Each slot 730, 730' can take a variety of forms/shapes/lengths. In exemplary embodiments, slots 730, 730' are spaced apart from one another on segment 702, and are substantially axially aligned with one another along segment 702.

As shown in FIGS. 57-58, the inner surface of second segment 702 includes one or more protrusion members 760.

In exemplary embodiments, the top inner surface of second segment 702 includes a plurality of protrusion members 760 (e.g., three members 760) that are spaced apart from one another along a length of the top inner surface of second segment 702. Similarly, the bottom inner surface of second segment 702 includes a plurality of protrusion members 760 (e.g., three members 760) that are spaced apart from one another along a length of the bottom inner surface of second segment 702.

As shown in FIG. 58, panel assembly 612 (FIG. 55) can be movably mounted relative to bracket members 720, 722 via one or more slots 730, 730', and/or by positioning the top and bottom edges 678, 680 of side segments 656, 658 (FIGS. 55 and 58) between: (i) the plurality of protrusion members 760 that are spaced apart from one another along a length of the top inner surface of second segment 702, and (ii) the plurality of protrusion members 760 that are spaced apart from one another along a length of the bottom inner surface of second segment 702 (FIGS. 57-58). Pull tab members 32, 132 can facilitate movement of assembly 612 relative to bracket members 720, 722. Moreover and as discussed above, the movement of cable management plate 26 relative to bracket members 720, 722 can be independent from movement of panel assembly 612 relative to bracket members 720, 722.

With reference to FIGS. 57-58, to mount panel assembly 612 to bracket members 720, 722, a user can position segments 656, 658 of panel assembly 612 between bracket members 720, 722 so that the distal ends of top and bottom edges 678, 680 of side segments 656, 658 are positioned between/against the first proximal top/bottom protrusion members 760 of second segment 702 (FIG. 58).

The panel assembly 612 can then be moved back toward the distal end 743 of bracket members 720, 722 until each tab member 676 is positioned within respective slots 730' of bracket members 720, 722, and while the top and bottom edges 678, 680 of side segments 656, 658 are positioned between/against the top/bottom protrusion members 760 of second segment 702.

The panel assembly 612 can then be moved back toward the distal end 743 of bracket members 720, 722 until each tab member 676 within slots 730' reaches the distal end of slots 730' (FIG. 58), and/or until top and bottom flanges 768, 770 of second segment 702 engage/contact with the respective top and bottom flanges 672, 674 of panel assembly 612 (FIG. 58).

It is noted that prior to or after mounting the panel assembly 612 to bracket members 720, 722, assemblies 14, 14A, 14B, 14C and/or 14D can be mounted with respect to panel assembly 612, as similarly discussed above.

In use, a user can move/pull (e.g., via pull tab members 132) the panel assembly 612 from the position shown in FIG. 58 toward the proximal end 741, with the tab members 676 moving proximally in slots 730' until they are proximally removed from each slot 730', with the panel assembly 612 then moving toward proximal end 741 with the top and bottom edges 678, 680 traveling between/against the top/bottom protrusion members 760 of second segments 702 until the panel assembly 612 reaches a desired proximal position determined by the user.

For example, after the tab members 676 are proximally removed from the slots 730', the panel assembly 612 can be moved toward proximal end 741 until the tab members 676 are positioned within slots 730. In such a position (tabs 676 within slots 730), a user can easily access and manage the assemblies 14, 14A, 14B, 14C, 14D, and/or mount/remove the assemblies 14, 14A, 14B, 14C, 14D from panel assembly 612. In this regard, it is noted that when panel assembly 612 is in such a forward position (e.g., tabs 676 within slots 730), the slots 730 provide a stop position for panel assembly 612 such that users can easily access and manage assemblies 14, 14A, 14B, 14C, 14D.

After a user is done with panel assembly 612 in a desired forward position, the user can move the panel assembly 612 distally to the back position shown in FIG. 58, as similarly discussed above.

Alternatively, after a user is done with panel assembly 612 in a desired position, the user can move the panel assembly 612 proximally until the top/bottom edges 678, 680 no longer travel between/against the top/bottom protrusion members 760 of second segments 702. The user can then remove/replace the panel assembly 612 from bracket members 720, 722.

It is noted that when panel assembly 612 is mounted relative to bracket members 720, 722 as discussed above, the user can advantageously move/position the panel assembly 612 to a desired position along bracket members 720, 722 for access and/or management purposes (e.g., to easily access/manage the assemblies/connective devices 14, 14A, 14B, 14C, 14D). Additionally, a user can easily remove or replace a panel assembly 612 from bracket members 720, 722, as noted above.

As noted above and as shown in FIG. 59, the movement of cable management plate 26 relative to bracket members 520, 522 can be independent from movement of panel assembly 512 relative to bracket members 520, 522.

It is noted that FIG. 59 depicts: (i) cable management plate 26 mounted relative to bracket members 520, 522, and (ii) panel assembly 512 mounted relative to bracket members 520, 522.

However, it is noted that the other panel assemblies (e.g., 12, 12', 112, 112', 612) disclosed herein can also be similarly mounted relative to their respective bracket members (e.g., 20, 22, 20', 22', 620, 622, 720, 722), and also with the cable management plate 26 mounted relative to exemplary bracket members (e.g., 20, 22, 20', 22', 620, 622, 720, 722) of the present disclosure. As such, cable management plate 26 can therefore be extended from the media patching system 10, 100 without affecting the position of panel assembly 12, 12', 112, 112', 512, 612 (e.g., for cable management purposes).

With reference again to FIGS. 1, 9, 10, 26 and 28, a cable management member 24 can be removably/interchangeably mounted with respect to each bracket member 20, 22 for cable/wire 38, 40 management purposes of system 10.

As shown in FIGS. 9 and 28, the inner surface of first segment 401 of each bracket member 20, 22 can include one or more protrusion members 60 (e.g., four panel fasteners, panel screws, PEMs, etc.) that extend inwards from the inner surface of first segment 401. As shown in FIG. 10, each cable management member 24 can include one or more corresponding securement slots 82 (e.g., four keyhole slots 82) that allow the cable management member 24 to be releasably secured to a respective protrusion member 60 of segment 401 (FIGS. 1, 9 and 10). Cable management member 24 can also include a tab member 84 that releasably secures to a slot 86 of segment 401 when member 24 is releasably secured or mounted with respect to bracket member 20, 22.

As shown in FIG. 10, cable management member 24 can include one or more extension arms 88 (e.g., cable management arms 88, bend limiting arms 88, etc.) for cable management purposes. In exemplary embodiments, member 24 includes four extension arms 88, with the top extension arm 88 and the arm 88 below it defining a first cable/wire passageway P1, with the middle two extension arms 88 defining a second cable/wire passageway P2, and with the bottom extension arm 88 and the arm 88 above it defining a third cable/wire passageway P3. It is noted that member 24 can include other suitable numbers of arms 88 and respective cable/wire passageways. In general, after member 24 is mounted with respect to bracket member 20, 22, the extension arms 88 and passageways P1, P2, P3 are exposed by open section 90 of segment 401 (e.g., so that user-selected cables/wires 38, 40 can pass through passageways P1, P2, P3 and out of bracket members 20, 22 for cable management purposes—FIG. 26).

As shown in FIG. 10, the top extension arm 88 can include a locking portion 92 that removably locks/unlocks with door assembly 36 (FIG. 1), and the bottom extension arm 88 can include a hinged portion 93 that allows door assembly 36 to hinge relative thereto.

Cable management member 24 can also include various attachment features for removably securing top cover member 33 (FIG. 8) and/or bottom cover member 94 (FIG. 14) to member 24. For example and as shown in FIG. 10, the top and bottom surfaces of member 24 can each include a post member 67 that is configured and dimensioned to mount with respect to a corresponding aperture on top cover member 33 and/or bottom cover member 94. Moreover, the top and bottom surfaces of member 24 can each include an aperture 69 that is configured to be mounted/aligned with respect to a corresponding aperture on top cover member 33 and/or bottom cover member 94, with a fastener member then positioned through the aligned apertures for securement purposes. In some embodiments, it is noted that top cover member 33 and/or bottom cover member 94 can be removably mounted with respect to cable management members 24 before the members 24 are removably mounted with respect to bracket members 20, 22, although the present disclosure is not limited thereto. As such, covers 33 and/or 94 can be attached to members 24 as one assembly for easy insertion and removal from rack-mounted bracket members 20, 22. In other embodiments, members 33 and/or 94 are removably mounted to members 24 after members 24 are mounted to brackets 20, 22.

It is noted that FIGS. 1 and 9-10 depict a cable management member 24 mounted relative to bracket members 20, 22. However, it is noted that cable management member 24 can also be similarly mounted with respect to the other bracket members (e.g., 20', 22', 520, 522, 620, 622, 720, 722) disclosed herein via similar inner protrusion members 60 or the like of the bracket members.

With reference to FIGS. 8, 9 and 28, the top flange 68 of segment 402 of bracket members 20, 22 can include one or more protrusion members 60 that extend downward from top flange 68. In general, each protrusion member 60 of top flange 68 is configured and dimensioned to releasably secure to apertures/slots or the like of optional top cover member 34 (FIG. 8).

In another embodiment and as shown in FIG. 46, the top flange 168 of segment 401 of bracket members 20, 22 can include one or more protrusion members 60 that extend downward from top flange 168, and the bottom flange 170 of segment 401 of bracket members 20, 22 can include one or more protrusion members 60 that extend upwards from bottom flange 170. In general, the protrusion members 60 of flanges 168, 170 are configured and dimensioned to releasably secure to apertures/slots or the like of optional top cover member 33 and/or optional bottom cover member 94.

Likewise and as shown in FIG. 46, flanges 168, 170 can include one or more apertures 169 that are configured to be mounted/aligned with respect to a corresponding aperture or dimple on top cover member 33 and/or bottom cover member 94, with the dimple (or a separate fastener member) then positioned through the aligned apertures/dimples for securement purposes. Similarly and as shown in FIG. 48, the top flange 68 of segment 402 can include one or more apertures 169 that are configured to be mounted/aligned with respect to a corresponding aperture or dimple on top cover member 34, with the dimple (or a separate fastener member) then positioned through the aligned apertures/dimples for securement purposes. It is further noted that the other bracket members (e.g., 20', 22', 520, 522, 620, 622, 720, 722) disclosed herein can have similar protrusion members 60 and/or apertures 169 for securement purposes of covers 33, 34 and/or 94 to the bracket members (e.g., 20', 22', 520, 522, 620, 622, 720, 722).

In another embodiment and as shown in FIGS. 51, 53 and 60, cable management member 124 can be removably/interchangeably mounted with respect to each bracket member 520, 522 for cable/wire management purposes. Cable management member 124 can be structurally and functionally similar to the cable management member 24 discussed above, with some differences. In this regard, it is noted that FIGS. 51, 53 and 60 depict a cable management member 124 mounted relative to bracket members 520, 522. However, it is noted that cable management member 124 can also be similarly mounted with respect to the other bracket members (e.g., 20, 22, 20', 22', 620, 622, 720, 722) disclosed herein via similar inner protrusion members 560, 60 or the like of the bracket members.

As shown in FIGS. 51 and 53, the inner surface of first segment 501 of each bracket member 520, 522 can include one or more protrusion members 560 that extend inwards from the inner surface of first segment 501. Each cable management member 124 can include one or more corresponding securement slots 182 that allow the cable management member 124 to be releasably secured to a respective protrusion member 560 of segment 501. Cable management member 124 can also include a tab member 184 that releasably secures to a slot 586 of segment 501.

As shown in FIG. 60, cable management member 124 can include one or more extension arms 188 for cable management purposes. In some embodiments, member 124 includes two extension arms 188, with the top extension arm 188 and the bottom arm 188 defining a cable/wire passageway P therebetween. However, it is noted that member 124 can include other suitable numbers of arms 188 and respective cable/wire passageways (e.g., four arms 188 similar to member 24, thereby defining P1, P2 and P3).

As shown in FIGS. 51, 53 and 60, the top and bottom extension arms 188 can each include an extending portion 175, which each extending portion 175 configured to releasably engage, secure and/or mount with respect to a respective slot 577 positioned on segment 501 of bracket member 520, 522 when member 124 is releasably secured to bracket member 520, 522.

With reference to FIGS. 51 and 53, it is noted that the outer side edges of cover member 34 can be positioned: (i) above first top flange 568, third top flange 568B, fourth top flange 568C, and sixth top flange 568E of brackets 520, 522, and (ii) below second top flange 568A and fifth top flange 568D of brackets 520, 522, to facilitate securement of cover member 34.

Similarly and with reference to FIGS. 57-58, it is noted that the outer side edges of cover member 34 can be positioned: (i) above the upper protrusion members 760 that extend along a length of the top inner surface of second segment 702 of brackets 720, 722, and (ii) below top flange 768 of brackets 720, 722, to facilitate securement of cover member 34. The proximal end of top flange 768 can be angled downward to provide a proximal stopping point for the front edge of cover member 34.

In exemplary embodiments and as discussed above, system 10, 100 provides users with the option of utilizing system 10, 100 as a substantially open frame system 10, 100, or as a semi-enclosed system 10, 100, or as a substantially enclosed system 10, 100. For example, a user may want to mount cover members 33, 34, 35 and 94 to system 10, 100 (and door assembly 36), thereby providing a substantially enclosed system 10, 100 (e.g., for cable management). Alternatively, a user may want to mount one or more of cover members 33, 34, 35 and/or 94 to system 10, 100, thereby providing a semi-enclosed system 10, 100. Likewise, cover members 33, 34, 35 and 94 may not be mounted to system 10, 100, thereby providing a substantially open frame system 10, 100 option to the user. Such flexible modular designs of system 10, 100 advantageously offers the ability for a substantially enclosed system 10, 100, or an open (or semi-open) system 10, 100 without extra parts.

With reference again to FIG. 43 and as discussed above, first segment 401 of bracket member 20, 22 defines the plane of Arrow A, second segment 402 defines the plane of Arrow B, and third segment 403 defines the plane of Arrow C. As noted, exemplary first and second planar segments 401, 402 can be substantially parallel relative to each other and define sides of the media patching system 10, 100.

It is noted that FIG. 43 depicts bracket members 20, 22 having segments 401, 402, 403 defining planes A, B, C. However, it is noted that the other bracket members (e.g., 20', 22', 520, 522, 620, 622, 720, 722) disclosed herein have similar segments (e.g., 501, 502, 503) that can define similar planes A, B, C.

As such, exemplary bracket members 20, 22 (and the other bracket members 20', 22', 520, 522, 620, 622, 720, 722) advantageously allow an exemplary panel assembly 112 (or 12, 12', 112', 512, 612) to be mounted with respect to bracket members 20, 22 and allow panel assembly 112 to be moved or positioned proximally or distally with the side segments 156, 158 of panel assembly 112 substantially travelling or being positioned along plane B of second segments 402 of brackets 20, 22.

Moreover, exemplary bracket members 20, 22 (and the other bracket members 20', 22', 520, 522, 620, 622, 720, 722) advantageously allow an exemplary cable management member 24 (or 124) to be mounted with respect to bracket members 20, 22 and allow cable management member 24 (e.g., extensions arms 88) to be positioned along plane A of first segments 401 of brackets 20, 22.

In short, the exemplary bracket members (20, 22, 20', 22', 520, 522, 620, 622, 720, 722) each advantageously allows for at least two different planes (plane A and plane B) that have functionality—plane A allows for the cable management member 24 to be utilized for cable management purposes substantially in or along plane A, and plane B allows for the sliding/positioning of a panel assembly substantially in or along plane B (which allows users easy access to the assemblies 14, 14A, 14B, 14C, 14D mounted to the panel assemblies).

Moreover, plane C (defined by third segment 403) allows for segment 403 to include apertures 23, with each aperture 23 configured to allow bracket member 20, 22 to be mounted with respect to rack 350 (FIG. 27) or the like.

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

What is claimed is:

1. A bracket assembly comprising:
a first bracket member having a substantially Z-shaped configuration, the first bracket member including a first segment, a second segment and a third segment, with the third segment: (i) connecting the first and second segments to define the substantially Z-shaped configuration, and (ii) having at least one aperture configured to mount to a supporting structure;
wherein the first segment of the first bracket member includes at least one protrusion member configured to releasably mount to a first cable management member, the first cable management member configured to manage media cables;
wherein the second segment of the first bracket member includes at least one attachment element configured to allow a panel assembly to movably mount to the second segment of the first bracket member;
wherein the at least one attachment element of the second segment of the first bracket member includes a first slot and a second slot configured to allow the panel assembly to movably mount to the second segment of the first bracket member, the first slot spaced apart from the second slot, the first and second slots axially aligned with one another along the second segment of the first bracket member; and
wherein the at least one attachment element of the second segment of the first bracket member includes a first C-shaped flange extending from a top wall of the second segment and a second C-shaped flange extending from a bottom wall of the second segment, the first and second C-shaped flanges configured to allow the panel assembly to movably mount to the second segment of the first bracket member.

2. The assembly of claim 1, wherein the first segment of the first bracket member defines a first axial plane, and the second segment of the first bracket member defines a second axial plane that is spaced apart from the first axial plane.

3. The assembly of claim 2, wherein the first axial plane is substantially parallel to the second axial plane.

4. The assembly of claim 3, wherein the third segment of the first bracket member defines a third axial plane, and the third axial plane is substantially perpendicular to the first and second axial planes.

5. The assembly of claim 4, wherein the third segment of the first bracket member includes two or more apertures that are configured and dimensioned to allow the first bracket member to be mounted to the supporting structure.

6. The assembly of claim 1, wherein the first cable management member includes a securement slot configured to mount to the protrusion member of the first segment of the first bracket member; and
wherein the first cable management member includes a tab member configured to releasably secure to a slot of the first segment of the first bracket member.

7. The assembly of claim 1, wherein the first cable management member includes a plurality of extension arms configured to manage media cables.

8. The assembly of claim 7, wherein:
the plurality of extension arms of the first cable management member includes a top extension arm, a first middle extension arm located below the top extension arm, a second middle extension arm located below the first middle extension arm, and a bottom extension arm; and
the top extension arm and the first middle extension arm define a first cable passageway, the first middle extension arm and the second middle extension arm define a second cable passageway, and the second middle extension arm and the bottom extension arm define a third cable passageway.

9. The assembly of claim 7, wherein top and bottom extension arms of the plurality of extension arms each include an extending portion configured to releasably mount to a respective slot positioned on the first segment of the first bracket member.

10. A bracket assembly comprising:
a first bracket member having a substantially Z-shaped configuration, the first bracket member including a first segment, a second segment and a third segment, with the third segment: (i) connecting the first and second segments to define the substantially Z-shaped configuration, and (ii) having at least one aperture configured to mount to a supporting structure;
a first cable management member releasably mounted to a protrusion member of the first segment of the first bracket member, the first cable management member configured to manage media cables;
wherein the first cable management member includes a plurality of extension arms configured to manage media cables; and
wherein the second segment of the first bracket member includes at least one attachment element configured to allow a panel assembly to movably mount to the second segment of the first bracket member.

11. The assembly of claim 1, wherein the at least one attachment element of the second segment of the first bracket member includes a first L-shaped flange extending from the top wall of the second segment and a second L-shaped flange extending from the bottom wall of the second segment, the first and second L-shaped flanges configured to allow the panel assembly to movably mount to the second segment of the first bracket member.

12. The assembly of claim 1, wherein the at least one attachment element of the first segment of the first bracket member includes a plurality of protrusion members.

13. The assembly of claim 1 further including a second bracket member having a substantially Z-shaped configuration, the second bracket member including a first segment, a second segment and a third segment, with the third segment: (i) connecting the first and second segments to define the substantially Z-shaped configuration, and (ii) having at least one aperture configured to mount to the supporting structure;

wherein the first segment of the second bracket member includes at least one protrusion member configured to releasably mount to a second cable management member, the second cable management member configured to manage media cables; and wherein the second segment of the second bracket member includes at least one attachment element configured to allow the panel assembly to movably mount to the second segment of the second bracket member.

14. The assembly of claim 13, wherein:

the first segment of the second bracket member defines a fourth axial plane, and the second segment of the second bracket member defines a fifth axial plane that is spaced apart from the fourth axial plane;

the fourth axial plane is substantially parallel to the fifth axial plane; and the third segment of the second bracket member defines a sixth axial plane that is substantially perpendicular to the fourth and fifth axial planes.

15. The assembly of claim 14 further including a door assembly and first and second top cover members mounted to the first and second bracket members; and wherein the third segment of the second bracket member includes two or more apertures that are configured and dimensioned to allow the second bracket member to be mounted to the supporting structure.

16. The assembly of claim 10, wherein the first cable management member includes a securement slot configured to mount to the protrusion member of the first segment of the first bracket member; and wherein the first cable management member includes a tab member configured to releasably secure to a slot of the first segment of the first bracket member.

17. The assembly of claim 10, wherein the plurality of extension arms of the first cable management member includes a top extension arm, a first middle extension arm located below the top extension arm, a second middle extension arm located below the first middle extension arm, and a bottom extension arm; and wherein the top extension arm and the first middle extension arm define a first cable passageway, the first middle extension arm and the second middle extension arm define a second cable passageway, and the second middle extension arm and the bottom extension arm define a third cable passageway.

18. The assembly of claim 10, wherein top and bottom extension arms of the plurality of extension arms each include an extending portion configured to releasably mount to a respective slot positioned on the first segment of the first bracket member.

19. The assembly of claim 10, wherein the at least one attachment element of the second segment of the first bracket member includes a first slot and a second slot configured to allow the panel assembly to movably mount to the second segment of the first bracket member, the first slot spaced apart from the second slot, the first and second slots axially aligned with one another along the second segment of the first bracket member.

20. The assembly of claim 10, wherein the at least one attachment element of the second segment of the first bracket member includes a first C-shaped flange extending from a top wall of the second segment and a second C-shaped flange extending from a bottom wall of the second segment, the first and second C-shaped flanges configured to allow the panel assembly to movably mount to the second segment of the first bracket member.

* * * * *